United States Patent
Teig et al.

(10) Patent No.: US 6,859,916 B1
(45) Date of Patent: Feb. 22, 2005

(54) POLYGONAL VIAS

(75) Inventors: Steven Teig, Menlo Park, CA (US); Andrew Caldwell, Santa Clara, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 10/062,995

(22) Filed: Jan. 31, 2002

Related U.S. Application Data

(60) Provisional application No. 60/295,735, filed on Jun. 3, 2001, provisional application No. 60/298,146, filed on Jun. 12, 2001, and provisional application No. 60/351,459, filed on Jan. 12, 2002.

(51) Int. Cl.$^7$ .......................... G06F 17/50; H01L 23/48
(52) U.S. Cl. ........................ 716/13; 716/10; 716/14; 257/773; 257/774
(58) Field of Search ........................ 716/2, 4, 5, 10–14; 702/126; 430/5; 427/8, 126; 361/763; 347/63; 324/537; 257/774, 758, 734, 620; 174/262; 156/238

(56) References Cited

U.S. PATENT DOCUMENTS

| | | |
|---|---|---|
| 4,615,011 A | 9/1986 | Linsker |
| 4,673,966 A | 6/1987 | Shimoyama |
| 4,700,016 A * | 10/1987 | Hitchcock et al. .......... 174/262 |

(List continued on next page.)

FOREIGN PATENT DOCUMENTS

| | | |
|---|---|---|
| JP | 03-173471 A | 7/1991 |
| JP | 0400677 A | 1/1992 |
| JP | 05-102305 A | 4/1993 |
| JP | 05-243379 A | 9/1993 |
| JP | 07-86407 A | 3/1995 |
| JP | 09-162279 A | 6/1997 |
| JP | 2000-082743 | 3/2000 |

OTHER PUBLICATIONS

U.S. Appl. No. 10/066,060, filed Jan. 31, 2002, Steven Teig.
U.S. Appl. No. 10/066,160, filed Jan. 31, 2002, Teig et al.
U.S. Appl. No. 10/066,095, filed Jan. 31, 2002, Teig et al.
U.S. Appl. No. 10/066,047, filed Jan. 31, 2002, Teig et al.
U.S. Appl. No. 10/061,641, filed Jan. 31, 2002, Teig et al.

(List continued on next page.)

*Primary Examiner*—Leigh M. Garbowski
*Assistant Examiner*—Helen Rossoshek
(74) *Attorney, Agent, or Firm*—Stattler, Johansen, and Adeli LLP

(57) ABSTRACT

Some embodiments of the invention provide vias that are not in shape of quadrilaterals. In some embodiments, some or all vias are in shape of non-quadrilateral polygons, such as octagons and hexagons. In some embodiments, some or all vias have a circular shape. Some embodiments provide a first set of vias that have a diamond shape and a second set of vias that have a rectangular shape. In some embodiments, a via can also be formed by a diamond contact and a rectangular contact. The diamond contact has four sides. In the embodiments described below, all four sides of a diamond via contact have equal sides. However, in other embodiments, a via contact can be in shape of a diamond with a pair of sides that are longer than the other pair of sides. Similarly, in the embodiments described below, the rectangular via contacts are squares with four equal sides. However, in other embodiments, the length and width of a rectangular via contact can differ. Some embodiments of the invention provide interconnect lines that have non-rectangular ends. In some embodiments, the interconnect-line ends are partial octagons, hexagons, and/or circles. Also, some embodiments provide Steiner points that are not rectangular. In some embodiments, the Steiner points are octagonal, hexagonal, or circles.

11 Claims, 59 Drawing Sheets

U.S. PATENT DOCUMENTS

| | | | |
|---|---|---|---|
| 4,782,193 A | | 11/1988 | Linsker |
| 5,360,948 A | | 11/1994 | Thornberg |
| 5,578,840 A | | 11/1996 | Scepanovic et al. |
| 5,618,744 A | | 4/1997 | Suzuki et al. |
| 5,633,479 A | | 5/1997 | Hirano |
| 5,650,653 A | | 7/1997 | Rostoker et al. |
| 5,657,242 A | | 8/1997 | Sekiyama et al. |
| 5,742,086 A | | 4/1998 | Rostoker et al. |
| 5,757,656 A | | 5/1998 | Hershberger et al. |
| 5,777,360 A | | 7/1998 | Rostoker et al. |
| 5,784,262 A | | 7/1998 | Sherman |
| 5,811,863 A | | 9/1998 | Rostoker et al. |
| 5,822,214 A | * | 10/1998 | Rostoker et al. ............... 716/10 |
| 5,889,329 A | | 3/1999 | Rostoker et al. |
| 5,914,887 A | | 6/1999 | Scepanovic et al. |
| 5,973,376 A | | 10/1999 | Rostoker et al. |
| 6,035,108 A | | 3/2000 | Kikuchi |
| 6,067,409 A | | 5/2000 | Scepanovic et al. |
| 6,128,767 A | | 10/2000 | Chapman |
| 6,166,441 A | | 12/2000 | Geryk |
| 6,209,123 B1 | | 3/2001 | Maziasz et al. |
| 6,226,560 B1 | | 5/2001 | Hama |
| 6,247,853 B1 | * | 6/2001 | Papadopoulou et al. ........ 716/4 |
| 6,262,487 B1 | | 7/2001 | Igarashi et al. |
| 6,301,686 B1 | | 10/2001 | Kikuchi et al. |
| 6,320,391 B1 | * | 11/2001 | Bui ............................ 324/537 |
| 6,324,675 B1 | | 11/2001 | Dutta et al. |
| 6,342,682 B1 | | 1/2002 | Mori et al. |
| 6,365,958 B1 | * | 4/2002 | Ibnabdeljalil et al. ........ 257/620 |
| 6,385,758 B1 | | 5/2002 | Kikuchi et al. |
| 6,407,434 B1 | | 6/2002 | Rostoker et al. |
| 6,412,097 B1 | | 6/2002 | Kikuchi et al. |
| 6,436,804 B2 | | 8/2002 | Igarashi et al. |
| 6,483,481 B1 | | 11/2002 | Sievenpiper et al. |
| 6,512,292 B1 | | 1/2003 | Armburst et al. |
| 6,546,540 B1 | * | 4/2003 | Igarashi et al. ............... 716/13 |
| 6,586,281 B1 | | 7/2003 | Gabara et al. |
| 6,615,400 B1 | * | 9/2003 | Lukanc ........................ 716/11 |
| 6,645,842 B2 | | 11/2003 | Igarashi et al. |
| 6,680,150 B2 | * | 1/2004 | Blatchford et al. ............ 430/5 |
| 2001/0003843 A1 | | 6/2001 | Scepanovich et al. |
| 2002/0024115 A1 | * | 2/2002 | Ibnabdeljalil et al. ....... 257/620 |
| 2002/0174413 A1 | | 11/2002 | Tanaka |
| 2002/0182844 A1 | | 12/2002 | Igarashi et al. |
| 2003/0025205 A1 | | 2/2003 | Shively et al. |
| 2003/0053990 A1 | | 3/2003 | Igarashi et al. |
| 2003/0121017 A1 | | 6/2003 | Andreev et al. |

OTHER PUBLICATIONS

U.S. Appl. No. 10/066,094, filed Jan. 31, 2002, Teig et al.
U.S. Appl. No. 10/076,121, filed Feb. 12, 2002, Teig et al.
U.S. Appl. No. 10/066,102, filed Jan. 31, 2002, Teig et al.
U.S. Appl. No. 10/066,187, filed Jan. 31, 2002, Teig et al.
U.S. Appl. No. 10/233,202, filed Aug. 28, 2002, Steven Teig.
U.S. Appl. No. 10/229,196 filed Aug. 26, 2002, Steven Teig.
U.S. Appl. No. 10/288,870, filed Nov. 06, 2002, Steven Teig.
U.S. Appl. No. 10/219,923 filed Aug. 14, 2002, Steven Teig.
NN71091316, Use of Relatively Diagonal And Rectangular Wiring Planes n Multilayer Packages, Sep. 1971, IBM Technical Disclosure Bulletin, vol. No. 14, Issue No. 4, pp. 1316–1317.
Berger, B. et al., Nearly Optimal Algorithms and Bounds for Multilayer Channel Routing, Journal of the Association for Computing Machinery, pp. 500–542, Mar. 1995.
Chen, H., Routing L–Shaped Channels in Nonslicing–Structure Placement. $24^{th}$ACM–IEEE Design Automation Conference, pp. 152–165, 1987.
Cheng, K. et al., Manhattan or Non Manhattan? A Study of Alternative VLSI Routing Architectures, pp. 47–52, 2000.
Chiang, C. et al., Wirability of Knock–Knee Layouts with 45° Wires, IEEE Transactions on Circuits and Systems, vol. 38, Issue 6, pp. 613–624, Jun. 1991.
Overtone, G., EDA Underwriter 2 Finding Space in a Multi–Layer Board, Electronic Engineering, Morgan–Grampian LTD, vol. 67, No. 819, pp. 29–30.

* cited by examiner

Figure 6

- List of Geometries
  -- Each Geometry including a sequence of points & layer assignment
- Bounding box of the region
- Array of layer properties
  -- Minimum wire size
  -- Minimum spacing
  -- Via sizes
  -- Cost/Unit
- Netlist specifying a number of nets
  -- Each net specifying a set of pins
    -- Each pin specifying a set of ports
      -- Each port specifying a set of geometries

Figure 7

- List of Geometries
  -- Each Geometry including a sequence of points & layer assignment
    -- List of connection nodes inside each pin geometry
- Bounding box of the region
- Array of layer properties
  -- Minimum wire size
  -- Minimum spacing
  -- Via sizes
  -- Cost/Unit
- Netlist specifying a number of nets
  -- Each net specifying a set of pins
    -- Each pin specifying a set of ports
      -- Each port specifying a set of geometries
- For each layer, a graph specifying
  -- Nodes
  -- Edges
  -- Faces

| Node |
|---|
| -Net Identifier
-One or more planar-path references to adjacent topological items in the same planar path
-A pair of via-path references to up and down topological via items
-A references to list of edges connected to the node
-For each edge, an edge reference to the next or previous topological item on the edge
-A reference to the geometry of the node
-Vertex number identifying the vertex of the geometry
-Location of the node |

| Edge Item |
|---|
| -Reference to its edge
-Net Identifier
-A pair of planar-path references to adjacent topological items in the same planar path
-A pair of edge references to the next and previous topological item on the edge |

| Face Item |
|---|
| -Reference to its face
-Net Identifier
-Up to 3 planar-path references for adjacent topological items in the same planar path
-A pair of via-path references for up and down topological via items
-Bounding polygon that defines legal face item locations
-Constraining Points and Distances |

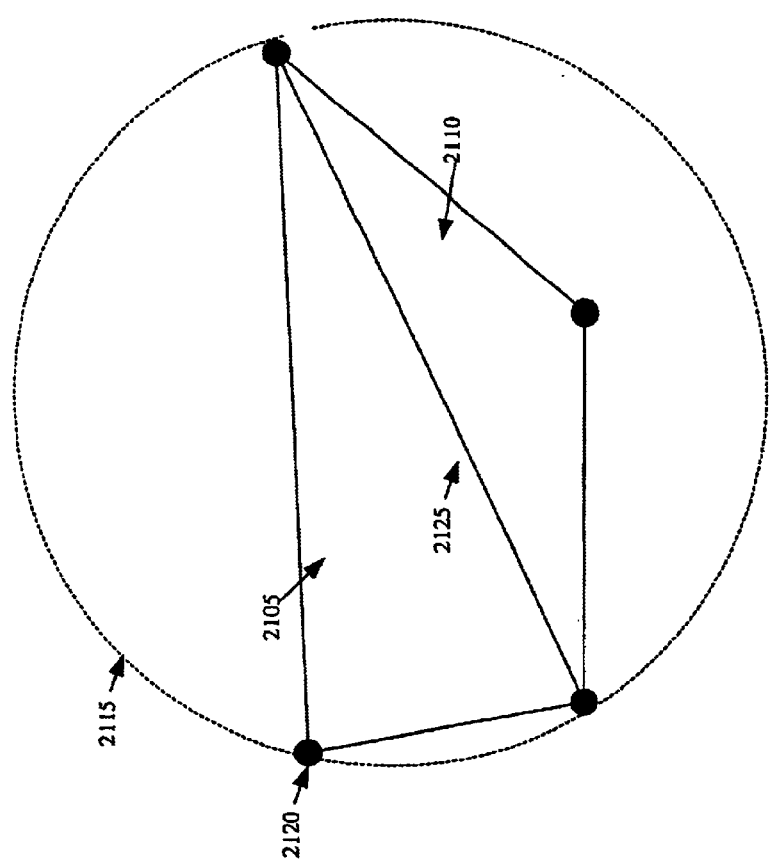
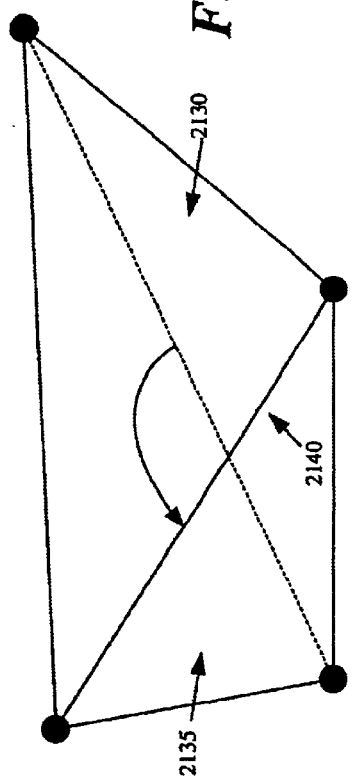
*Figure 21*
*Figure 22*

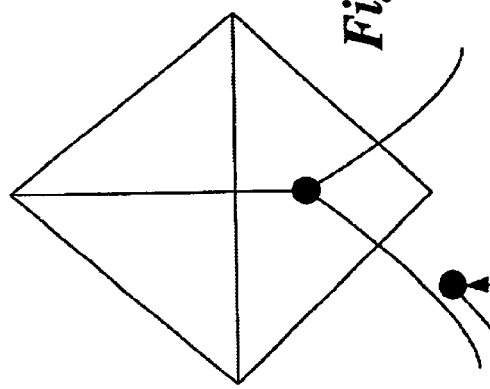
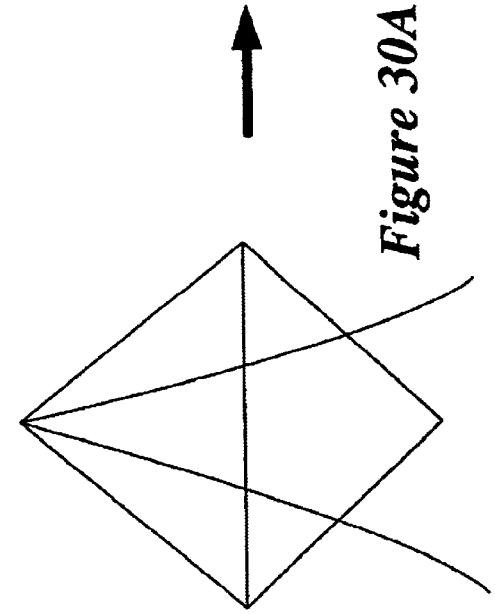
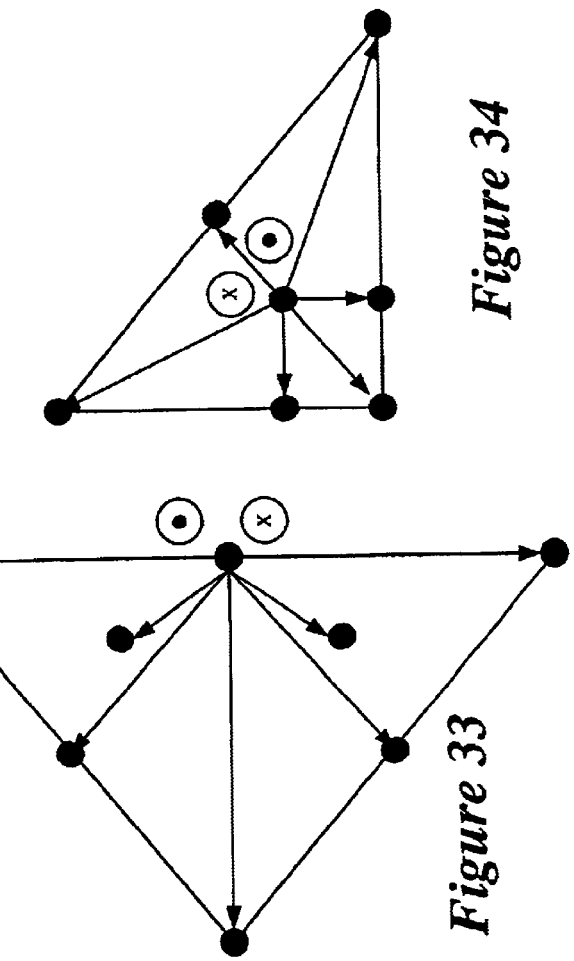
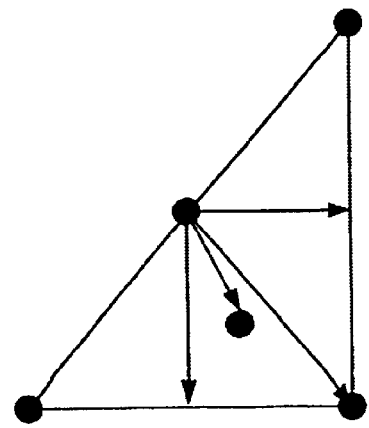
Figure 30B
Figure 34
Figure 30A
Figure 33
Figure 32

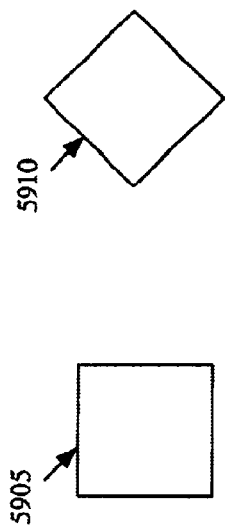
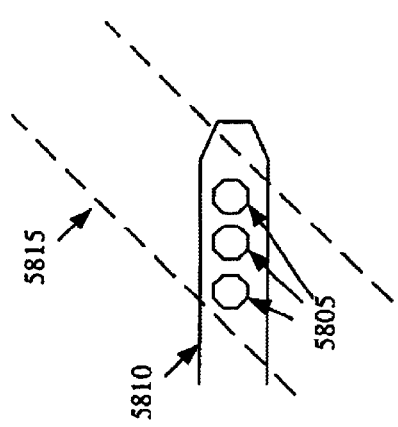
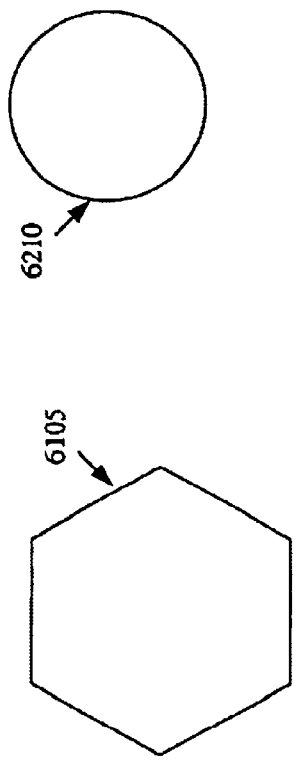
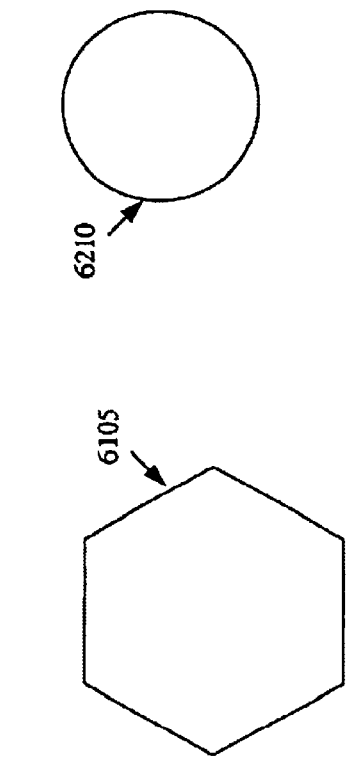
Figure 58
Figure 59
Figure 60
Figure 61
Figure 62

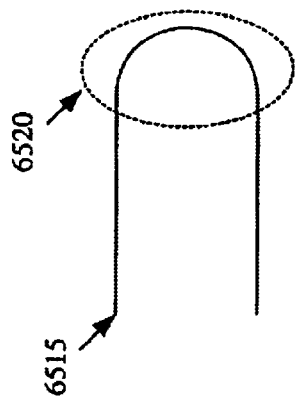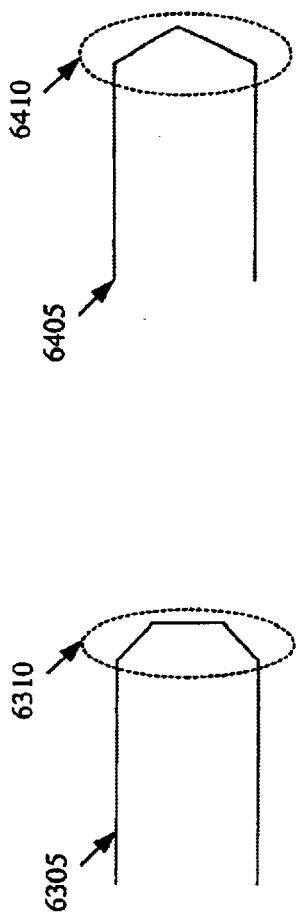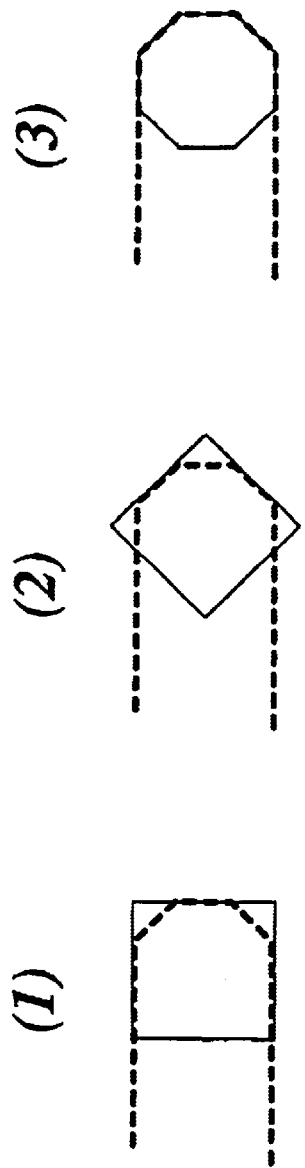

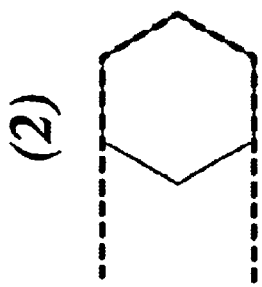
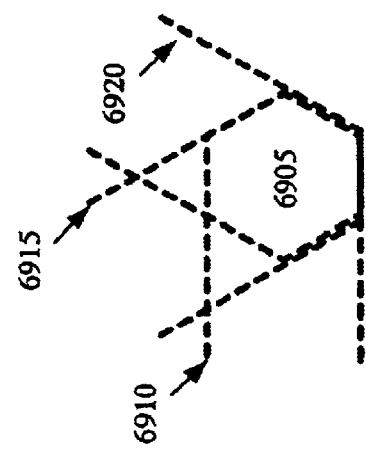
*Figure 67*
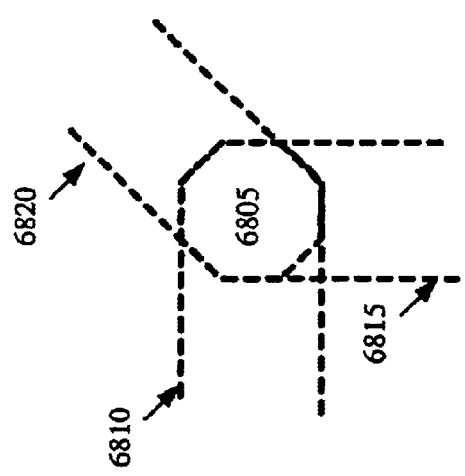
*Figure 68*
*Figure 69*

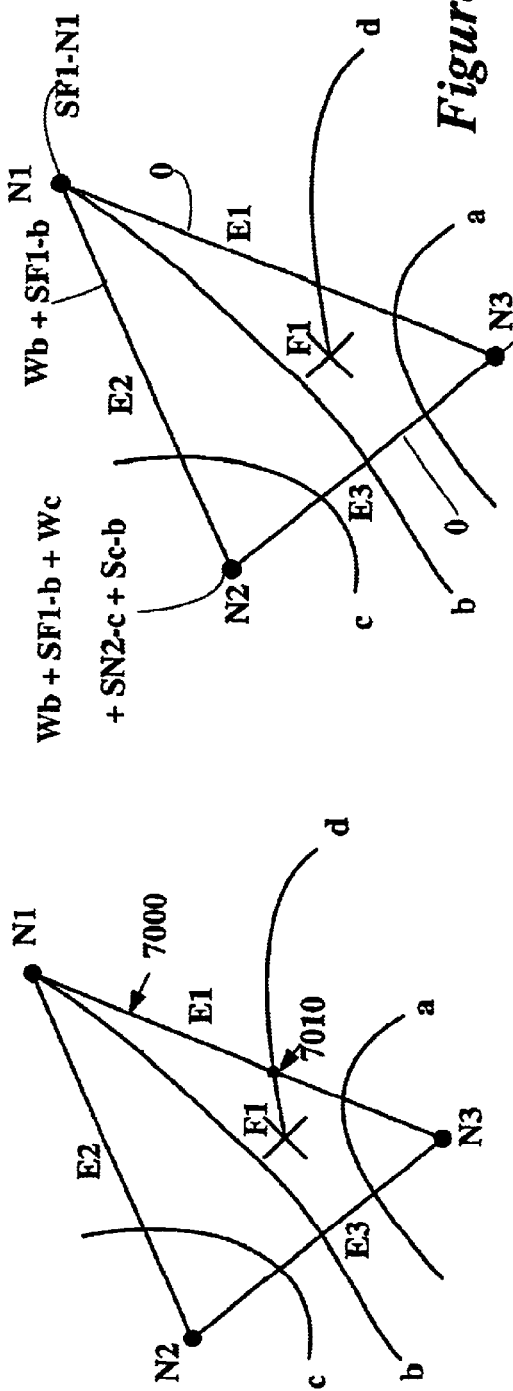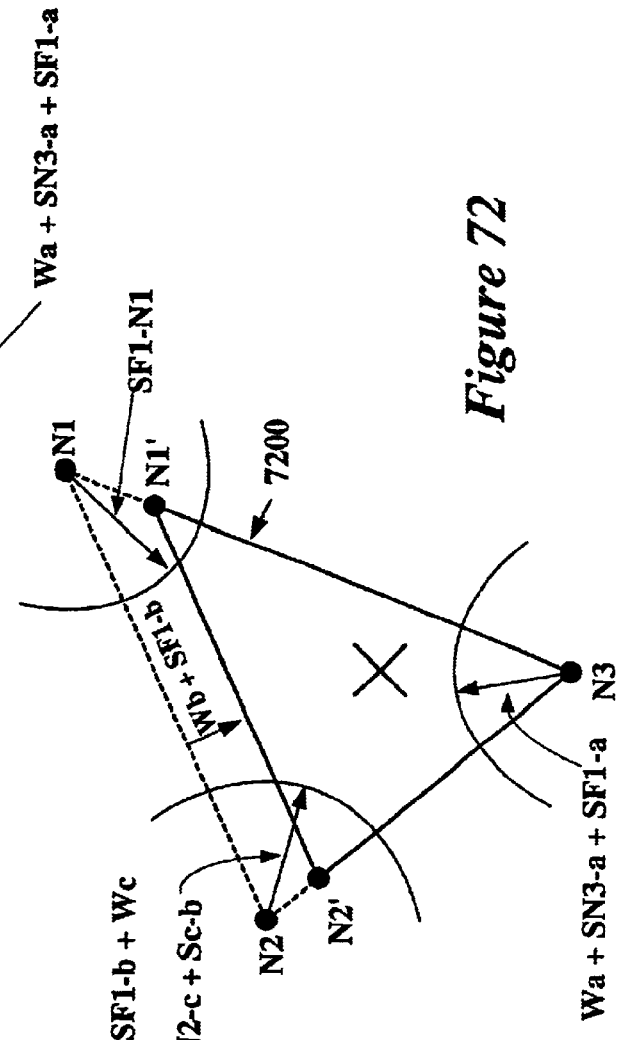
*Figure 70*
*Figure 71*
*Figure 72*

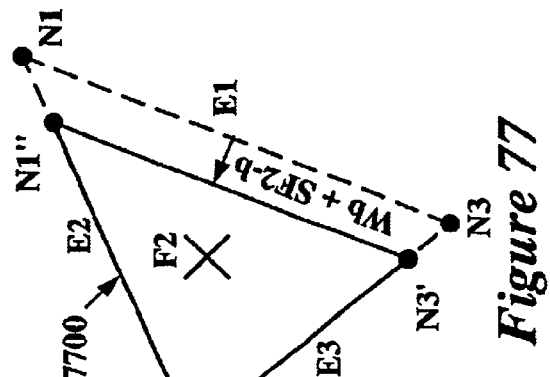
Figure 77
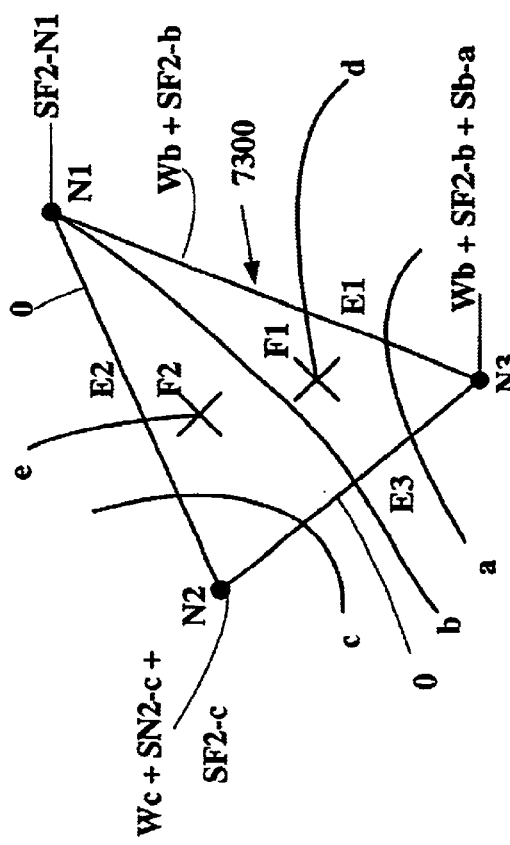
Figure 73
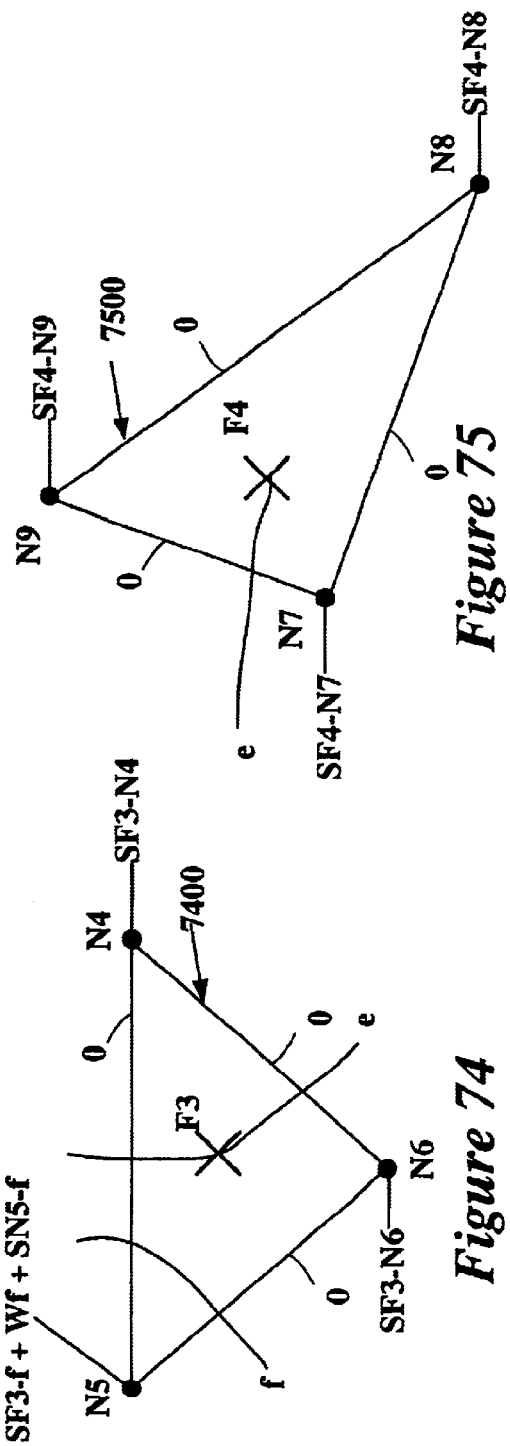
Figure 75
Figure 74

POLYGONAL VIAS

CLAIM OF BENEFIT TO PROVISIONAL APPLICATION

This patent application claims the benefit of the earlier-field U.S. Provisional Patent Application entitled "Interconnect Method, Apparatus, and Architecture for Integrated Circuits and Integrated-Circuit Layouts", having Ser. No. 60/295,735, and filed Jun. 3, 2001; and U.S. Provisional Patent Application entitled "Interconnect Method, Apparatus, and Architecture for Integrated Circuits and Integrated-Circuit Layouts", having Ser. No. 60/298,146, and filed Jun. 12, 2001; and U.S. Provisional Patent Application entitled "Method and Apparatus for Routing a Set of Nets", having Ser. No. 60/351,459, and filed Jan. 22, 2002.

FIELD OF THE INVENTION

The invention is directed towards polygonal vias.

BACKGROUND OF THE INVENTION

An integrated circuit ("IC") is a semiconductor device that includes many electronic components (e.g., transistors, resistors, diodes, etc.). These components are often interconnected to form multiple circuit components (e.g., gates, cells, memory units, arithmetic units, controllers, decoders, etc.) on the IC. The electronic and circuit components of IC's are jointly referred to below as "components."

An IC also includes multiple layers of wiring ("wiring layers") that interconnect its electronic and circuit components. For instance, many IC's are currently fabricated with metal or polysilicon wiring layers (collectively referred to below as "metal layers") that interconnect its electronic and circuit components. One common fabrication model uses five metal layers. In theory, the wiring on the metal layers can be all-angle wiring (i.e., the wiring can be in any arbitrary direction). Such all-angle wiring is commonly referred to as Euclidean wiring. In practice, however, each metal layer typically has a preferred wiring direction. IC designs often penalize non-preferred direction wiring on a layer.

Many IC's use the Manhattan wiring model, which specifies layers of preferred-direction horizontal and vertical wiring. En this wiring model, the layers of preferred-direction wiring typically alternate. Also, in this wiring model, the majority of the wires can only make 90° turns. However, occasional diagonal jogs are sometimes allowed on the preferred horizontal and vertical layers.

Design engineers design IC's by transforming circuit description of the IC's into geometric descriptions, called layouts. To create layouts, design engineers typically use electronic design automation ("EDA") applications. These applications provide sets of computer-based tools for creating, editing, and analyzing IC design layouts.

EDA applications create layouts by using geometric shapes that represent different materials and devices on IC's. For instance, EDA tools commonly use rectangular lines to represent the wire segments that interconnect the IC components. These tools also represent electronic and circuit IC components as geometric objects with varying shapes and sizes.

Also, in this document, the phrase "circuit module" refers to the geometric representation of an electronic or circuit IC component by an EDA application. EDA applications typically illustrate circuit modules with pins on their sides. These pins connect to the interconnect lines.

A net is typically defined as a collection of pins that need to be electrically connected. A list of all or some of the nets in a layout is referred to as a netlist. In other words, a netlist specifies a group of nets, which, in turn, specify the required interconnections between a set of pins.

The IC design process entails various operations. Some of the physical-design operations that EDA applications commonly perform to obtain the IC layouts are: (1) circuit partitioning, which partitions a circuit if the circuit is too large for a single chip; (2) floor planning, which finds the alignment and relative orientation of the circuit modules; (3) placement, which determines more precisely the positions of the circuit modules; (4) routing, which completes the interconnects between the circuit modules; and (5) verification, which checks the layout to ensure that it meets design and functional requirements.

Routing is a key operation in the physical design cycle. It is generally divided into two phases: global routing and detail routing. For each net, global routing generates a "loose" route for the interconnect lines that are to connect the pins of the net. After global routes have been created, the detail routing creates specific individual routing paths for each net.

While some commercial routers today might allow an occasional diagonal jog, these routers do not typically explore diagonal routing paths consistently when they are specifying the routing geometries of the interconnect lines. This, in turn, increases the total wirelength (i.e., total length of interconnect lines) needed to connect the nets in the layout.

In addition, routers today are mostly gridded. The manufacturing processes for designing IC's specify a manufacturing grid that specifies manufacturable resolution. The boundary of all circuit elements is defined by the straight-line connections between adjacent manufacturing points.

Gridded routers typically define arbitrary grids of intersecting lines to specify the available locations for routing interconnects. These arbitrary grids are often much coarser than the manufacturing grids (e.g., they are typically line-to-via spacing). Consequently, they arbitrarily limit the locations of interconnect lines and impose arbitrary spacing between the items in the layout. These arbitrary limits increase the size and efficiency of a design. The routing grids also discourage using arbitrary widths or spacing for interconnect lines.

Furthermore, existing routers primarily utilize preferred-direction wiring to route their designs. Many IC layouts are designed by penalizing the use of interconnect lines in each particular layer when the interconnect lines are not in the preferred wiring direction of the particular layer. Such preferred direction wiring leads to IC layouts and IC's that have most of their interconnect lines and wiring on each of their metal layers traverse in the same direction. Such IC layouts and IC's do not efficiently use the available spacing on the interconnect layers, and this adversely affects the size and efficiency of the layouts and the IC's.

SUMMARY OF THE INVENTION

Some embodiments of the invention provide vias that are not in shape of quadrilaterals. In some embodiments, some or all vias are in shape of non-quadrilateral polygons, such as octagons and hexagons. In some embodiments, some or all vias have a circular shape. Some embodiments provide a first set of vias that have a diamond shape and a second set of vias that have a rectangular shape. In some embodiments, a via can also be formed by a diamond contact and a rectangular contact. The diamond contact has four sides. In the embodiments described below, all four sides of a diamond via contact have equal sides. However, in other embodiments, a via contact can be in shape of a diamond with a pair of sides that are longer than its other pair of sides. Similarly, in the embodiments described below, the rectangular via contacts are squares with four equal sides, even though, in other embodiments, the length and width of a rectangular via contact can differ. Some embodiments of the invention provide interconnect lines that have non-rectangular ends. In some embodiments, the interconnect-line ends are partial octagons, hexagons, and/or circles. Also, some embodiments provide Steiner points that are not rectangular. In some embodiments, the Steiner points are octagonal, hexagonal, or circles.

BRIEF DESCRIPTION OF THE DRAWINGS

The novel features of the invention are set forth in the appended claims. However, for purpose of explanation, several embodiments of the invention are set forth in the following figures.

FIG. 6 illustrates the data structure that the detail routing process uses to represent a sub-region in some embodiments of the invention.

FIG. 7 illustrates the modified data structure that the detail routing process uses to represent a sub-region in some embodiments of the invention.

FIGS. 10–12 illustrate the data structure of nodes, edge items, and face items.

FIG. 11 illustrates the data structure for an edge item.

FIG. 12 illustrates the data structure for a face item.

FIGS. 21 and 22 illustrate one manner for performing an edge-flipping operation.

FIGS. 30A and 30B illustrate a process for inserting Steiner-tree face items in face.

FIGS. 32–36 illustrate the possible expansions from edge items, nodes, and face items.

FIG. 44 illustrates four sets of adjacent Manhattan sectors, while

FIG. 58 illustrates multiple via cuts and contact pairs that define a via between a narrow path on one layer and a wider path on another layer.

FIGS. 59–62 illustrate various shapes of vias that are used in some embodiments of the invention, and FIGS. 63–65 illustrate various shapes of interconnect-lines that are used in some embodiments of the invention.

FIG. 66 illustrates a half-octagon interconnect lines that matches well with different via shapes that can be used with the octagonal wiring model. FIG. 67 illustrates a half-hexagon interconnect lines that matches well with different via shapes that can be used with the hexagonal wiring model.

FIG. 68 illustrates an example of an octagonal Steiner node formed by half-octagon lines, while FIG. 69 illustrates an example of a hexagonal Steiner node formed by half-hexagonal lines.

Figure 39A:
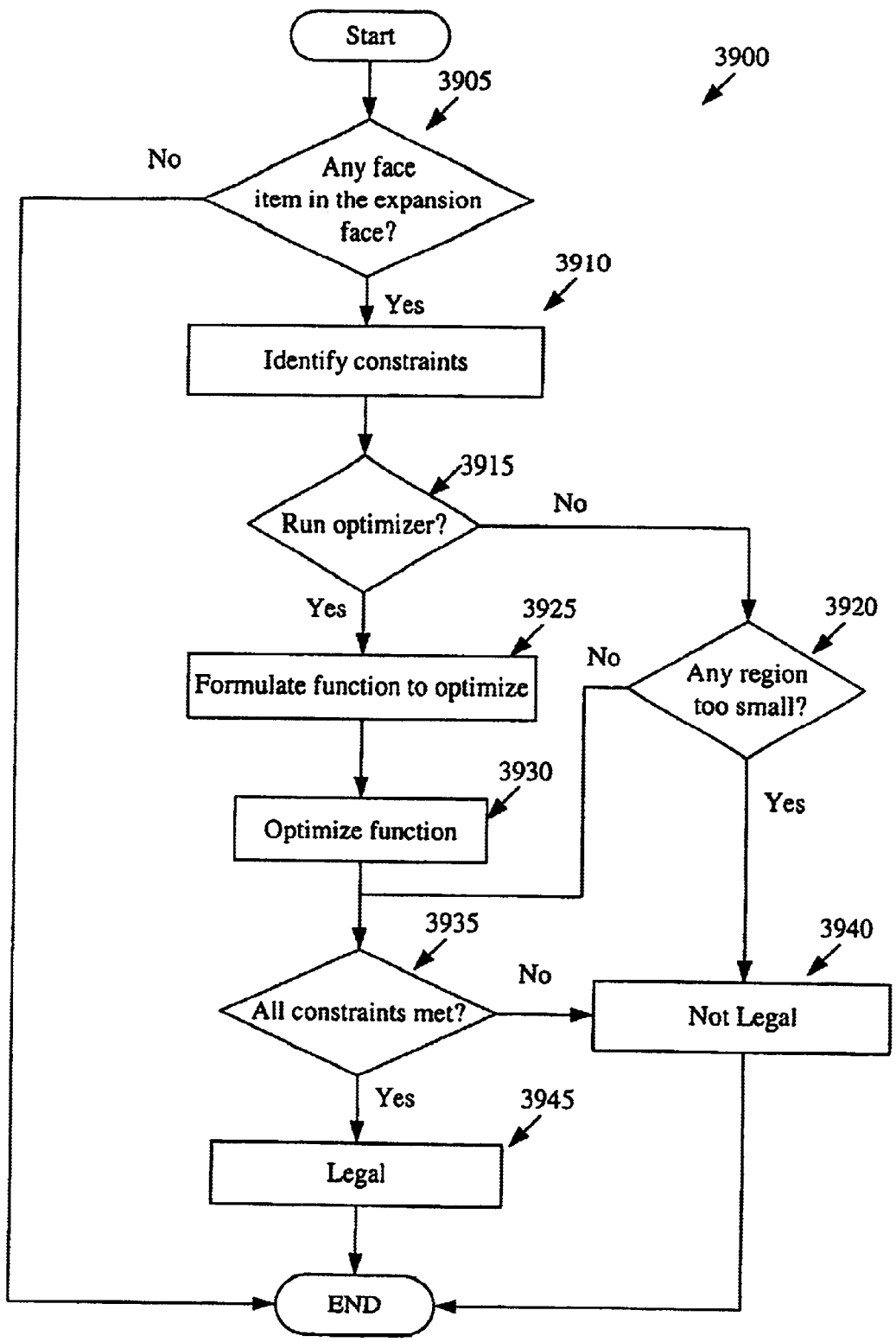
FIGS. 39A and 39B illustrate processes for making via checks.

FIGS. 70–82 present several examples that illustrate the via-checking process of FIG. 39A.

Figure 83:
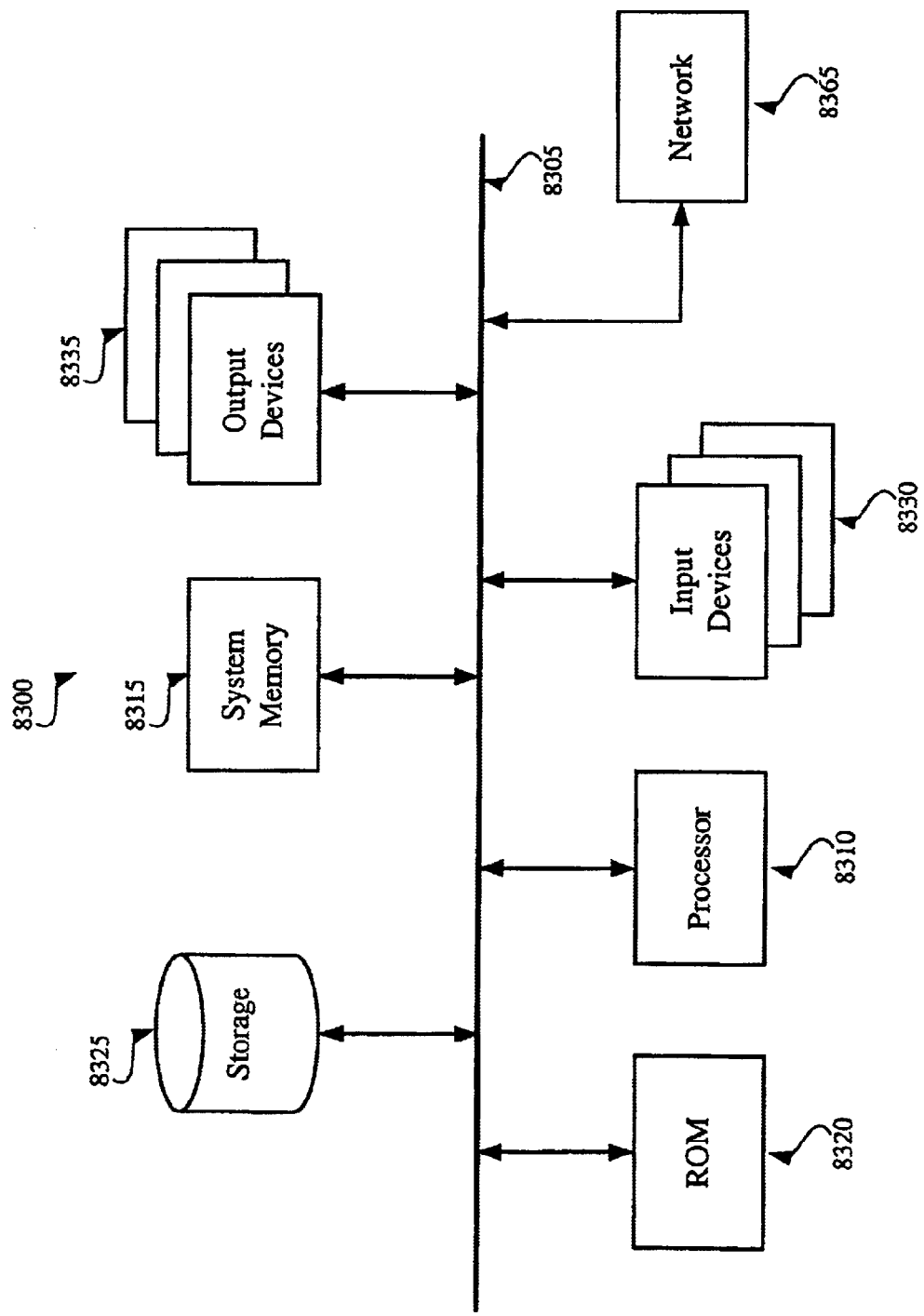

FIG. 83 illustrates a computer system used in some embodiments.

DETAILED DESCRIPTION OF THE INVENTION

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

I Non-Preferred Direction Architecture

Some embodiments of the invention utilize non-preferred-direction ("NPD") wiring models for designing IC layouts. A NPD wiring model does not specify a single preferred routing direction for at least one of its interconnect layers. (In the discussion below, the terms interconnect layer is interchangeably used with the terms metal or wiring layer.)

A NPD wiring model has at least one NPD interconnect layer that has more than one preferred routing direction. In other words, each NPD interconnect layer has at least two routing directions that are equally preferable with respect to one another, and that are as preferable or more preferable than the other routing directions on that layer.

A router that uses a NPD wiring model does not penalize wiring in the two or more preferred directions of a NPD interconnect layer of its layout. In other words, such a router does not impose arbitrarily different costs for routing in the two or more preferred directions of a NPD interconnect layer of its layout. For instance, when a NPD interconnect layer allows horizontal and +45° direction wiring, some embodiments cost the interconnect lines in the horizontal and +45° directions based solely on their lengths and not on any other arbitrary cost designed to dissuade using one direction (e.g., the horizontal direction) over the other. By using NPD wiring models, some embodiments generated IC layouts with one or more metal layers that do not have a single preferred wiring direction.

Figure 1:
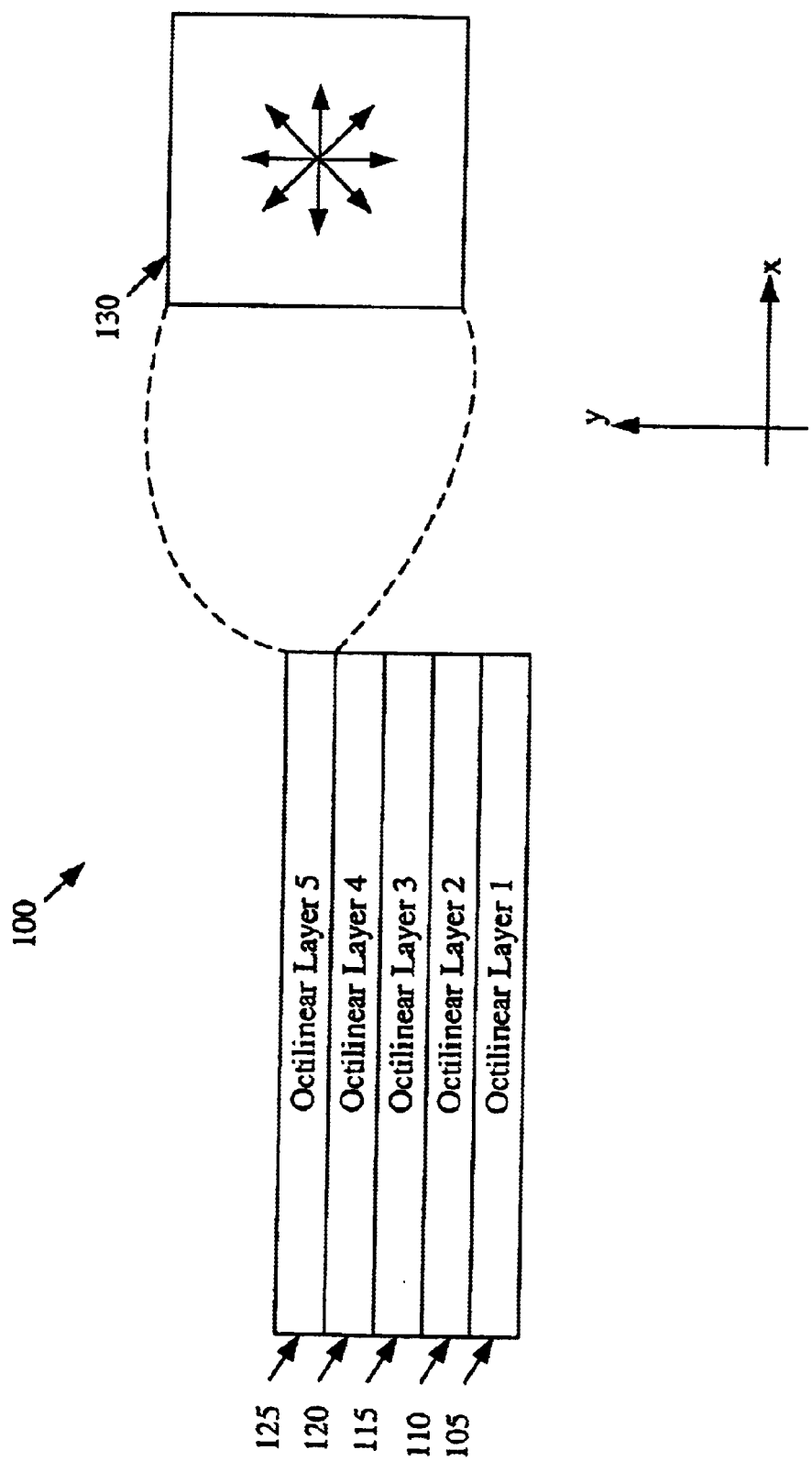
FIG. 1 illustrates a wiring model of some embodiments of the invention.

FIG. 1 illustrates a wiring model 100 of some embodiments of the invention. This wiring model has five interconnect layers 105–125. In this five-layer model, none of the layers have a single preferred wiring direction. Instead, each layer allows 4 different directions of wiring. Specifically, as illustrated by the top view 130 of the fifth interconnect layer 125, each layer of the wiring model 100 can have horizontal, vertical, and ±45° diagonal interconnect lines. Each layer is an octilinear layer, as it allows interconnect lines to traverse in eight separate vector directions from any given point.

As used in this document, an interconnect line is "diagonal" if it forms an angle other than zero or ninety degrees with respect to the layout boundary. On the other hand, an interconnect line is "horizontal" or "vertical" if it forms an angle of 0° or 90° with respect to one of the sides of the layout. In the wiring model of FIG. 1, (1) the horizontal interconnect lines are parallel (i.e., are at 0°) to the x-axis, which is defined to be parallel to the width of the layout, (2) the vertical interconnect lines are parallel to the y-axis, which is defined to be parallel to the height and perpendicular (i.e., are at 90°) to the width of the layout, (3) the +45° diagonal interconnect lines are at ±45° with respect to the width of the IC layout, and (4) the −45° diagonal interconnect lines are at −45° with respect to the width of the IC layout.

Other embodiments of the invention use different NPD wiring models. For instance, some embodiments of the invention's NPD wiring model only include diagonal interconnect lines, other embodiments only use horizontal and vertical interconnect lines, and yet other embodiments use diagonal interconnect lines with either horizontal or vertical interconnect lines but not both. Also, some embodiments use non-45° diagonal wiring. For example, some embodiments use horizontal, vertical and ±120° diagonal interconnect lines.

In addition, some embodiments have more than five layers, while other embodiments have less. Some embodiments also assign a preferred direction for some of the layers, while allowing other layers not to have a preferred wiring direction. For instance, some embodiments have preferred direction Manhattan wiring for the first three layers (e.g., horizontal preferred direction wiring for the first layer, vertical preferred direction wiring for the second layer, and horizontal preferred direction wiring for the third layer), and NPD wiring for the fourth and fifth layers.

By generating IC layouts with one or more NPD interconnect layers, some embodiments fabricate IC's that have NPD wiring for one or more of the metal layers. For instance, the wiring model 100 of FIG. 1 can be used to generate an IC layout with five NPD-interconnect layers. Such a layout can then be used to generate a five metal layer IC, where each of the metal layers has four equally preferable wiring directions.

In some embodiments, the IC has at least one wiring layer that does not have a wiring direction with more that 50% of the wiring on that layer. In other embodiments, the IC has at least one wiring layer that does not have a wiring direction with more than 70% of the wiring on that layer; one such embodiment might only include horizontal and vertical direction wiring on such a wiring layer.

II. Gridless Architecture

A gridless routing process is described below for generating gridless layouts. This routing process is gridless as it does not require the interconnect lines to be positioned with respect to any grid that is coarser than the manufacturing grid. In other words, the only grid that the interconnect lines have to be aligned with is the manufacturing grid. The gridless routing process generates gridless layouts that can be used to fabricate IC's that have their metal lines aligned with the manufacturing grid instead of coarser non-manufacturing grids.

The gridless routing process described below generates gridless NPD octilinear layouts. However, one of ordinary skill will realize that this routing process can be used to generate other gridless layouts. For instance, some embodiments generate gridded NPD layouts.

III. NPD and Gridless Routing

A. Conceptual Flow.

Some embodiments generate gridless NPD layouts by using a detail routing technique that does not specify a preferred wiring direction for any of its interconnect layers. The detail-routing embodiments described below use the NPD wiring model 100 of FIG. 1. However, one of ordinary skill will realize that other embodiments of the invention use different NPD wiring models.

In the embodiments described below, the detail routing is performed after a global-routing stage, which (1) partitions the routing region into global-routing cells ("Gcells"), and (2) defines, for each net, global-routing paths that connect the Gcells containing the net's pins. One hierarchical global routing approach recursively divides the routing region into smaller sub-regions, and defines routing paths at each hierarchical level, until reaching the lowest-recursive level's subregions, which are the Gcells. Another global-routing approach flatly divides the routing region into numerous Gcells, and then defines the routing paths between the Gcells. Under either approach, the global router can use either a NPD wiring model or a preferred-direction wiring model.

Figure 2:
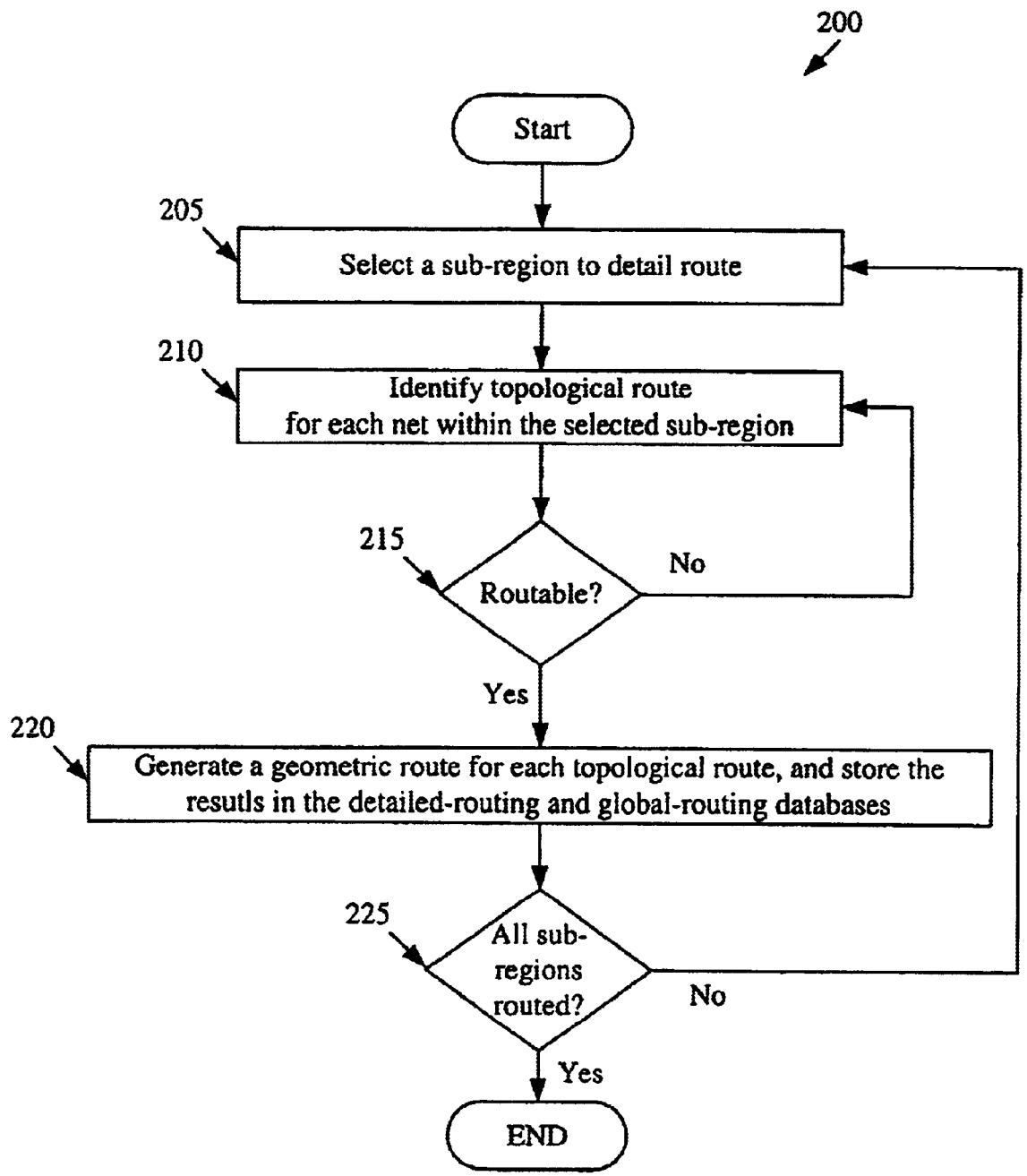
FIG. 2 presents a conceptual illustration of a detail-routing process used by some embodiments of the invention.

FIG. 2 presents a conceptual illustration of a detail-routing process 200 used by some embodiments of the invention. This routing process defines detail routes for nets within a region of the IC layout. This region can be the entire IC layout, or a portion of this layout. As shown in this figure, this process initially selects (at 205) a sub-region of the IC layout region to detail route. Several manners for selecting such a region will be described below in Section III.B. Next, for each particular net in the selected sub-region, the process identifies (at 210) a topological route that connects the particular net's routable elements in the sub-region.

In the embodiments described below, a net has two or more pins, a pin can have one or more ports, and each port can have one or more geometries. In these embodiments, a net's routable elements are the port geometries, and a net is typically routed along one port of each of its pins. One of ordinary skill will realize, however, that other embodiments may define the routable elements of the nets differently.

A topological route is a route that is defined in terms of its relation to other layout items, such as pins, obstacles, boundaries, and/or other topological routes of other nets. As such, a topological route provides a general plan for how to route a net, without providing a specific geometric path to do so. One topological route represents a set of diffeomorphic geometric routes (i.e., a set of geometric routes that can be morphed into one another through a continuous sequence of perturbations without changing the route's path relative to any other pin, path or obstacle). A geometric route is one explicit realization of a topological route. A geometric route is defined in terms of exact coordinates that define the route as it travels through the interconnect layers. Several manners for identifying topological routes for each net within the selected sub-region will be described below.

After 210, the process determines (at 215) whether the identified topological routes identified at 210 are geometrically routable (i.e., whether there exists a design-rule-correct geometric route for each identified topological route). If so, the process transitions to 220, which will be described below. Otherwise, if the process determines (at 215) that the identified topological routes for some of the nets are not routable, it initially directs the topological router to generate additional topological routes that are more-likely to have design-rule-correct geometric routes. If the topological router repeatedly fails to generate geometrically routable topological routes, the detail-routing process flags one or more nets as unroutable, re-defines topological routes for some or all the nets, and then transitions to 220. Several manners for performing the routability checking will be described below.

At 220, the process generates these geometric routes and stores these routes in a detail-routing storage structure (such as a database). Several manners for generating geometric routes will be described below in Section III.E. At 220, the process also converts the generated geometric detail routes into global routing paths, which it stores in a global-routing storage structure (such as a database). This is done just in case the router has to detail route some Gcells again, as described below.

At 225, the process then determines whether it has generated detail routes for all the sub-regions of the IC region. If not, the process returns to 205 to select another sub-region and to repeat 210–220 to compute geometric routes in the newly selected sub-region. Otherwise, the process ends. After 225, some embodiments might repeat process 200 for certain congested sub-regions in order to alleviate the congestion in these regions, improve wiring quality, or fix violations left by previous attempts.

B. Region Selection.

As mentioned above, the detail-routing process 200 selects (at 205) a sub-region of the IC layout region to detail route. In some embodiments of the invention, this selection involves selecting several Gcells, and generating a sub-region by combining the selected Gcells.

Figure 3:
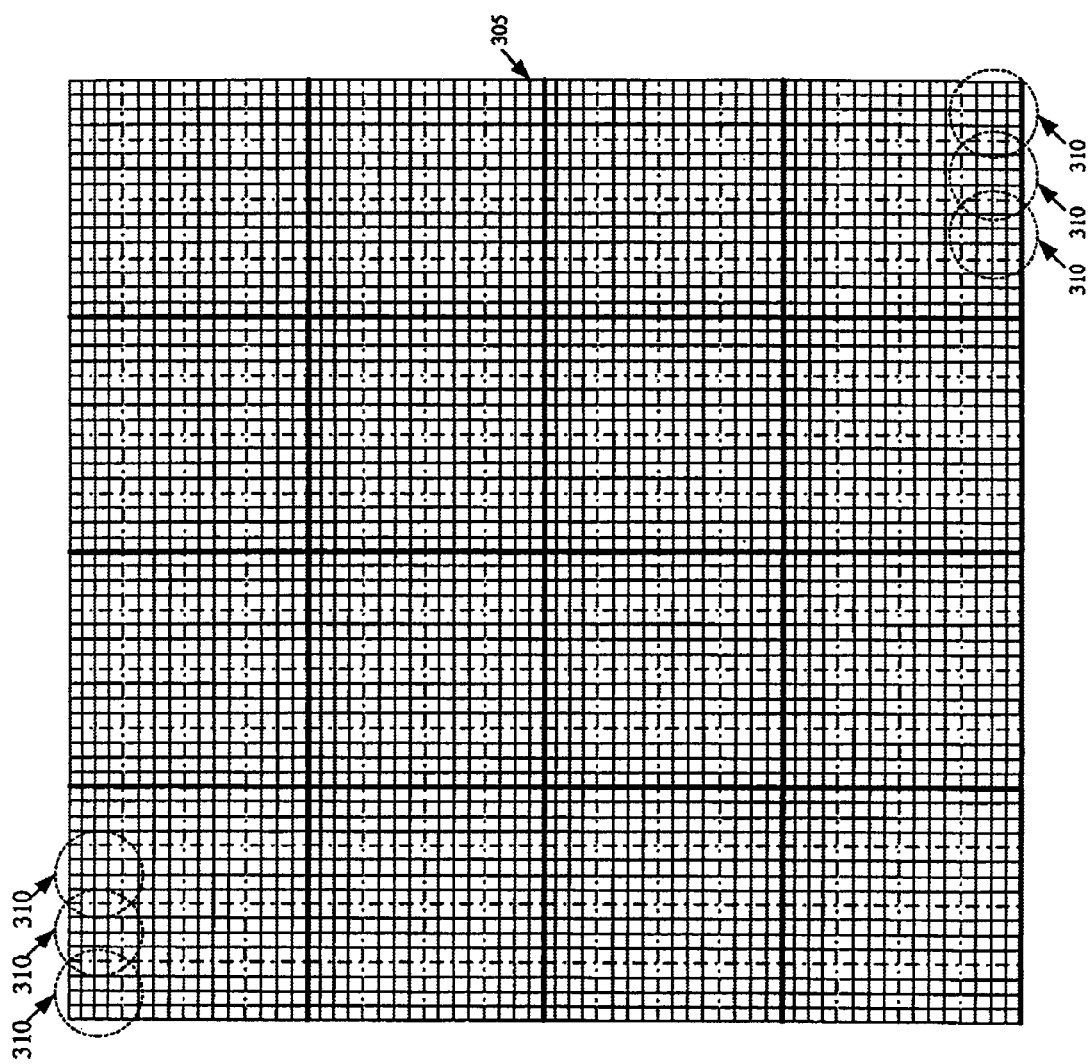
FIG. 3 illustrates one manner of defining sub-regions for detail routing.

Different embodiments select the Gcells differently. Some embodiments select contiguous non-overlapping groups of Gcells for each iteration of process 200. The size of these contiguous non-overlapping groups is fixed in some of these embodiments. FIG. 3 illustrates one such embodiment. This figure illustrates an IC region 305 that was recursively divided thrice into sets of 16 smaller regions (called slots or cells) during global routing. The Gcells are the cells at the third recursion level. In the example illustrated in FIG. 3, contiguous non-overlapping sets of sixteen Gcells 310 can be selected starting from one corner (e.g., upper left corner) of the IC region 305 to its opposite corner (e.g., lower right corner). The advantage of selecting non-overlapping groups of Gcells is that multiple non-overlapping groups can be detail routed in parallel in order to reduce the overall run time of the detail router.

Other embodiments select the sub-region to detail route at 205 by using a congestion-based approach. Such an approach often initially detail routes Gcells surrounding the most congested edges that are defined during global routing. After reaching a certain congestion threshold, congestion-based approaches detail routes contiguous groups of Gcells that are not yet detail routed or are adjacent to Gcells that are not yet detail routed. One of ordinary skill will realize that other approaches can be used to select the Gcells for detail routing at 205.

After selecting several Gcells for detail routing, the detail routing process 200 generates a sub-region by combining the selected Gcells. In generating such a sub-region, the process adds any virtual pins ("vpins") of the Gcells in the periphery of the sub-region as geometries of the sub-region. Virtual pins are artificial pins that are set to account for the global route propagation into Gcells from other Gcells or higher-level slots. In the embodiments described below, the virtual pins are represented as single point geometries.

Figure 4:
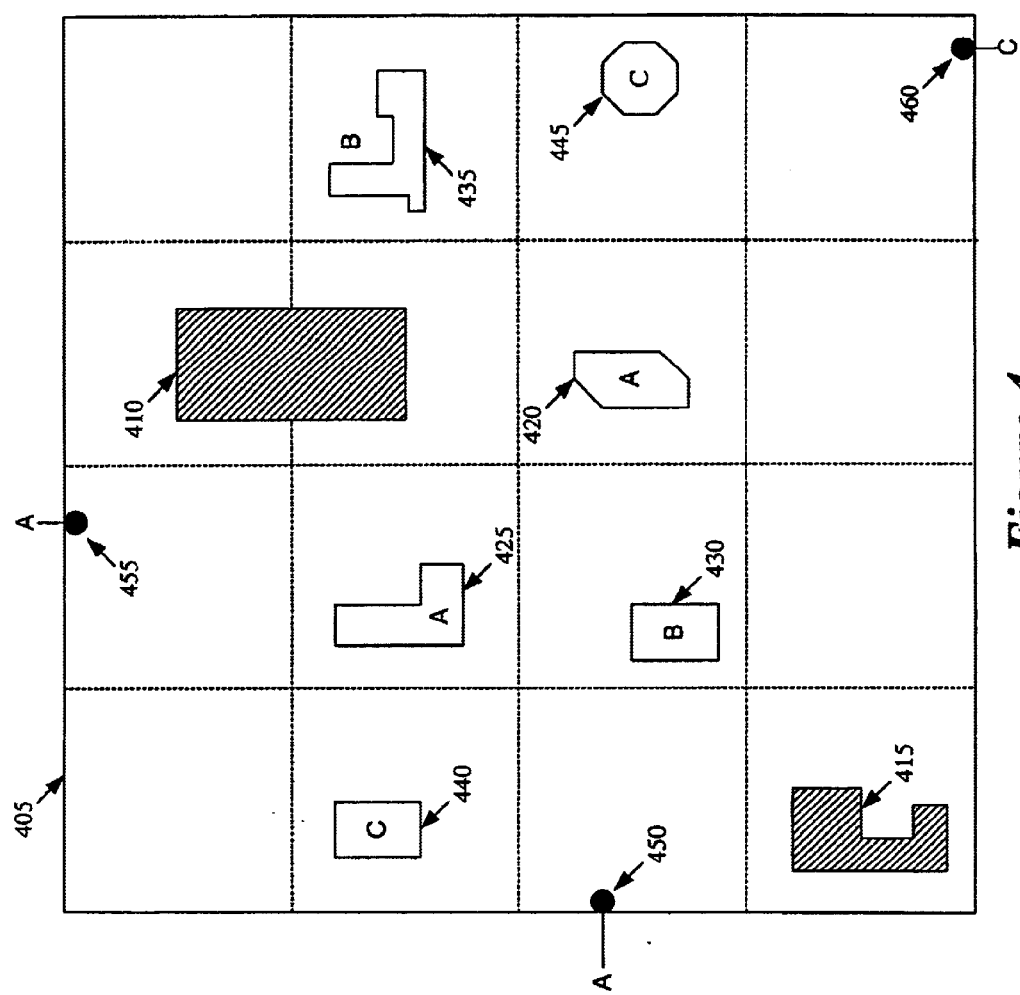
FIGS. 4 and 5 illustrate two layers of 16 Gcells that have been combined to produce a sub-region.
Figure 5:
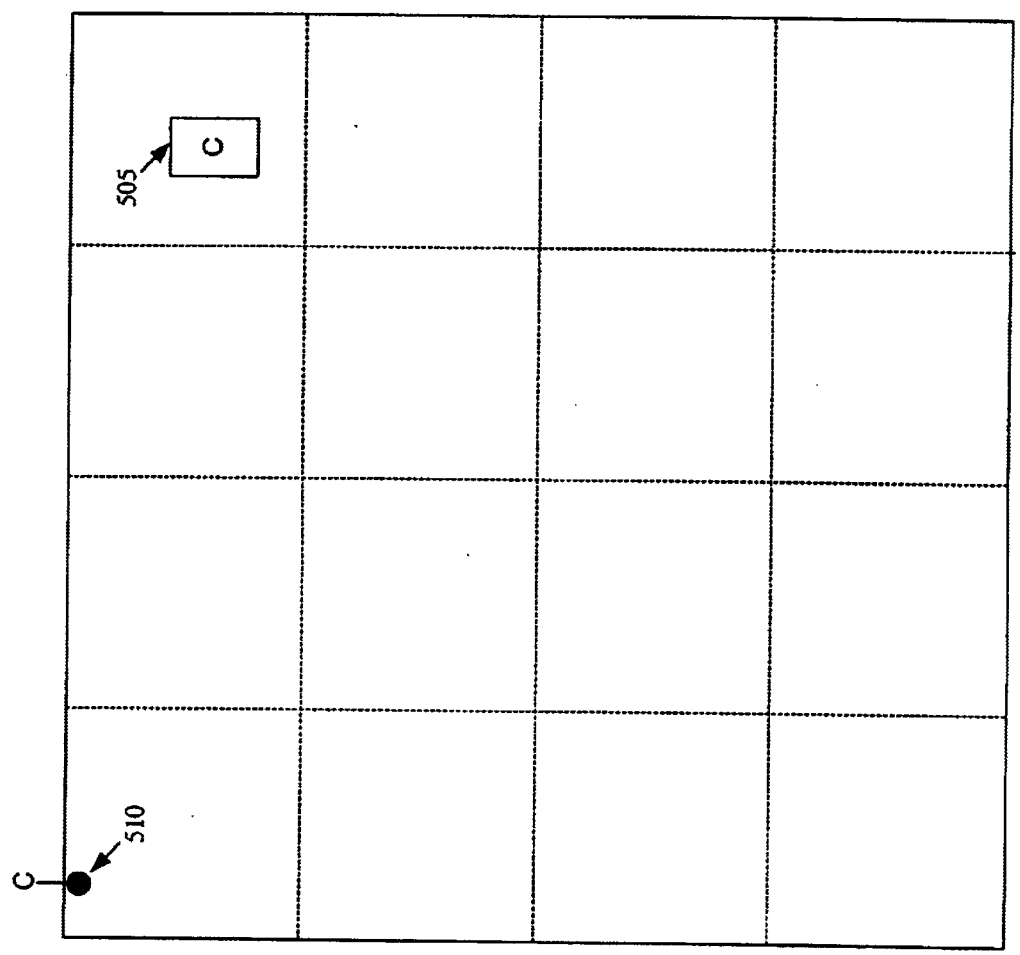

For example, FIGS. 4 and 5 illustrate two layers of 16 Gcells that have been combined to produce a sub-region 400. For sake of simplicity, this example assumes that the generated sub-region only has pins, virtual pins, and obstacles on the two layers shown in FIGS. 4 and 5. As shown in FIG. 4, the sub-region 400 includes two obstacle 410 and 415. This sub-region also includes port geometries of three nets A, B, and C. Again, for sake of simplifying the example, the port geometries 420–445 and 505 of nets A, B, and C are all from the same ports of their respective nets in the example illustrated in FIG. 4. As shown in FIGS. 4 and 5, the obstacle and port geometries can have a variety of convex and non-convex shapes. Also, these geometries have horizontal, vertical, and ±45° diagonal sides. As shown in FIG. 4, three of the twelve periphery Gcells include virtual pins 450, 455, and 460 for nets A and C. During the sub-region generation, these three virtual pins 450, 455, and 460 are added to the sub-region data structure as port geometries of nets A and C.

The detail routing process 200 defines a sub-region based on various attributes. FIG. 6 illustrates the data structure that the detail routing process 200 uses to represent a sub-region in some embodiments of the invention. This data structure includes a list of all obstacle and port geometries in the region. Each geometry is defined by a sequence of points and a layer assignment.

This data structure also includes the bounding box of the sub-region. In addition, it includes an array of layer properties. This array specifies various design rules for each layer. For instance, it specifies for each layer the minimum wire size, the minimum spacing, and the minimum via size. This array also specifies the minimum cost per unit length for an interconnect on each layer. For instance, the cost per unit length might be expressed in terms of resistance per distance, which might be less for the higher layers as the wire width typically increases for the higher layers.

Some embodiments store additional layer information in other data structures. For instance, some embodiments (1) allow the net widths to be different on different layers, and/or (2) allow the spacing between nets or between nets and unrelated geometries to be different on different layers. Such information is stored in a look-up table in some embodiments.

The data structure also includes a netlist that specifies the nets in the sub-region. Each net specifies one or more pins, each pin refers to one or more ports, and each port refers to one or more geometries. A geometry that is not referred to by a port (i.e., that is not part of a pin) is an obstacle.

C. Topological R ute Generation.

One manner for generating topological routes will now be described. In some embodiments, these routes are generated by a topological routing engine that (1) receives the sub-region data structure defined at 205 (i.e., receives the problem instance), and (2) for each net in the sub-region, generates a topological representation of a route that connect the net's routable elements.

This engine is a multi-layer topological router that for each net in the sub-region, generates a topological route (i.e., a topological representation of a route) that connect the net's routable elements on one or more layers. In other words, this router selects a net and for the selected net, defines a topological route that connects the selected net's routable elements on one or more interconnect layers, before selecting another net for routing. To facilitate its multi-layer approach, this topological router uses vias that are defined topologically, as further described below. These vias are referred to below as topological vias.

The topological engine also routes sets of nets together. Specifically, this engine selects a set of nets in the sub-region, and identifies the best possible combination of topological routes for the set's nets. As further described below, the topological engine used in some embodiments is an IDA* solving engine that deterministically traverses through the solution space to identify the best possible combination of topological routes for a set of nets. In addition, while routing a set of nets, the topological engine considers the routing cost of nets that have not yet been selected.

This topological engine also employs NPD routing as it costs routing in all planar directions on a layer the same. In other words, it does not penalize routing in any planar direction on a layer. In addition, this engine costs wires and vias proportionately to their metric cost that they introduce in the design. The metric cost ca-n be based on a number of properties of wires and vias. These properties include resistance, delay, manufacturing yield, etc.

The topological engine also allows nets to have different widths on different layers. It also can impose different spacing constraints between each pair of net. The spacing constraint for a pair of nets can also be different on different layers. This topological engine can also base its topological routes on different wiring models, such as a wiring model that employs only Manhattan lines, one that uses Manhattan and ±45° lines, one that uses Manhattan and ±120° lines, etc.

1. Overview

In the embodiments described below, the topological engine (1) initially decomposes each layer of the received sub-region to obtain a decomposed graph that has several nodes, edges, and faces, and then (2) uses the nodes, edges, and faces of the generated graphs to define topological routes in the received sub-region.

a. Overview of the Decomposition Operation.

As further described below, the decomposition operation is a triangulation operation in some embodiments. In other words, the faces resulting from the decomposition operation are triangles and therefore have three edges. Each edge is defined to be between two nodes. In the embodiments described below, the nodes of each layer's triangulated graph are defined at the obstacle-geometry vertices, pin-geometry vertices, and the four corners of the sub-region on each layer.

At the end of the triangulation operation, the topological engine adds, to the sub-region definition, a graph data structure for each layer of the sub-region. This addition is pictorially illustrated in FIG. 7. As shown in this figure, each graph data structure includes several node, edge, and face data structures.

Figure 8:
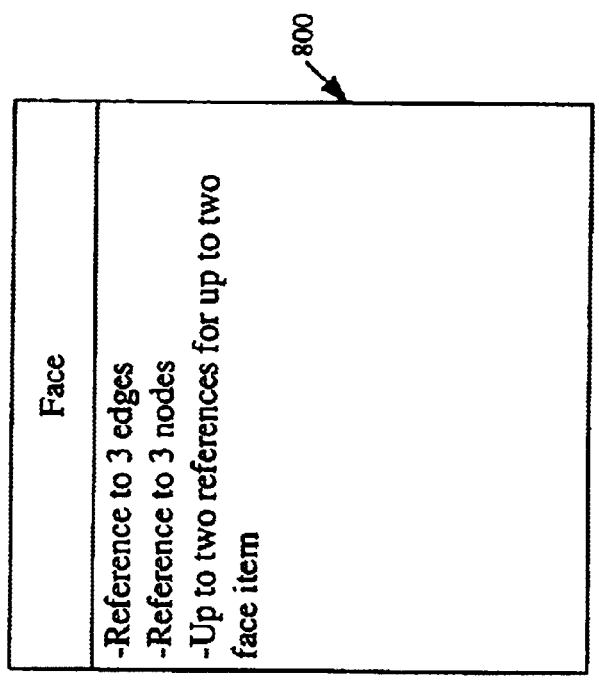
FIG. 8 illustrates a data structure that defines a face.

FIG. 8 illustrates a data structure 800 that defines a face. As shown in this figure, a face is defined to refer (e.g., to point) to its 3 edges and its 3 nodes. The face also includes up to two references (e.g., two pointers) to up to two topological items (called face items), which as described below are used to define topological vias and Steiner points. Some embodiments limit the number of face items in a face to two in order to improve run-time speed. Other embodiments, on the other hand, might allow a face to have more than two face items, or might limit a face to have only one face item.

Figure 9:
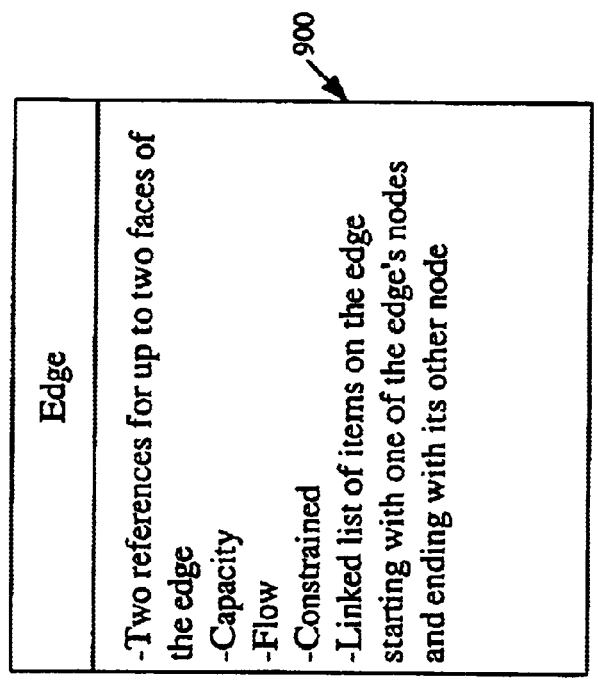
FIG. 9 illustrates a data structure that defines an edge.

FIG. 9 illustrates a data structure 900 that defines an edge. An edge can be shared between two faces, or it can simply be part of one face. Accordingly, as shown in FIG. 9, the edge data structure 900 has two references, each of which can be assigned to refer to a face of the edge.

The edge data structure also specifies the capacity of the edge. It further specifies the wire flow across each edge. This flow equals the width of the nets crossing the edge plus the spacing between the crossing nets and between the nets and the edge nodes. This data structure also has a Boolean flag to indicate whether the edge is a constrained edge. This flag is used during the triangulation, as described below.

In addition, the edge data structure 900 includes a linked list of topological items on the edge. During triangulation, this linked list is initialized to start with one of the edge's nodes and end with the other. When topological routes are inserted in the triangulated graphs, a topological item (called an edge item) is inserted between the end nodes of the edge's linked list for each topological route that crosses the edge. The edge items of several topological routes that intersect an edge are inserted between the edge nodes in the order that their corresponding topological routes cross the edge. This ordering will be further explained below by reference to FIGS. 13 and 14. The data structure for a node will also be described below.

b. Embedded Topological Routes

After triangulation, the topological engine embeds multi-layer topological routes in the triangulated graphs. It uses the nodes, edges, and faces of these graphs to define the topological direction of these routes. Specifically, the topological engine defines a topological route as a linked list of topological items that represent various points along the route. These topological items include nodes, edge items, and face items. Nodes and face items can serve as via locations, Steiner points, or both. Nodes can also serve as end points of a topological route.

FIGS. 10–12 illustrate the data structure of nodes, edge items, and face items. As shown in FIG. 10, a node data structure 1000 includes a net identifier, which, when the node is on a net's topological route, specifies this net. This structure also has one or more planar-path references. When the node is part of a topological route, a planar-path reference refers to a planar topological item (i.e., an item on the same layer as the node) that is adjacent to the node in its topological route. The node data structure can have more than one planar-path reference (e.g., has more than one such reference when the node serves as a Steiner point).

In the embodiments described below, a node can serve as the location for a via. Accordingly, the node data structure 1000 includes a pair of via-path references. When a topological via is placed at the location of a node, one or both via references refer to face items or nodes in the layer above and/or below.

The node data structure further includes a list of edges connected to the node. For each edge, it includes an edge reference to the next or previous topological item (i.e., node or edge item) on the edge. It also has a reference to the geometry of the node, and a vertex number that identifies the point in the geometry corresponding to the node. The node structure further specifies the location of the node.

FIG. 11 illustrates the data structure for an edge item. This data structure has a reference to its edge. In addition, like a node data structure, an edge item's data structure includes a net identifier that specifies the net of the edge-item's topological route. This structure also includes a pair of edge references that refer to the next and previous topological item (i.e., node or edge item) on its edge. The edge-item data structure also has a pair of planar-path references that refer to the planar topological items (i.e., items on the same layer as the edge item) that are adjacent to the edge item in its topological route.

FIG. 12 illustrates the data structure for a face item. The face-item data structure 1200 has a reference to its face. In addition, like the data structure of a node or an edge item, a face item's data structure includes a net identifier that specifies the net of the face item's topological route. This structure can also includes up to three planar-path references. Each planar-path reference refers to a planar topological item (i.e., an item on the same layer as the face item) that is adjacent to the face item in its topological route. The face-item data structure can have up to three planar-path references since the face-item can serves as a Steiner point for up to three topological paths.

In the embodiments described below, a face item can serve as the topological position of a via. Accordingly, the face item data structure 1200 includes a pair of via-path references. When a topological via is placed at a face item, one via-path reference can refer to a node or face item in the layer above the face item's layer, while the other via-path reference can refer to a node or face item in the layer below the face item's layer. The face-item data structure also specifies a bounding convex polygon that approximates the region where the center of the face item can be legally placed in the face containing the face item. In some embodiments, this data structure also specifies a set of constraining points and distances for the face item in its layer. The use of the bounding polygon and the constraining points and distances will be further described below.

The layer of the topological items can be identified as follows. A node's layer can be identified by referring to its geometry. A face's or edge's layer corresponds to the layer of its nodes. In addition, a face item's layer corresponds to the layer of its face, and an edge item's layer corresponds to the layer of its edge.

Figure 13:
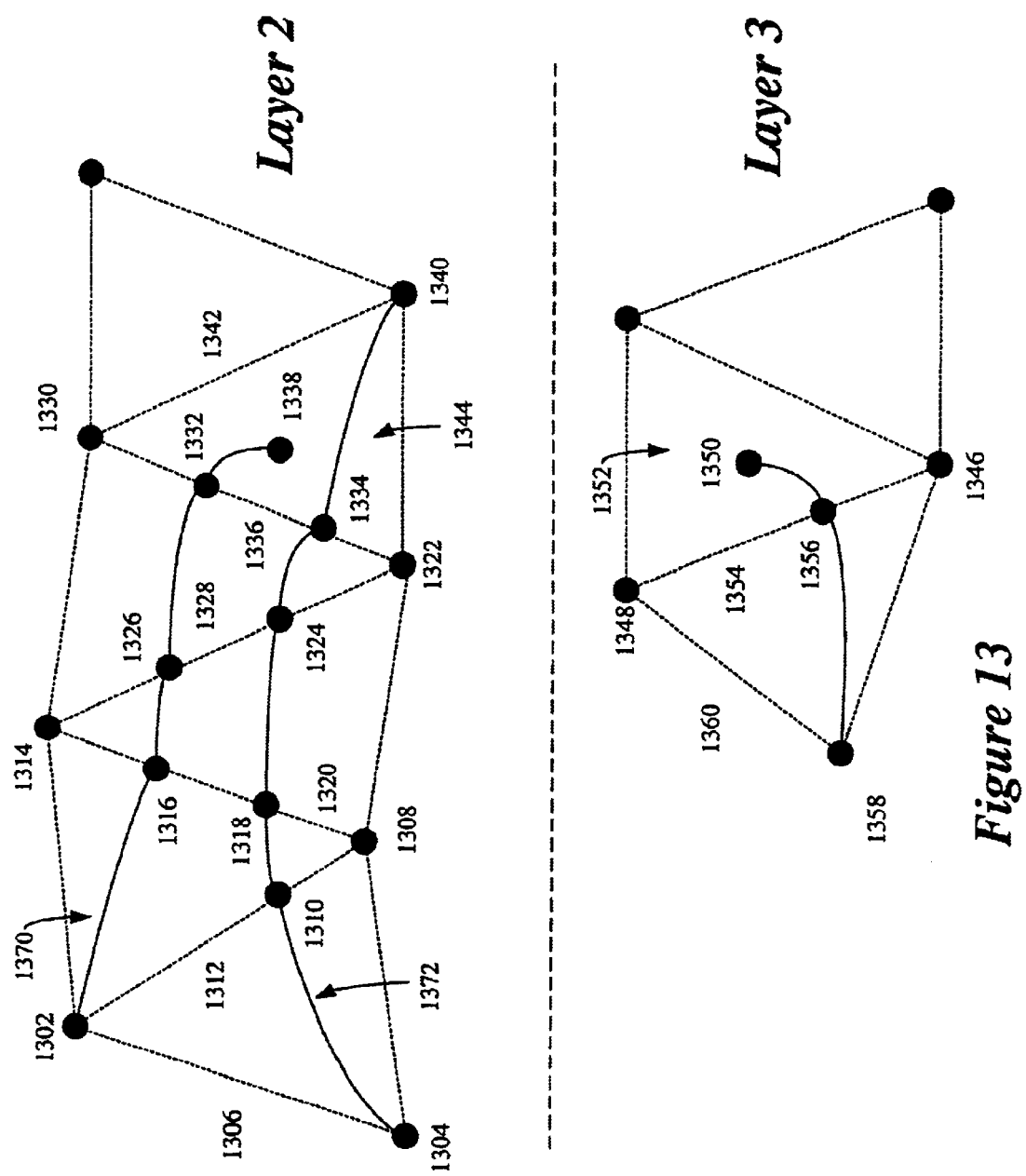
FIGS. 13 and 14 illustrate one example of topological routes.
Figure 14:
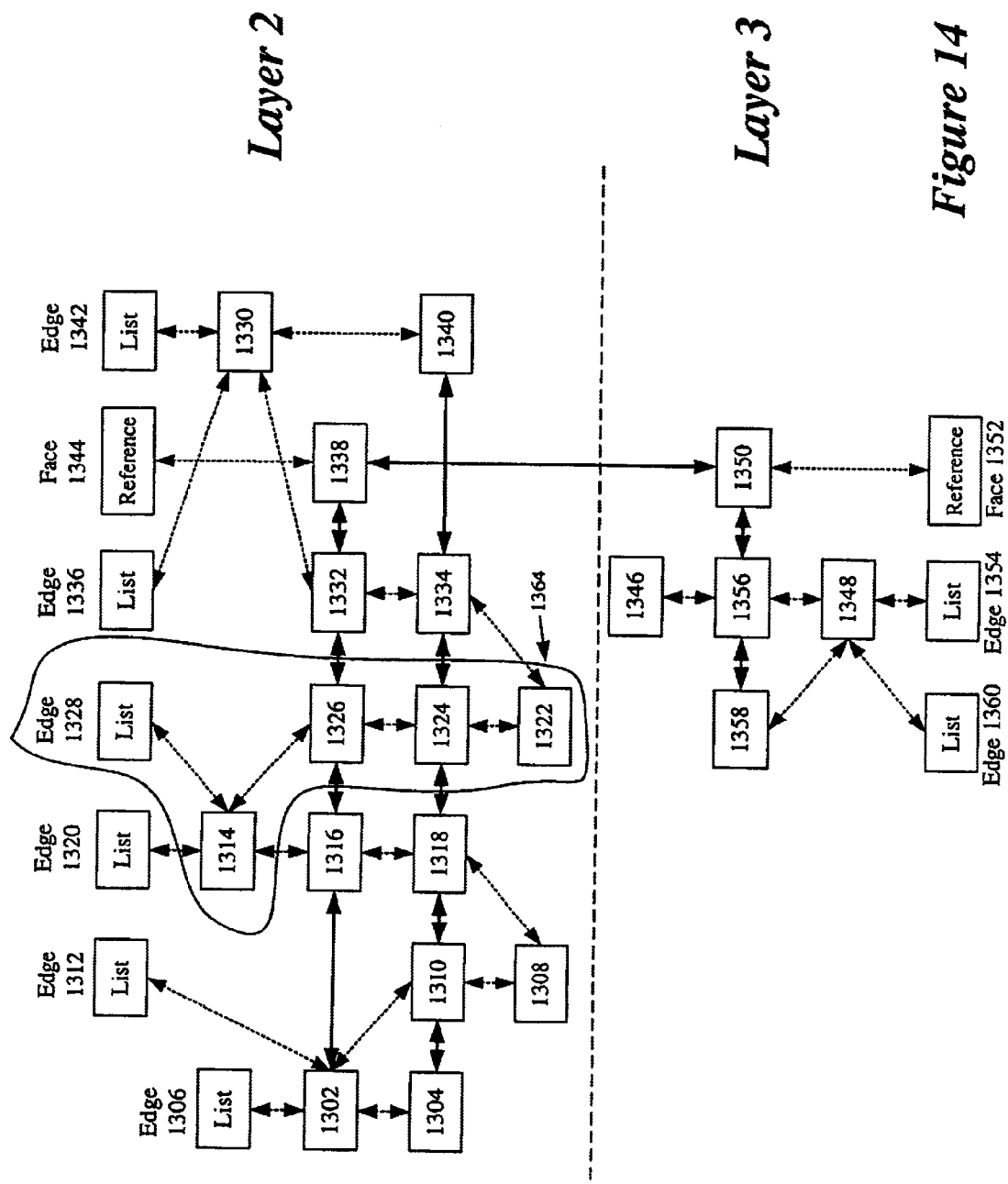

FIGS. 13 and 14 illustrate one example of topological routes. FIG. 13 presents two topological routes 1370 and 1372. The route 1370 is a multi-layer topological route that (1) starts at node 1302 of layer 2, (2) intersects edges 1320, 1328, and 1336 on layer 2, (3) vias up to layer 3 through face items 1338 on layer 2 and 1350 on layer 3, (4) intersect edge 1354 on layer 3, and (5) terminates on node 1358 on layer 3. This route's intersections with edges 1320, 1328, 1336, and 1354 are specified by edge items 1316, 1326, 1332, and 1356.

The route 1372 is a topological route that only traverses layer 2. This route (1) starts at node 1304, (2) intersects edges 1312, 1320, 1328, and 1336, and (3) terminates on node 1340. This route's intersections with edges 1312, 1320, 1328, and 1336 are specified by edge items 1310, 1318, 1324, and 1334.

FIG. 14 illustrates the data structure representation of these topological routes 1370 and 1372. Each of these routes is specified by two sets of linked lists. One set includes a linked list of path references, and the other set includes linked lists of edge references. The path linked list of route 1370 starts at node 1302, goes through edge items 1316, 1326, 1332, face items 1338 and 1350, edge item 1356, and terminates on node 1358. The path linked list of route 1372 starts at node 1304, goes through edge items 1310, 1318, 1324, and 1334, and terminates on node 1340.

As shown in FIG. 14, the nodes and edge items are inserted on their edge's linked list in the order that they are placed on their respective edge. For instance, the edge list 1364 of edge 1328 starts with node 1314, traverses through edge items 1326 and 1324, and then terminates on node 1322. This order of these nodes and edge item on edge list 1364 matches the order (illustrated in FIG. 13) of these nodes and edge items on edge 1328.

2. Overall Flow of Topological Router

Figure 15A:
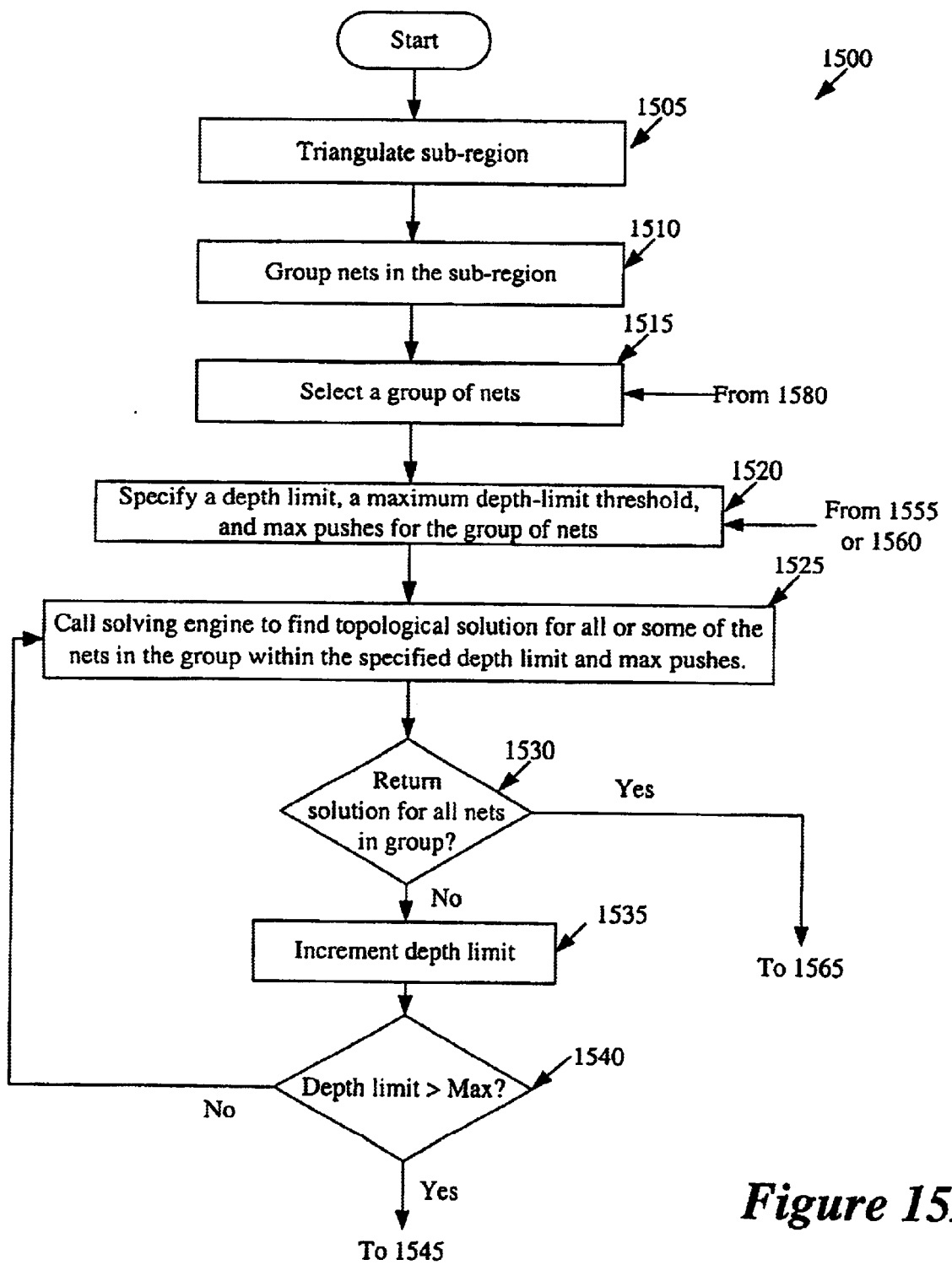
FIG. 15 illustrates a process that provides the overall flow of a topological engine in some embodiments of the invention.
Figure 15B:
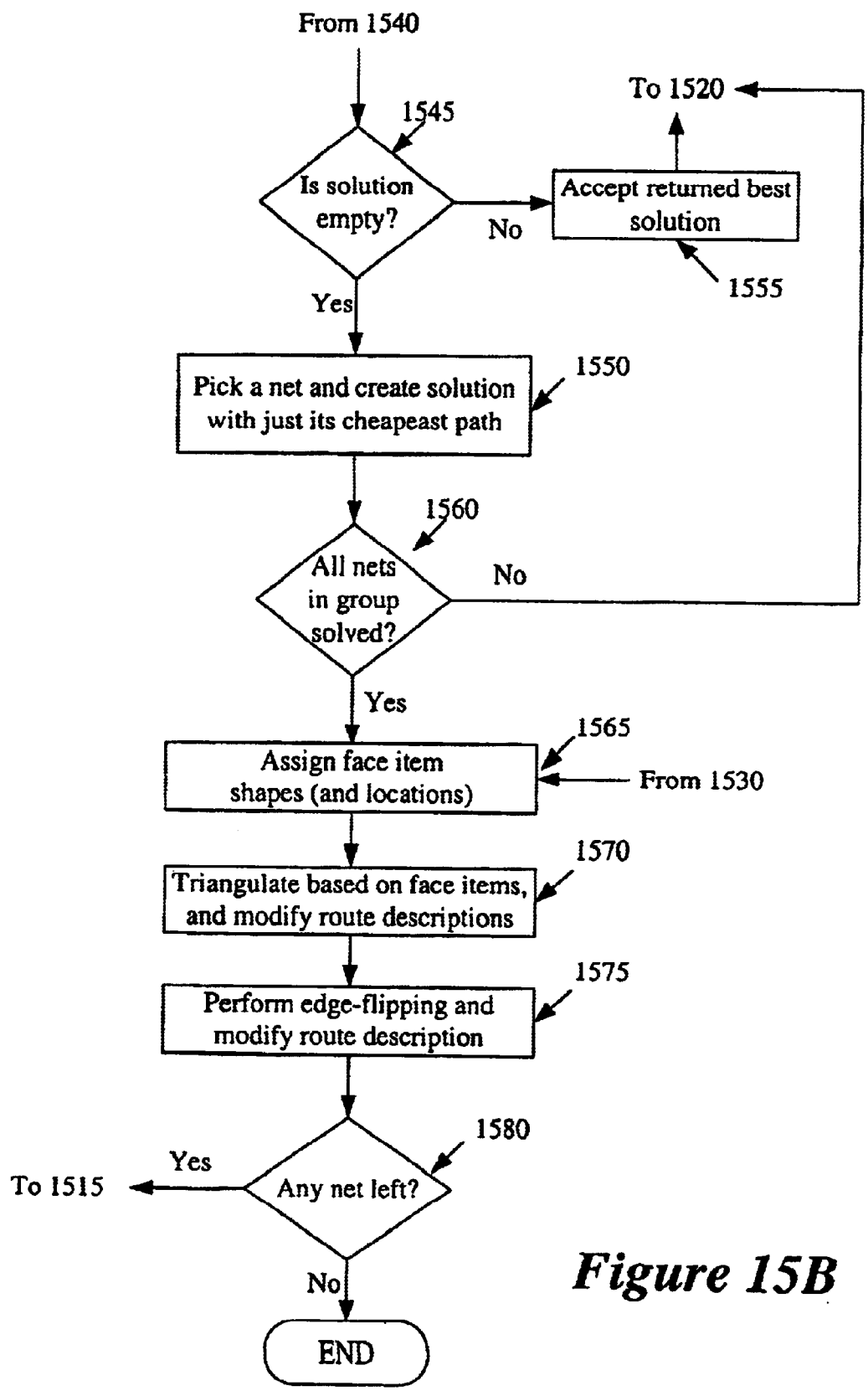

FIG. 15 illustrates a process 1500 that provides the overall flow of the topological engine in some embodiments of the invention. As shown in this figure, the process initially triangulates (at 1505) the sub-region defined at 205. This triangulation will be further described below.

After the triangulation, the process groups (at 1510) the nets in the sub-region. Different embodiments group the nets in the sub-region differently. Some embodiments group the nets based on a clustering approach. Some of these embodiments cluster the nets by (1) defining, for each net, a three-dimensional bounding box that contains the net's pins, (2) pair-wise intersecting the bounding box of each net with each of the other nets, (3) computing the volume of intersection between the intersections, and (4) clustering each net with the other nets that have the greatest overlapping volume (ie., that are likely to have the most amount of overlap). Some of these embodiments order the nets in each group. For instance, some embodiments sort each group based on entropy (e.g., based on descending order of entropies, where a high entropy net has lots of equivalently good options, while a low entropy net has only a few good routes).

Next, the process selects (at 1515) one of the groups identified at 1510 for routing. Different embodiments process the selected group of nets differently. The embodiments described below solve all the nets in the selected group before selecting another group of nets.

Other embodiments, however, might process the nets differently. For instance, some embodiments might order the nets based on an entropy value (e.g., might order the nets in a descending order of entropies), and select the group of nets based on this order. Some of these embodiments then use a two-tiered approach in selecting the group of nets at 1515. First, from the top of the set of unsolved nets in the ordered netlist, these embodiments select a fixed number (e.g., 20) nets. When this list does not have the fixed number of nets remaining, the process selects all the remaining nets. Second, after selecting the group of nets, these embodiments return the nets in the selected group that they cannot solve within an acceptable cost in a pre-defined number of tries. Accordingly, these embodiments statically try to select a fix-number of nets each time at 1515, but then dynamically return some of the selected nets as unsolved nets when the selected group proves too hard to route entirely at the same time. The returned unsolved nets are then treated like the remaining unsolved nets. In other words, these embodiments perform the two operations listed above on all the remaining unsolved nets (i.e., from the list of unsolved nets that includes the returned unsolved nets, these embodiments (1) select and try to process a number of nets, and (2) return any nets that they cannot solve within an acceptable cost).

In the embodiments described below, the topological engine uses an IDA* solving engine that deterministically searches for the best routing solution for the selected group of nets. An IDA* searching technique involves searching the solution space in an iteratively-deepening manner, up to a particular depth limit.

Accordingly, at 1520, the process specifies a particular depth limit for the IDA* solving engine. Some embodiments compute the depth limit as the sum of the cheapest topological routes for all the unsolved nets in the sub-region. One manner of computing the cheapest topological routes will be explained below by reference to FIG. 40.

Some embodiments generate the cheapest route for each unsolved net by ignoring the routes of the other unsolved nets. Accordingly, these embodiments generate the cheapest routes for each net in the first group of nets being solved in an empty sub-region (i.e., a sub-region that does not contain the topological routes of any other nets in the group). However, the cheapest routes for the subsequent groups of nets are computed for a sub-region that contains the topological routes of the previously routed nets.

At 1520, the process also computes a maximum depth-limit threshold. In some embodiments, the maximum threshold value is 50% greater than the initial depth limit specified at 1520. The process also specifies (at 1520) a maximum number of iterative attempts, referred to below as pushes, for the solving engine.

At 1525, the process then calls the solving engine to find a topological route for all or some of the nets in the selected group within the specified depth limit and max pushes. The operation of the solving engine will be further described below. Next, the process determines (at 1530) whether the solving engine returned a solution for all the nets in the selected group. If so, the process transitions to 1565, which will be described below. If not, the process increments (at 1535) the depth limit. Some embodiments increment the depth limit by 10%. Accordingly, the solution found by incrementing the depth limit in this manner is always with 10% of the optimal solution.

The process then determines (at 1540) whether the depth limit exceeds a maximum value. If not, the process transitions back to 1525 to direct the solving engine to find a solution within the incremented depth limit. On the other hand, if the process determines (at 1540) that the current depth limit is greater than the maximum threshold value, the process determines (at 1545) whether the solving engine returned an empty solution set in response to the call at 1525.

As further described below, the solving engine returns an incomplete non-empty solution when it can only find topological routes for some of the nets in the selected group. If the process determines (at 1545) that the solving engine has returned an incomplete non-empty solution, it accepts (at 1555) the topological routes for some of the nets that the solving engine returned. The process then returns to 1520 to try to find topological routes for the remaining unsolved nets of the group selected at 1515. In other words, the process (1) specifies (at 1520) a depth limit, a maximum depth-limit threshold, and a max number of pushes for the remaining unsolved nets, (2) calls (at 1525) the solving engine for these nets, and then (2) based on the solutions returned by the solving engine, performs some or all the operations 1530–1545 as described above.

On the other hand, if the process determines (at 1545) the solving engine did not find a solution for any net, the process selects (at 1550) one of the nets in the selected group and creates a solution for this net based just on this net's cheapest topological route. The process then determines (at 1552) whether it has found a topological route for all the nets in the group identified at 1515. If not, the process returns to 1520 to try to find topological routes for the remaining unsolved nets of the group selected at 1515. Like the transition back to 1520 from 1555, this transition results in the process (1) specifying (at 1520) a depth limit, a maximum depth-limit threshold, and a max number of pushes for the remaining unsolved nets, (2) calling (at 1525) the solving engine for these nets, and then (2) based on the solutions returned by the solving engine, performing some or all the operations 1530–1545 as described above.

On the other hand, if the process determines (at 1552) that it has found a solution for all the nets in the group identified at 1515, the process (at 1565) specifies a shape for each face item that the solving engine defined while routing the nets. The face items can form topological vias or Steiner points. Different embodiments use different shapes for face items. For instance, the face items can be hexagonal, octagonal, circles, squares, diamonds, etc. Several of these shapes are described below in Section IV. Some embodiments select the shape of the face items based on the wiring model that the geometric engine will use, as further described below.

After assigning face-item shapes, the topological-routing process 1500 then triangulates (at 1570) the sub-region layers based on the face items. This triangulation is performed by inserting a node in the triangulated graph in the location of each face item (e.g., in the center of each face item shape defined at 1565), and then triangulating each face that contains a face item based on the location of the inserted node. In some embodiments, the process 1500 specifies the location of each face item at 1565. For instance, at 1565, the process 1500 can identify the location of a non-via face item at the center of its bounding polygon, and identify the location of a via-forming face item at the center of the bounding polygon for its via (i.e., at the center of the intersection of the bounding polygons of the items that form the via). In other embodiments, the location of each face item is specified while routing the group of nets selected at 1515. For instance, as further described by reference to FIG. 39A, a face item's location can be identified and modified by an optimization process. Some embodiments might also insert nodes about the periphery of a face item shape in order to triangulate the face-item shape into smaller triangles.

At 1570, the process also modifies the topological description of the routes that cross the new triangulated edges. After this triangulation, the process (at 1575) performs a follow-up edge-flipping operation, which will be described below by reference to FIG. 16. If the process ends up flipping any edges at 1575, it also modified at 1575 the topological description of the routes that crossed the old or now cross the new edge. At 1580, the process determines whether there are any unsolved nets in the sub-region. If so, the process returns to 1515 to select the next group of nets for solving. If not, the process ends.

3. Triangulation

Different embodiments use different topological structures to define topological routes. The embodiments described below use triangulated graphs of the sub-region. Specifically, these embodiments use a constrained Delaunay triangulation ("CDT") technique. Several such techniques are disclosed in C. L. Lawson, "Transforming triangulations", DiscreteMath, 3:365–372, 1972; C. L. Lawson, "Software for C Surface Interpolation," In J. R. Rice, editor, *Math Software III*, pp 161–194, Academic Press, New York, 1977; L. J. Guibas, D. E. Knuth, and M. Sharir, "Randomized Incremental Construction of Delaunay and Voroni Diagrams", Algorithmica, 7:381–413, 1992.

Figure 16:
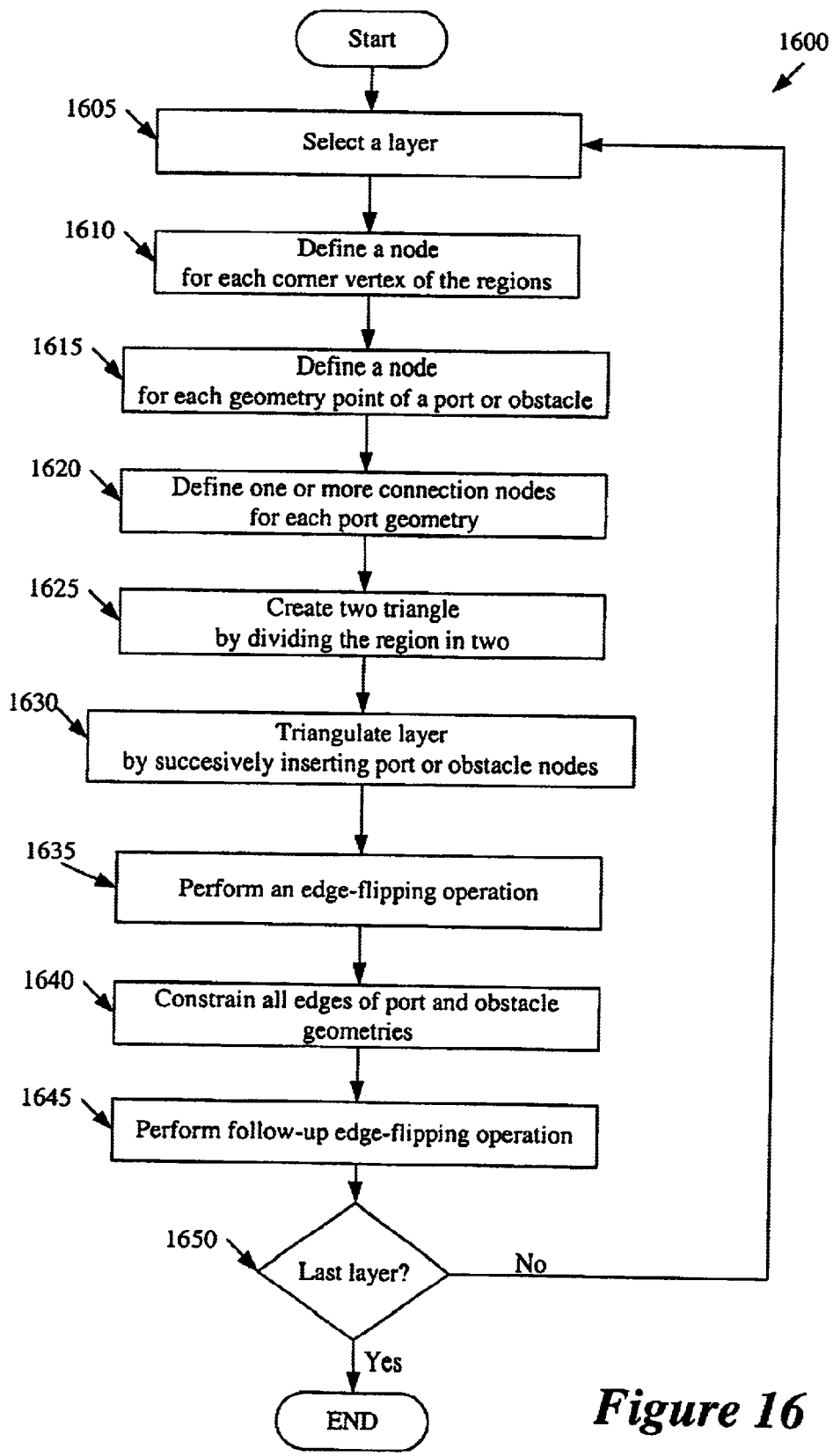
FIG. 16 illustrates a triangulation process that is used in some embodiment of the invention.

FIG. 16 illustrates a triangulation process 1600 that is used in some embodiment of the invention. This process decomposes each layer of the sub-region into several triangular faces. Accordingly, this process initially selects (at 1605) one of the layers of the sub-region. Next, the process (1) defines (at 1610) a graph node at the location of each corner of the sub-region on that layer, and (2) defines (at 1615) a graph node at the location of each geometry point of a port or obstacle in the selected sub-region layer. Some embodiment only define one node for each virtual pin in the selected subregion layer, since in these embodiments the virtual pins are only single-point pin geometries.

Figure 17:
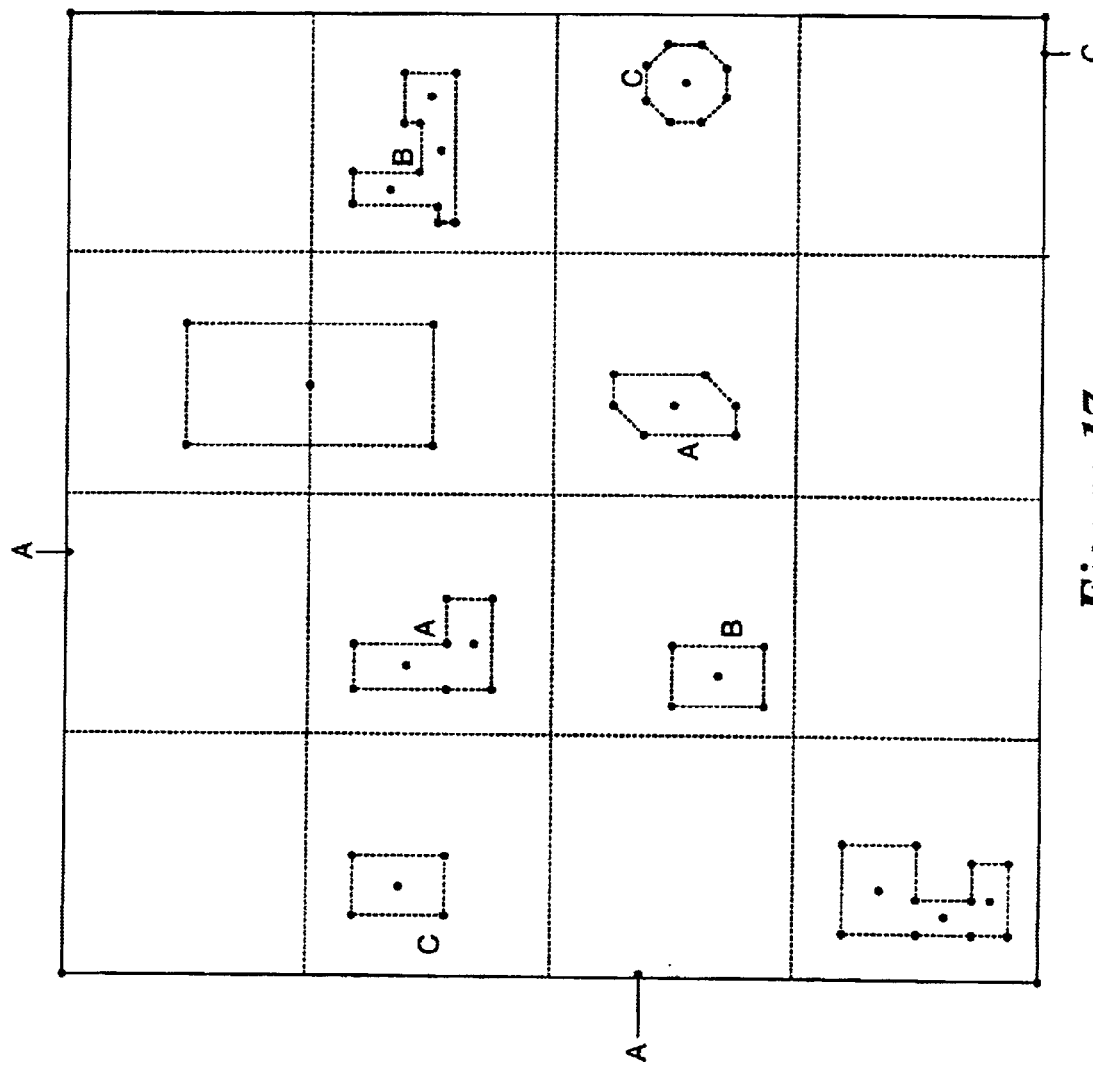
FIG. 17 illustrates the layout of FIG. 4 after nodes have been defined at each sub-region corner, at each port or obstacle geometry point, and within each port geometry.

The process next defines (at 1620) one or more connection nodes within each non-virtual port geometry. When the port geometry is convex, the process (1) defines a node in the middle of the geometry if the geometry is relatively small, or (2) divides a larger geometry into smaller convex geometries and then defines a node in the middle of each smaller geometry. On the other hand, if the port geometry is not-convex, the process divides the geometry into several convex geometries, and then defines a node in the middle of each smaller geometry. A good convex decomposition would have fewer pieces that are more representative of the shape of the overall geometry. Also, FIG. 17 illustrates the layout of FIG. 4 after nodes have been defined at each sub-region corner, at each port or obstacle geometry point, and within each port geometry.

One of ordinary skill will realize that other embodiments might define graph nodes slightly differently. For instance, some embodiments might define a graph node for only some of the virtual pins. These embodiments select as triangulation nodes vpins that are near interior geometry nodes that are close to the boundary. Of the remaining vpins, these embodiments select every nth (e.g., 5th) vpin around the boundary. Also, some embodiments might also define nodes on the sides of certain geometries to ensure that there are sufficient edges to detect congestion in the IC region.

Next, the process creates (at 1625) two triangles by dividing the region along a diagonal line connecting two of the corner node vertices. The process then successively inserts (at 1630) individual port or obstacle nodes in the created triangles to further triangulates the triangles. Specifically, when a new node is inserted, the triangle containing that node is identified, and that triangle is further triangulated by connecting the newly-inserted node to the vertices of the identified triangle.

Figure 18:
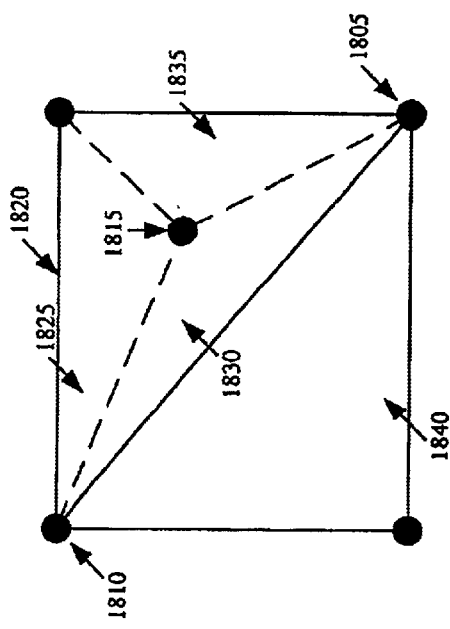
FIG. 18 illustrates a triangulation technique.

FIG. 18 illustrates this triangulation technique. In this example, two triangles 1820 and 1840 are created by connecting two diagonal nodes 1805 and 1810 of the sub-region layer. Next, a node 1815 is inserted in the sub-region. The triangle 1820 that contains this newly-inserted node is then further triangulated into three smaller triangles 1825, 1830, and 1835 by connecting the newly-inserted node to the vertices of triangle 1820.

After defining a set of triangles at 1630, the process performs an edge-flipping operation to make the triangulation Delaunay (i.e., to maximize the minimal angle of each triangle). This operation is done in order to improve the likelihood that the topological routes produced by the topological engine can be converted into specific geometric routes. To have an absolute guarantee that the generated topological routes can be geometrized, a visibility graph needs to be constructed to analyze the edge between any two graph nodes that have unobstructed view of each other in order to ensure that each such edge is not over congested. However, such an approach would be computationally expensive. Hence, instead of examining the edge between each such pair of graph nodes, some embodiments perform an edge-flipping operation to maximize the minimal angle of each triangle. Such an edge-flipping Delaunay operation results in a good approximation of the visibility graph.

Figure 20:
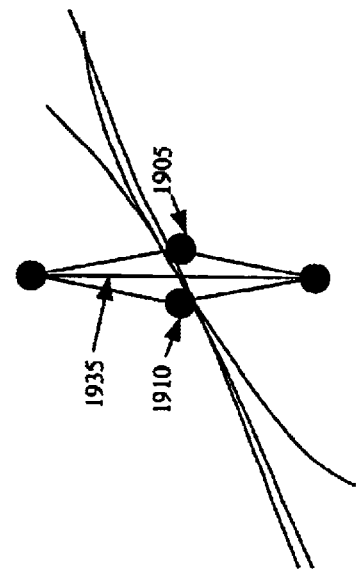
FIGS. 19 and 20 illustrate why maximizing the minimal angles of the decomposing triangles improves the likelihood that the generated topological routes can be geometrized.
Figure 19:
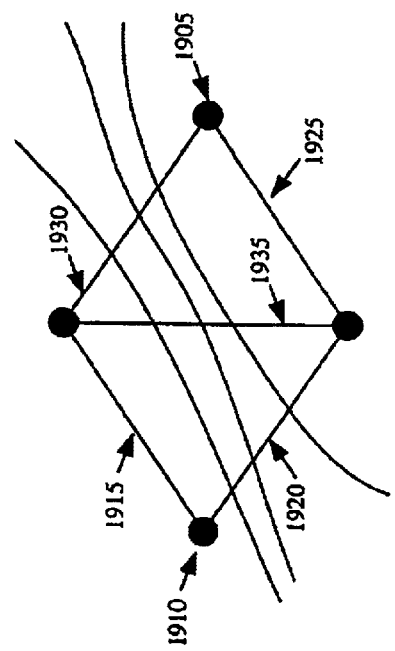

FIGS. 19 and 20 illustrate why maximizing the minimal angle of each triangle improves the likelihood that the generated topological routes can be geometrized. In these figures, nodes 1905 and 1910 do not have an edge between them. Hence, the topological engine cannot measure the congestion of the straight-line path between these two nodes. It can, however, measure the congestion on edges 1915, 1920, 1925, 1930, and 1935. In FIG. 19, the triangles are equilateral triangles, and therefore have the largest minimal angles. As illustrated in FIG. 19, it is relatively unlikely that a set of topological routes exist that could overfill the capacity of the straight-line path between nodes 1905 and 1910 without over congesting the capacity of edge 1935. However, as illustrated in FIG. 20, when the adjoining triangles have small minimal angles, it is quite possible that a set of paths over congest the straight-line path between nodes 1905 and 1910 without over congesting the capacity of the adjoining edge 1935.

Some embodiments perform an edge-flipping operation by identifying, for each triangle, a circle that encompasses all of the triangle's vertices. If that circle encompasses the vertex of another triangle as well, and if the two triangles do not jointly form a non-convex polygon, then the common edge between the two triangles is flipped. Flipping an edge between two triangles means deleting the existing common edge between the two triangles and defining a new edge between the two vertices of the triangles that were not previously connected. The edge flipping operation typically results in a new pair of triangles that has larger minimal angles than the original pair of triangles. When a pair of abutting triangles form a non-convex structure, the common edge between them is not flipped.

FIGS. 21 and 22 illustrate one manner for performing the edge-flipping operation. FIG. 21 illustrates two triangles 2105 and 2110. Circle 2115 is the identified that encompasses all of the vertices of triangle 2105. This circle also includes the vertex 2120 of triangle 2110. As the two circles do not form a non-convex polygon, the common edge 2125 between these two triangles is flipped. FIG. 22 illustrates the newly-defined pair of triangles 2130 and 2135 and the edge 2140 between them.

Figure 23:
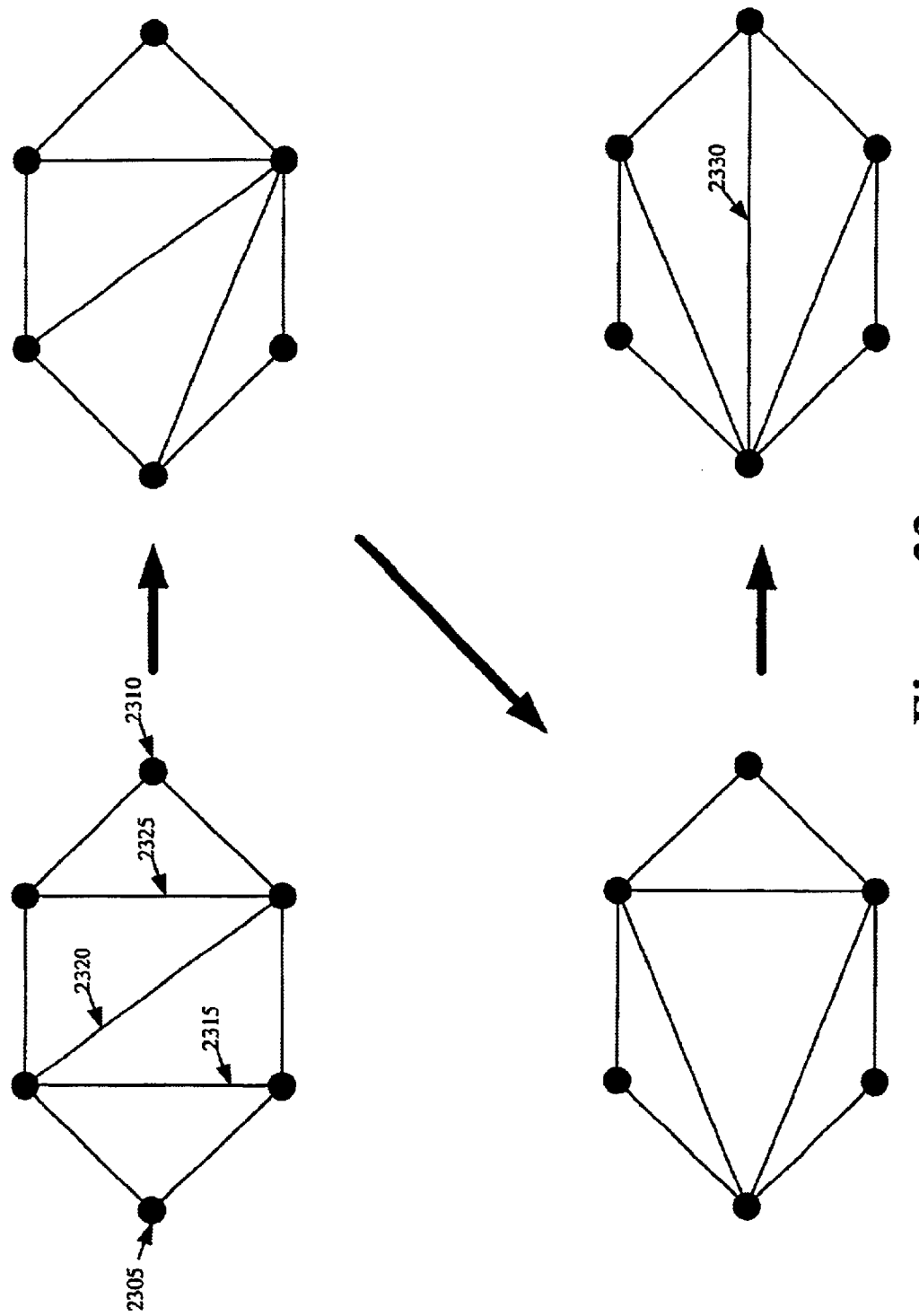
FIG. 23 illustrate one manner of constraining geometry and sub-region boundaries in the triangulated graph.

After performing the edge-flipping operation at 1635, the process performs (at 1640) a constraining operation to ensure that a triangle edge exists (1) between each pair of successive points of an obstacle or port, and (2) at the sub-region boundary edges. FIG. 23 provides a pictorial example of this operation. This figure illustrates two successive pairs of obstacle or port points 2305 and 2310 that do not share an edge after the edge-flipping operation of 1635. FIG. 23 illustrates the constraining operation flipping three different edges 2315, 2320, and 2325 until an edge 2330 exist between the two node points 2305 and 2310. Once this edge exists, the constrained flag is set in this edge's data structure to indicate that this edge should not be removed. Accordingly, this operation is referred to as a constraining operation, as it defines edges at sub-region boundaries and between successive pairs of geometry points, and then marks the edges as constrained.

Figure 24:
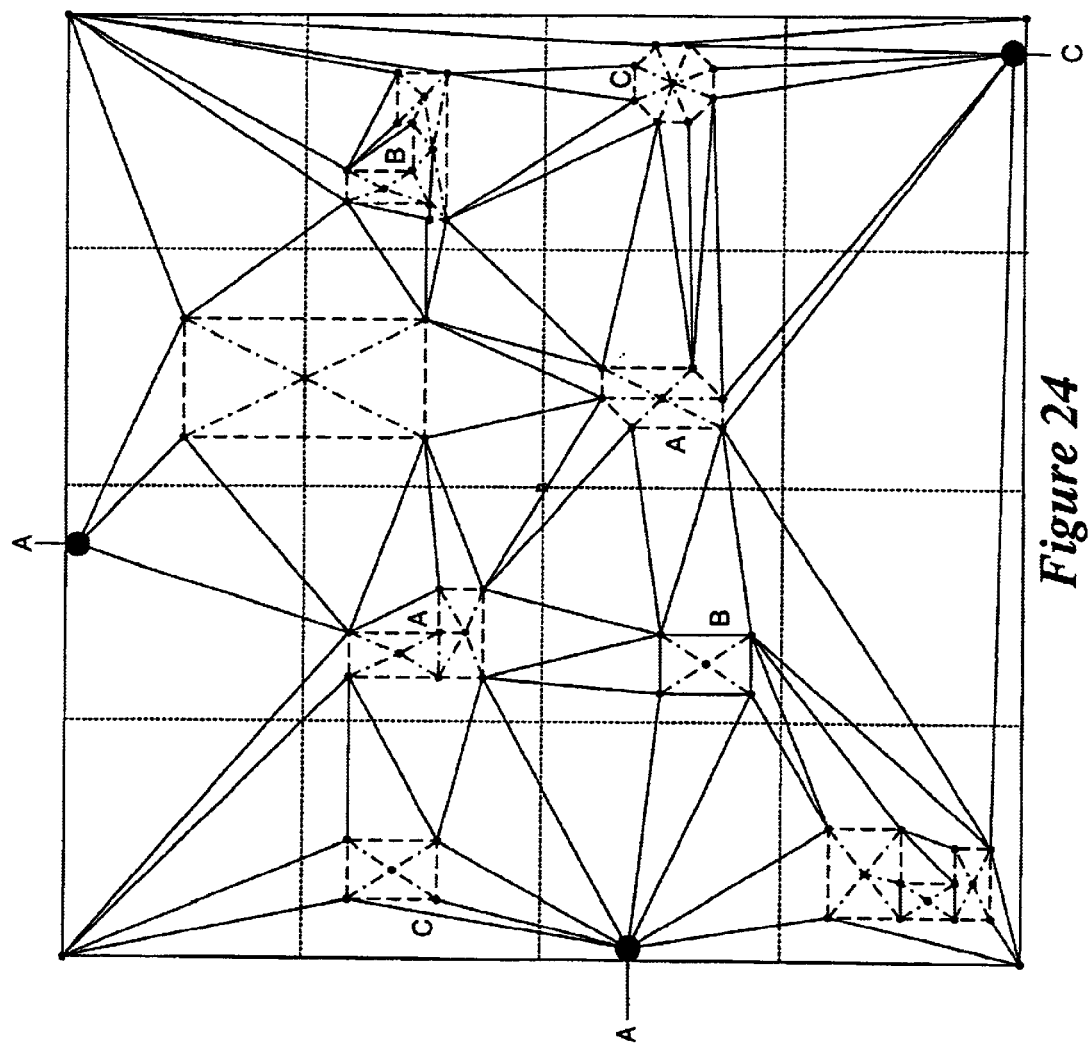
FIG. 24 illustrates an example of how the layout of FIG. 4 might look after triangulation.

Next, the process performs (at 1645) a follow-up edge-flipping operation without flipping the edges constraints at 1640. This follow-up operation is to try to maximize the minimal angle of the triangles as much as possible while respecting the constrained edges. The process then determines (at 1650) whether it has examined all the sub-region's layers. If not, the process transitions back to 1605 to select another layer and repeat 1610 through 1645 to triangulate the newly-selected layer. Otherwise, the process ends. The end result of the triangulation operations 1600 is a set of triangulated sub-region layers, which can be used to embed and remove topological routes in the sub-region. FIG. 24 illustrates an example of how the layout of FIG. 4 might look after triangulation.

Figure 25:
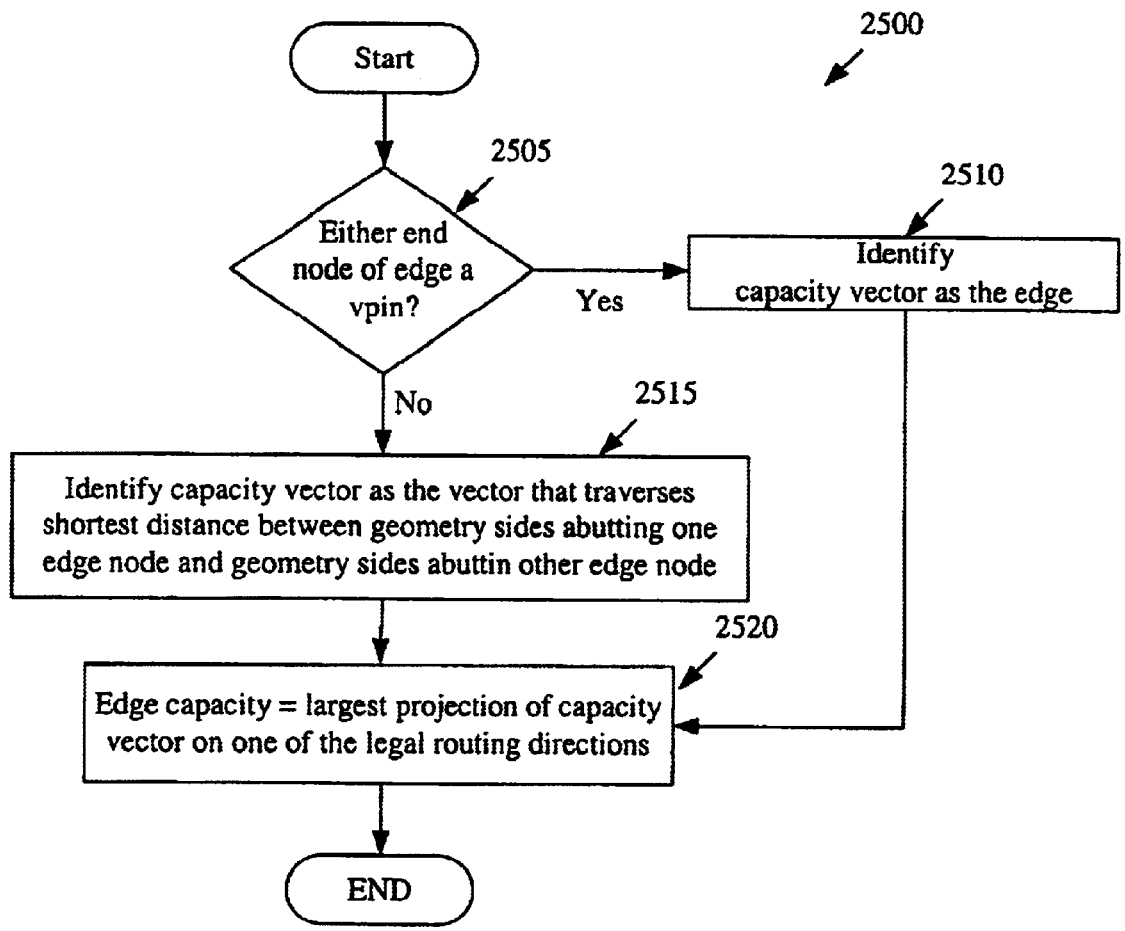
FIGS. 25 and 26 illustrate a process that the triangulation process can call each time it wants to identify the capacity of each edge in the triangulated sub-region.

In some embodiments, the triangulation operation defines the capacity of each edge in the triangulated regions. The above-described triangulation operation defines each edge's capacity whenever it creates the edge at 1625 through 1645. FIG. 25 illustrates a process 2500 that the triangulation process 1600 can call each time it wants to identify the capacity of each edge in the triangulated sub-region. This process is designed to support multiple-wiring models. Hence, either the triangulation process 1600 informs this process of the available routing directions on the edge's layer, or the process 2500 identifies these routing directions through any number of ways.

Figure 26:
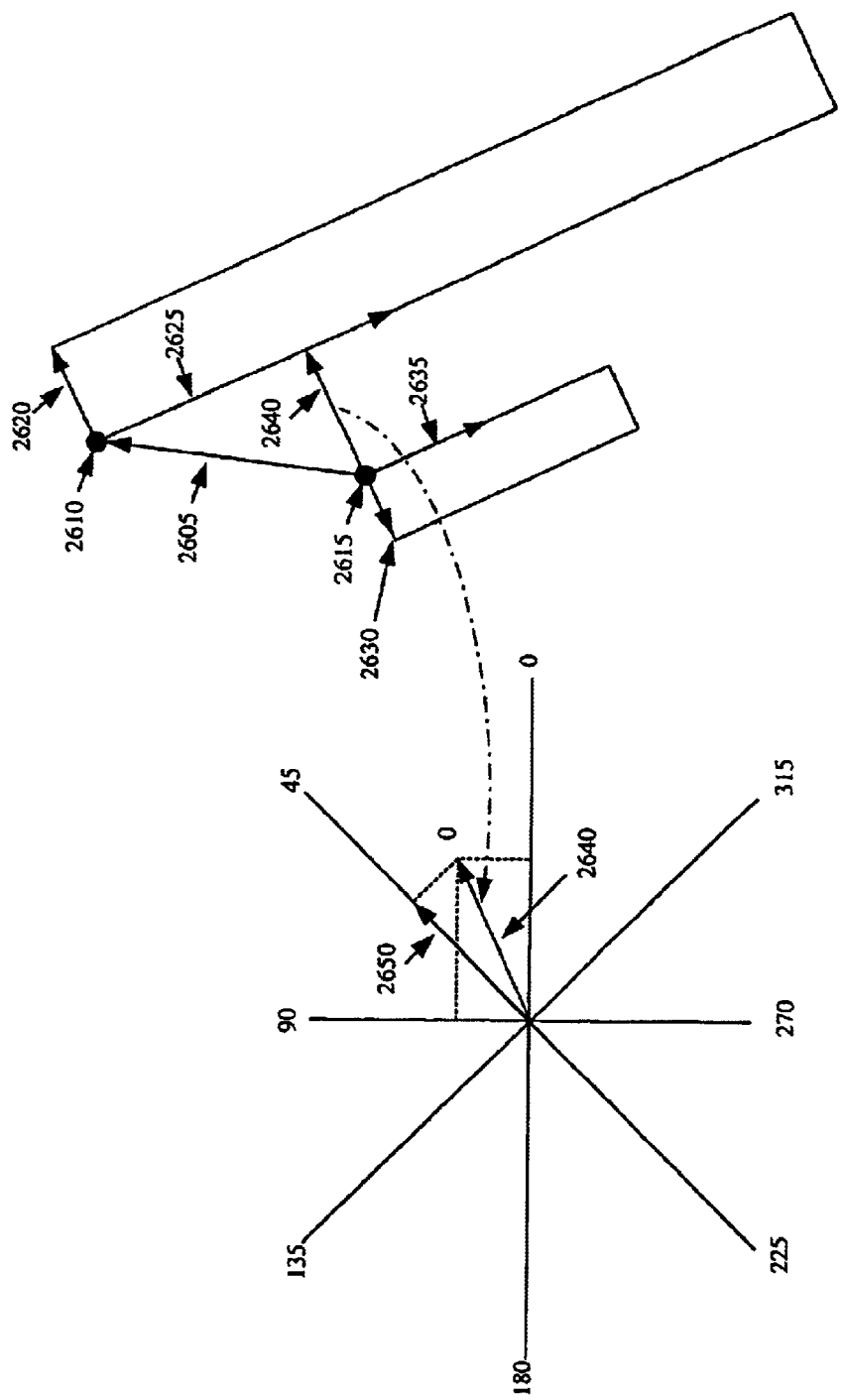

As shown in FIG. 25, the process 2500 determines (at 2505) whether either node of the edge belongs to a vpin. If so, the process identifies (at 2510) the edge as the capacity vector. If not, the process identifies (at 2515) the capacity vector as the vector that traverses the shortest distance between the sides of the geometry abutting one of the edge nodes and the sides of the geometry abutting the other edge node. FIG. 26 illustrates an edge 2605 between two nodes 2610 and 2615. As shown in this figure, vector 2640 is the capacity vector that traverses the shortest distance between sides 2620 and 2625 abutting node 2610 and sides 2630 and 2635 abutting node 2615.

After 2510 or 2515, the process 2500 defines the edge capacity as the length of the largest projection of the capacity vector onto one of the legal routing directions. The projection P of the capacity vector C onto a legal routing direction D is given by $$P = C * \cos \alpha,$$

where $\alpha$ is the angle between the capacity vector C and the legal routing direction D. Accordingly, the edge capacity is the magnitude of the projection vector. In the example illustrated in FIG. 26, edge 2605 is on an octilinear layer like the one shown in FIG. 1, and the largest projection 2650 of the capacity vector 2640 is onto the +45° routing direction.

The largest projection of the capacity vector can be identified (at 2520) in a variety of ways. Some embodiments compute the magnitude of the capacity vector's projection onto all the legal routing directions and then select the largest. Others identify the routing direction that makes the smallest angle with the capacity vector, define this routing direction as the direction of projection, and then compute the projection of this capacity vector onto the identified routing direction.

Other embodiments might compute the edge capacities differently. For instance, some embodiments might define each edge (including an edge that does not connect to vpins) to be its own capacity vector. Some of these embodiments then specify each edge's capacity as the edge's largest projection onto one of the legal routing directions.

4. Solving Engine a. Jointly Routing Groups of Nets with an IDA* Search Engine

As mentioned above, the topological routing engine calls (at 1525) its solving engine to identify topological routes for a group of nets. In the embodiments described below, the solving engine uses an IDA* searching technique to try to identify the optimal set of routes for the group of nets. In other words, the IDA* solving engine traverses through the solution space to deterministically identify the best possible combination of topological routes for the group of nets.

Figure 27:
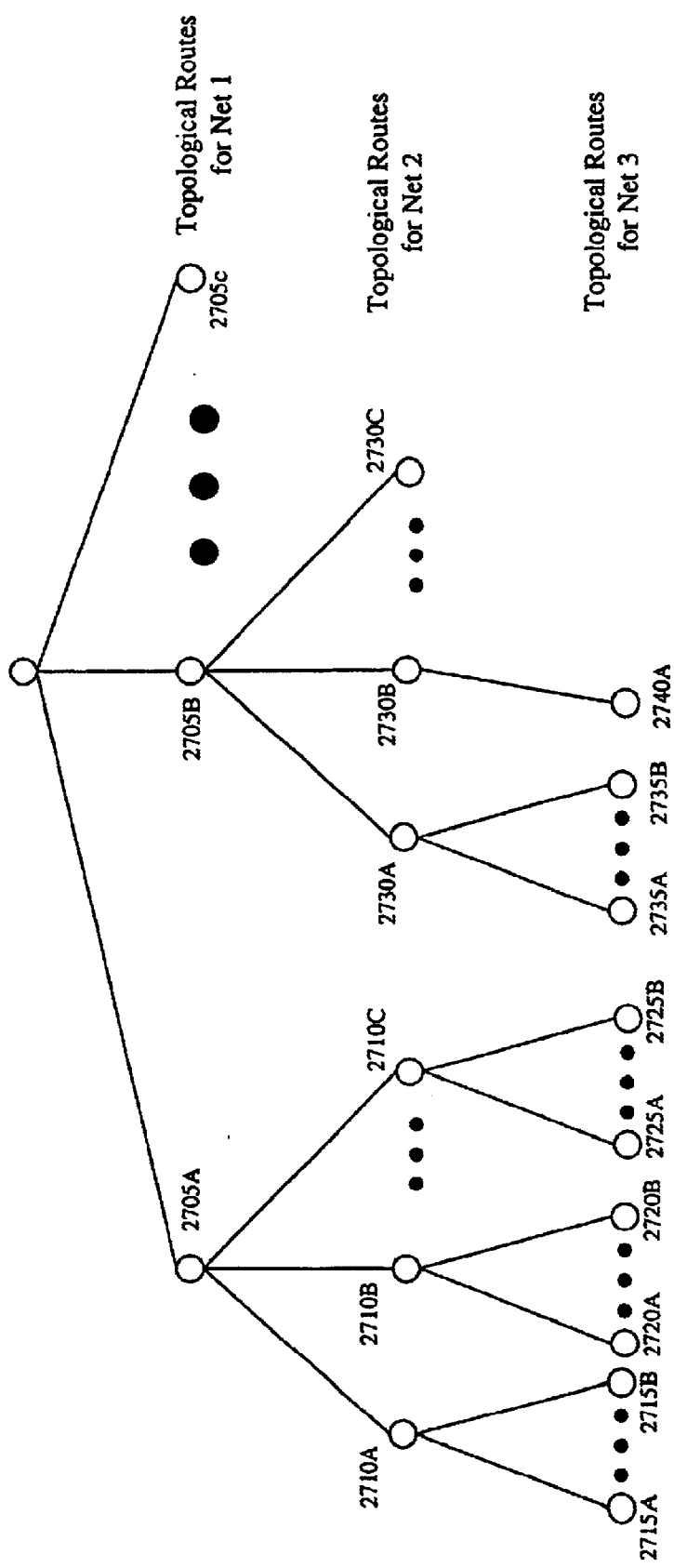
FIG. 27 pictorially illustrates an example of a solving engine's IDA*-searching operation for a set of three nets.

The IDA* solving engine traverses the solution space in an iterative-deepening manner up to a particular depth limit. FIG. 27 pictorially illustrates an example of this engine's IDA*-searching operation for a set of three nets. As shown in this figure, the IDA* solving engine initially identifies several topological routes 2705a–05c for a first net. One advantage of using topological routes is that the IDA* solving engine can define fewer possible routing solutions for each net at this stage. This is because there are fewer topological routes than geometric routes for a net, as one topological route can represent a plethora of diffeomorphic geometric routes.

After identifying the solutions for the first net, the IDA* solving engine selects a topological-routing solution for the first net. At each level of iteration, the search selects the solutions according to a quality metric. In the embodiments described below, this quality metric is the length of the topological routes. Other embodiments might use different quality metrics. In the example illustrated in FIG. 27, the topological routes for each net get longer from left to right (i.e., the solutions get worse going from left to right).

Accordingly, in the example illustrated in FIG. 27, the first selected solution for the first net is the best solution 2705*a*. Next, the solving engine determines whether embedding the selected solution 2705*a* in the received sub-region (i.e., the sub-region supplied by the topological engine at 1540) would cause the routing to exceed the depth limit specified by the topological engine. In the example illustrated in FIG. 27, this embedding does not make the routing exceed its depth limit. Hence, the engine embeds the selected solution 2705*a* in the sub-region, and then generates several solutions 2710*a–c* for the second net in the sub-region that contains the embedded solution 2705*a* of the first net.

After identifying the solutions for the second net, the IDA* solving engine selects the best solution 2710*a* for the second net, and determines whether embedding this selected solution in the current sub-region (i.e., the sub-region containing the embedded topological route 2705*a*) would make it exceed the depth limit specified by the topological engine. In the example illustrated in FIG. 27, this embedding does not make the routing exceed its depth limit. Hence, the engine embeds the selected solution 2710*a* in the sub-region, and then generates several solutions 2715*a–c* for the third net in the sub-region that contains the embedded routes 2705*a* and 2710*a* of the first and second nets.

After examining all the solutions 2715*a*–2715*b* for the third net in the sub-region that contains the embedded routes 2705*a* and 2710*a* of the first and second nets, the solving engine discover that all these solutions 2715*a*–2715*b* would make the route exceed the depth limit specified by the topological engine. Consequently, the combination of the best solutions 2705*a* and 2710*a* for first and second nets did not lead to an acceptable routing solution.

The solving engine then determines whether it has examined all the previously-defined solutions for the net at the previous level of the search. At this stage, this previous example is net 2, and the solving engine has not yet examined other routing solutions 2710*b*–2710*c* of net 2. Accordingly, the solving engine selects the next best solution 2710*b* for net 2 in the sub-region that contains solution 2705*a* for net 1. It then embeds this route 2710*b* as this embedding does not violate the depth limit, and then generates several routes 2720*a*–2720*b* for the third net in the sub-region that the embedded routes 2705*a* and 2710*b* of the first and second nets.

However, the solving engine cannot embed any of these routes 2720*a*–2720*b*. In this example, the solving engine then determines that it can embed all other routing solutions of net 2, but each time it determines that it cannot embed any of the resulting routing solutions for net 3. This means that the best solutions 2705*a* for first net does not lead to an acceptable routing solution. Hence, once the solving engine determines that it has examined all the previously-defined solutions for the net 2 at the current level of the search, it determines whether it has examined all the previously-defined solutions for the net at the previous level of the search. At this stage, this previous example is net 1, and the solving engine has not yet examined other routing solutions 2705*b*–2705*c* of net 1.

Accordingly, the solving engine examines the solution space that results from the selection of the next best solution 2705*b* for net 1. Eventually, in this example, the solving engine finds a solution for all three nets, when it determines that embedding the topological route 2740*a* for the third net does not cause the routing to exceed the depth limit. This solution includes route 2705*b* for net 1, route 2730*b* for net 2 in the sub-region that contains route 2705*b*, and route 2740*a* for net 3 in the sub-region that contains routes 2705*b* and 2730*b*.

This solution will be the optimal solution or very close to it so long as the depth limit is increased by small increments from its lowest possible value. For instance, when the depth limit is increment by 10%, the solution will be within 10% of the optimal solution.

Some embodiments described below introduce two additional constraints in the operation of the solving engine. First, these embodiments limit the solving-engine's IDA* search to a maximum number of iterative attempts, referred to below as pushes. This is to decrease the run-time of the solving engine. Limiting the number of pushes might cause the solving engine to return a solution that is not the optimal, but this might be acceptable in some situations as a reasonable tradeoff for run-time speed.

Second, the solving engine in these embodiments considers the impact of the routes selected for the nets in the selected group on the nets not yet selected. In other words, while solving the selected group of nets, the solving engine considers the routing cost of nets that have not yet been selected. In the embodiments described below, the solving engine generates a lower bound estimate on the cost of the unselected nets, and ensures that the depth limit is not exceeded by the sum of this estimate and the actual or predicted costs of the nets in the selected group.

b. Solving

Figure 28A:
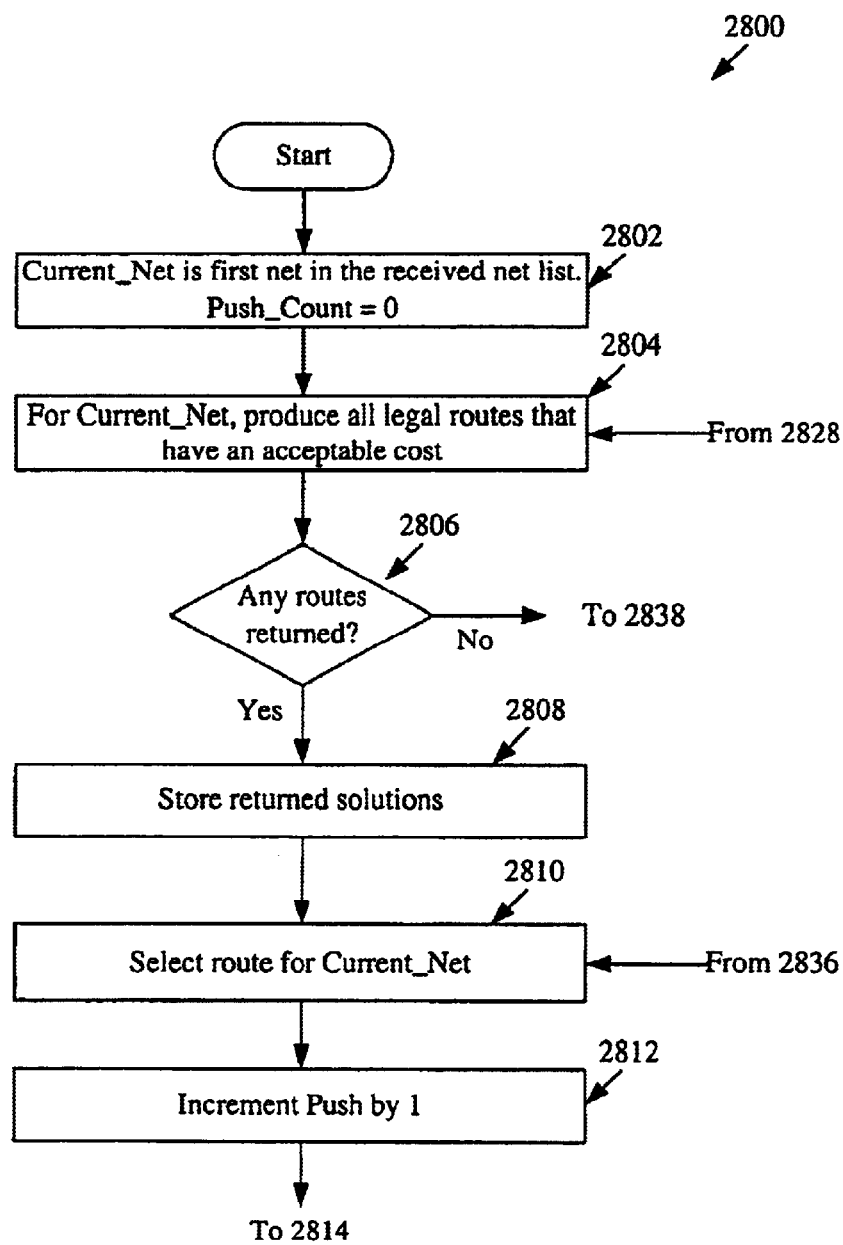
FIG. 28 illustrates a more detailed process used by the solving engine in some embodiments of the invention.
Figure 28B:
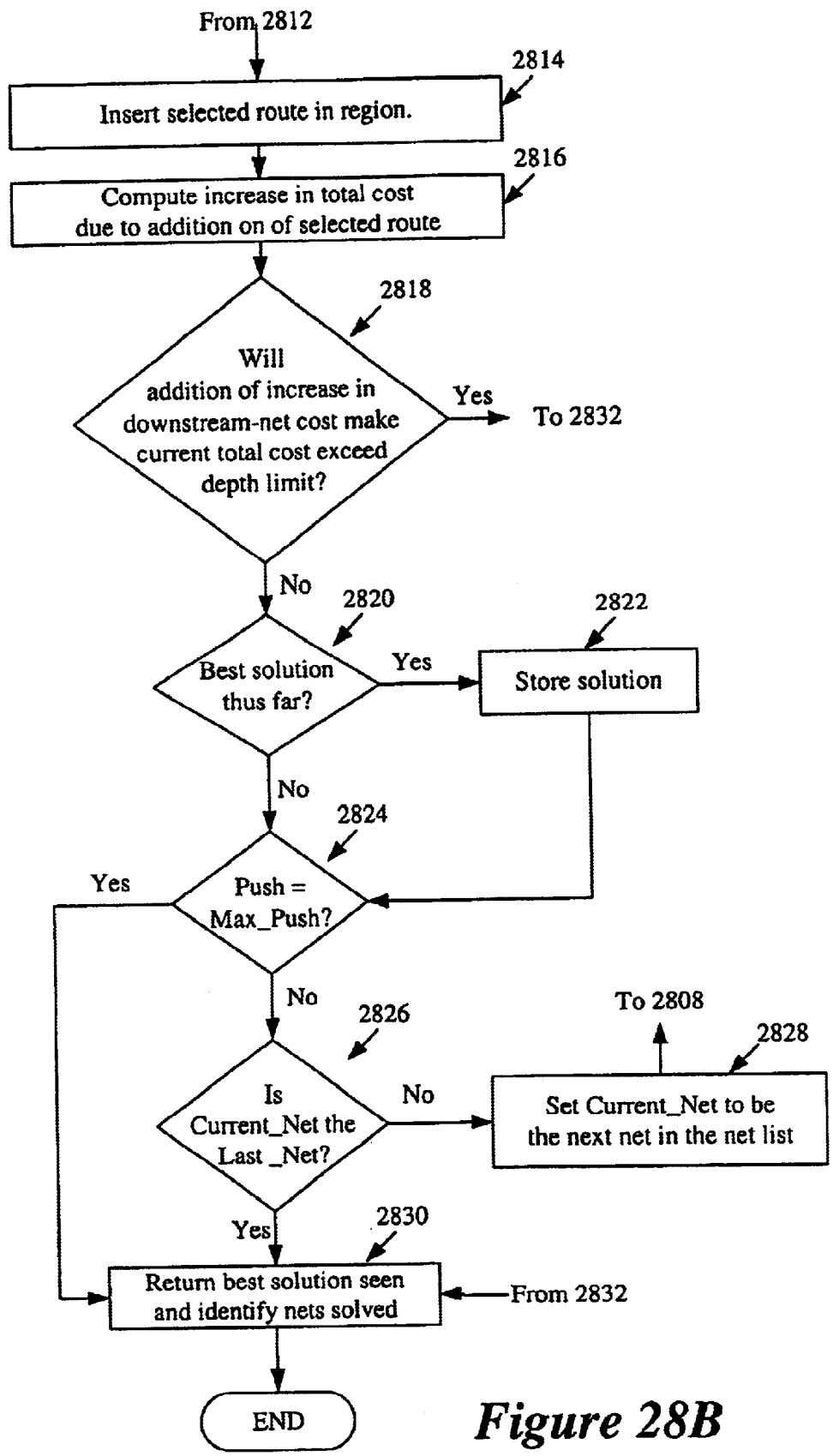
Figure 28C:
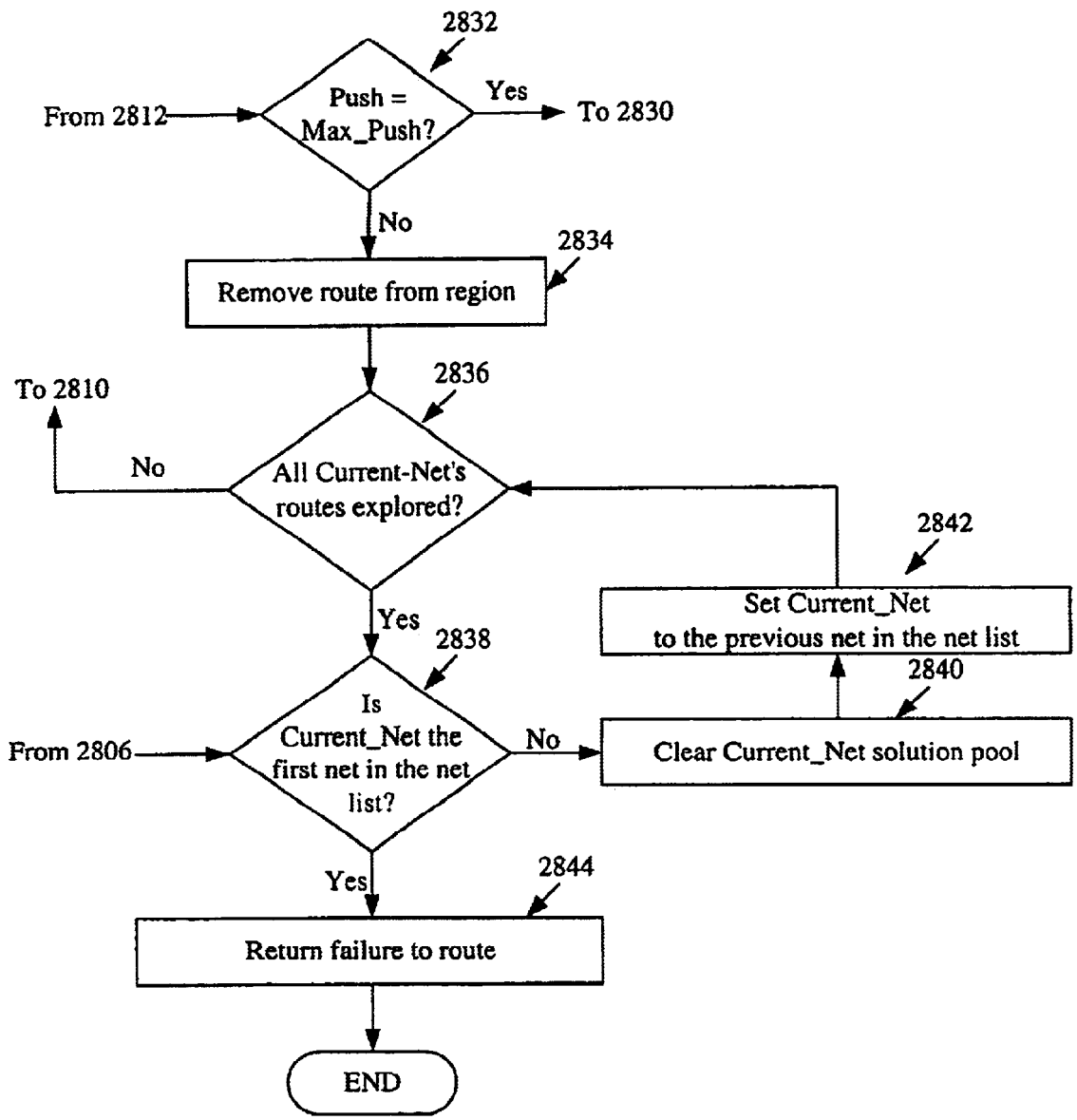

FIG. 28 illustrates a more detailed process 2800 used by the solving engine in some embodiments of the invention. As mentioned above, the process 2800 is performed each time that the process 1500 calls it at 1525 and specifies a selected group of nets to route within a given sub-region, depth limit, and maximum number of pushes. As shown in FIG. 28, the process 2800 identifies (at 2802) the Current_ Net as the first net in the specified group of nets. At 2802, the process also sets a Push_Count to 0. For the Current_ Net, the process then generates (at 2808) all the legal routes within the sub-region that have an acceptable cost. The acceptable cost is the depth limit minus the total cost of the routed nets minus the estimated cost of all the nets below the Current_Net, plus the estimated cost of the Current_Net.

When the specified group of nets is not the first group of nets that the solving engine has solved (i.e., if the topological route has called the solving engine previously to solve a different group of nets), the sub-region includes the topological routes of the previously-solved nets.

In addition, when the process 2800 generates the topological routes for the first net of the specified group, the sub-region does not include the topological route of any net within this group. However, each time the process 2800 embeds a topological route of one of the earlier specified nets, it generates the routes of the subsequent specified nets for a sub-region that contains the routes of the earlier embedded nets. In other words, when the process 2800 generates the topological routes for specified nets other than the first specified net, the sub-region includes previously-embedded topological routes of previous specified nets. At 2804, the process 2800 also stores the cost associated with each topological route that it generates. The route-generating process will be described below by reference to FIG. 29.

After 2804, the process determines (at 2806) whether it was able to generate (at 2804) any topological route for the Current_Net. If not, the process 2800 transitions to 2842, which will be described below. On the other hand, if the process generated (at 2804) one or more topological routes for the Current_Net, the process 2800 stores (at 2808) the generated routes.

Some embodiments store the routes in an array of N data objects, where N corresponds to the number of nets that the solving engine is trying to solve. In other words, there is one data object for each of the N nets. Each data object can store the route solution pool of its net, and includes a pointer into this pool that specifies the solution currently being explored. This pointer traverses through the solution pool as the IDA* solving engine examines the solutions of its net.

At 2810, the process selects one of the topological routes. In the embodiments described below, the process selects the shortest routes first. The process then increments (at 2812) the Push_Count by 1. Next, at 2814, the process embeds the selected route in the current sub-region, and subtracts the cost of this embedded route from the depth limit to obtain a new depth limit. At 2816, the process computes a revised total cost to account for the increase in cost due to addition of the selected route. This revised cost equals the old total cost minus the estimated cost of the Current_Net plus the actual cost of the inserted route.

Next, the process determines (at 2818) whether the total cost will exceed the depth limit after the cost increase in the downstream nets is added to the total cost. In some embodiments, the process adds the increase in the cost of each downstream net in a loop that checks after the addition of each downstream net's delta whether the addition has caused the total cost to exceed the depth limit. Such an approach allows the process 2800 to quickly identify that the route inserted at 2812 has caused the depth limit to be exceed. In some embodiments, the process 2800 uses the cheapest-route calculation process of FIG. 40 to compute the new cost of a downstream net. It also stores the downstream costs of each net (e.g., stores these costs in a stack), and computes the net's delta downstream by subtracting the appropriate stored cost from the computed cost.

When the process determines (at 2818) that the total cost exceeds the depth limit, it transitions to 2832 to decide whether it has also exceeded its maximum number of pushes. This determination will be further described below. On the other hand, if the process determines (at 2818) that the inserted route did not cause the depth limit to be exceeded, the process determines (at 2820) whether the insertion of the selected route at 2816 resulted in the best solution thus far. When the process reaches 2820, it has identified routes for a current set of one or more nets in the specified group. Hence, at 2820, the solution for the current set of nets is the best solution (1) if the process has not previously identified a solution for more than the current set of nets, or (2) if the process has previously identified a best solution for as many nets of the specified group of nets, but the sum of the cost of the routes in the previous solution is more the sum of the costs of the routes in the current solution.

If the process determines (at 2820) that the current set of embedded routes for the current set of nets do not provide the best solution obtained thus far, it transitions to 2824, which is described below. Otherwise, the process stores (at 2822) the current set of embedded routes as the best solution, and then transitions to 2824.

At 2824, the process determines whether it's Push_Count equals the maximum number of pushes that it received from the topological-routing process 1500. If the Push_Count equals the maximum number of pushes, the process returns (at 2830) the best solution that it recorded during its search, and then ends.

On the other hand, if the Push_Count is not equal to the maximum number of pushes, the process determines (at 2826) whether the Current_Net is the last net of the specified group of nets. If so, the process returns (at 2830) the best solution that it recorded during its search, and then ends.

If not, the process (at 2832) sets the Current_Net to be the next net of the specified group of nets. The process then transitions back to 2804 to generate all legal routes for this new Current_Net, and then perform the subsequent operations to try to embed one of these generated routes in the sub-region.

As mentioned above, the process 2800 transitions to 2832 when it determines (at 2818) that the total cost for inserting the selected route exceeds the depth limit. At 2832, the process determines whether its Push_Count equals the maximum number of pushes received from the topological routing process 1500. If so, the process returns (at 2830) the best solution that it recorded during its search, and then ends.

On the other hand, if the process determines (at 2832) that the Push_Count does not equal the received maximum number of pushes, the process removes (at 2834) the route inserted at 2814. The process then determines (at 2836) whether it has examined all the topological routes generated for the Current_Net at 2804. If not, the process transitions back to 2810 to select the next best route (e.g., next shortest route) for the Current_Net from the array described above, and then perform some of subsequent operations described above for the newly-selected route.

If the process determines (at 2836) that has examined all the topological routes generated for the Current_Net, the process determines (at 2838) whether the Current_Net is the first net in the specified group of nets. If so, the process has failed to embed any of the routes of the first net in the specified group, and hence returns (at 2844) its failure to route to the topological-routing process 1500.

If not, the process clears (at 2840) the Current_Net's solution pool in the above-described array. The process then defines (at 2842) the net before the Current_Net on the specified group as the new Current_Net. It next determines (at 2836) whether it has already explored all the routes for the Current_Net defined at 2842. Depending on this determination, the process transitions either to 2810 or 2838, as described above.

C. Route Generation

Figure 29A:
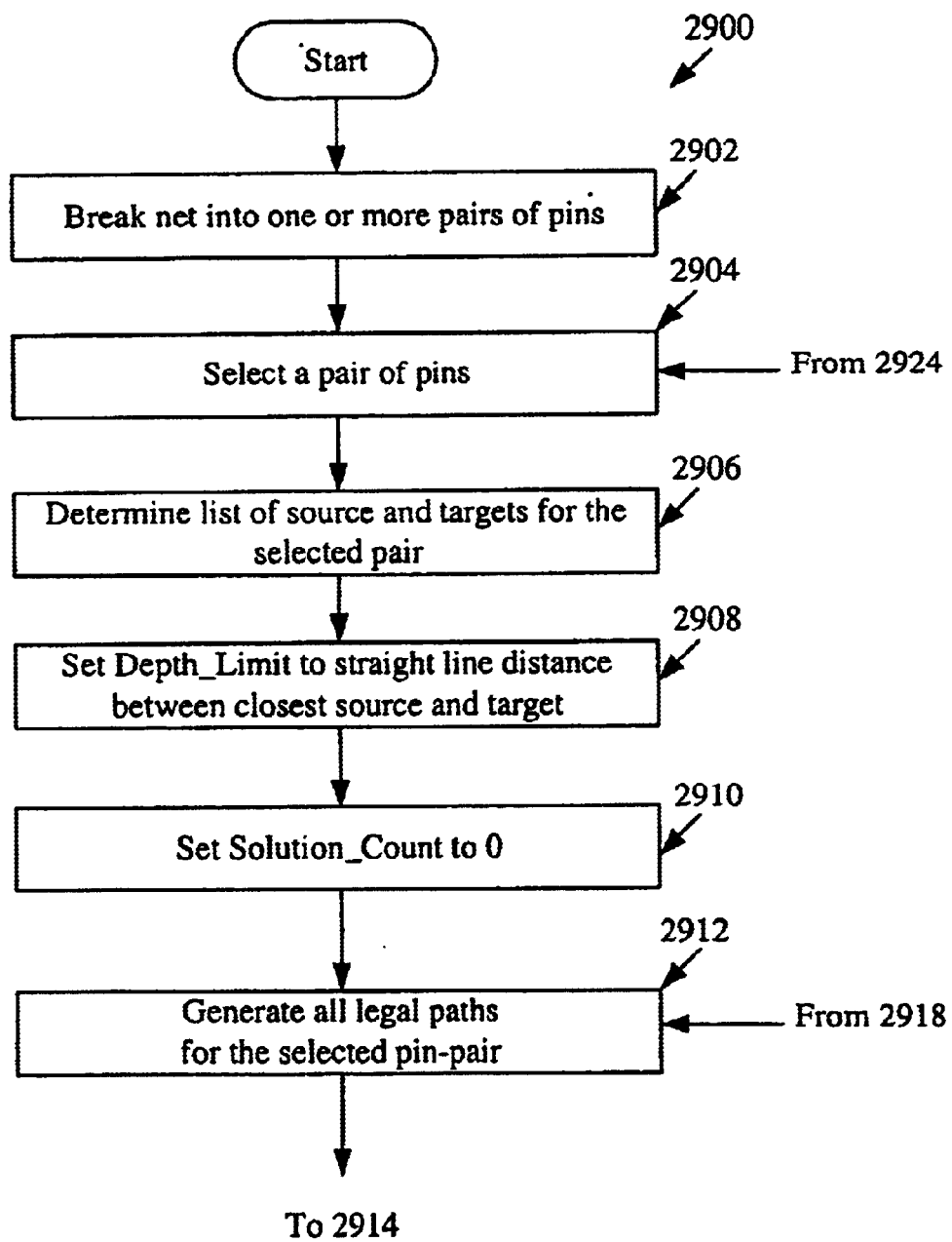
FIG. 29 illustrates a process that the solving engine uses to generate topological routes for a net.
Figure 29B:
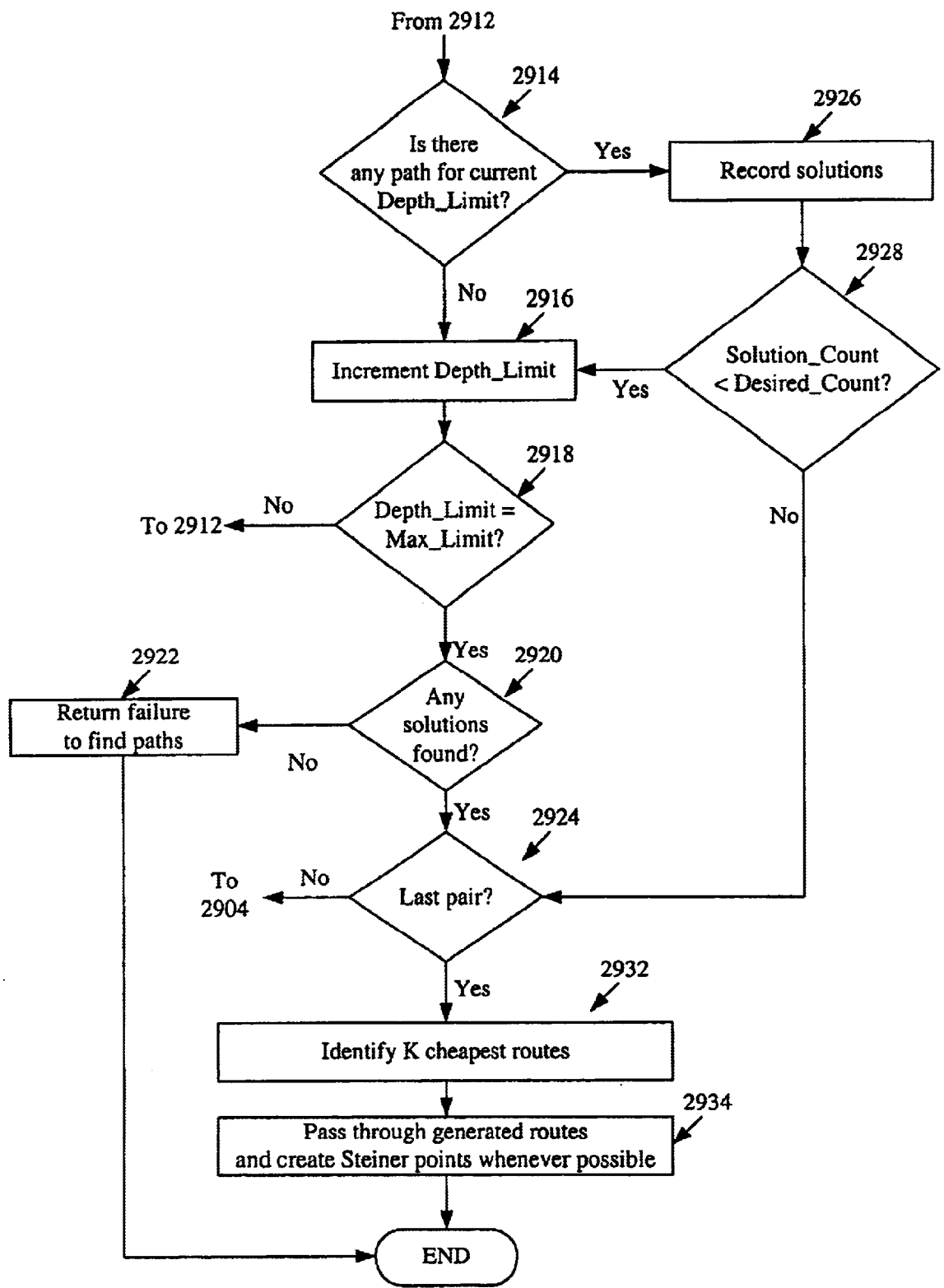

FIG. 29 illustrates a process 2900 that the solving engine uses at 2804 to generate topological routes for a net. Like the solving engine, the route generating process uses an IDA* search technique to identify the several routes for each net.

As shown in FIG. 29, the process 2900 initially identifies (at 2902) one or more pairs of pins for the Current_Net in the sub-region. It then selects (at 2904) a pair of pins for the net. The process next identifies (at 2906) a list of source and target port-geometries for the selected pair of pins of the Current_Net.

The process then identifies (at 2908) a Depth_Limit for generating routing path between the source and target geometries. In the embodiments described below, the Depth_Limit is set to the shortest distance between the closest source and target geometries. After 2908, the process defines (at 2910) Solution_Count to be equal to 0.

Next, the process generates (at 2912) all legal paths between the source and target geometries identified at 2906. The path-generating process will be described below by reference to FIG. 31. After 2912, the process determines (at 2914) whether it was able to generate (at 2912) any legal path between the source and target geometries. If not, the process transitions to 2916, which will be described below.

If so, at 2926, the process (1) records the generated path or paths and the cost for each path, and (2) increments Solution_Count by the number of paths generated at 2912. The process next determines (at 2928) whether Solution_Count is less than the desired number of solutions. If so, the process transitions to 2916, which will be described below. Otherwise, when the number of solutions exceeds the desired number of solutions, the process transitions to 2924, which will be described below.

As mentioned above, the process can transition to 2916 from 2914 or 2928. At 2916, the process increments the Depth_Limit. The process then determines (at 2918) whether the Depth_Limit exceeds a maximum depth limit. In some embodiments, the initial depth limit is the Euclidean distance between closest source and target, and the depth limit is incremented at each iteration by 1.1 times the cost of cheapest branch pruned for cost during previous iteration.

If the Depth_Limit does not exceed the maximum depth limit, the process transitions to 2912 to generate legal paths between the source and target geometries for the Depth_Limit incremented at 2916. Otherwise, the process determines (at 2920) whether it was able to record any solutions for the pair of pins selected at 2904.

If the process determines (at 2920) that it was not able to record solutions for the selected pair of pins, it returns (at 2922) its failure to find routes for the net, and then ends. Otherwise, the process determines (at 2924) whether it has examined the last pin-pair identified at 2902. If not, the process transitions back to 2904 to select the next pin-pair.

On the other hand, if the process determines that it has examined all the pin-pairs, the process (at 2932) identifies up to K cheapest routes for the net, and records the costs of these routes. When the net has more than two pins in the sub-region, the process 2900 generates more than one set of paths for more than one set of pin-pairs. In such a situation, the process has to generate (at 2932) the K-cheapest combination of paths for the different pin-pairs to generate the K-cheapest routes. When the net has three pins in the sub-region and the process has identified two sets of paths for two pin-pairs, the process selects (at 2932) the cheapest combination of paths from the two sets. On the other hand, when the net has more than three pins in the sub-region and the process has identified more than two sets of paths for more than two pin-pairs, the process (1) initially computes the minimum spanning tree ("MST") for the net pins, and (2) selects the cheapest combination of paths for the pin-pairs that are the endpoints of the MST's edges.

After 2932, the process inserts (at 2934) any applicable Steiner nodes in the generated routes. In some embodiments, the process does this by passing through the edges intersected by each generated route to determine whether any two consecutive edge items are for the same route. Two such edge items are illustrated in FIG. 30A. When the process identifies two such edge items, it removes one of the edge items and in its place inserts a face item as a Steiner node for merging the two paths as shown in FIG. 30B.

After 2934, the process ends.

d. Path Generation

Figure 31A:
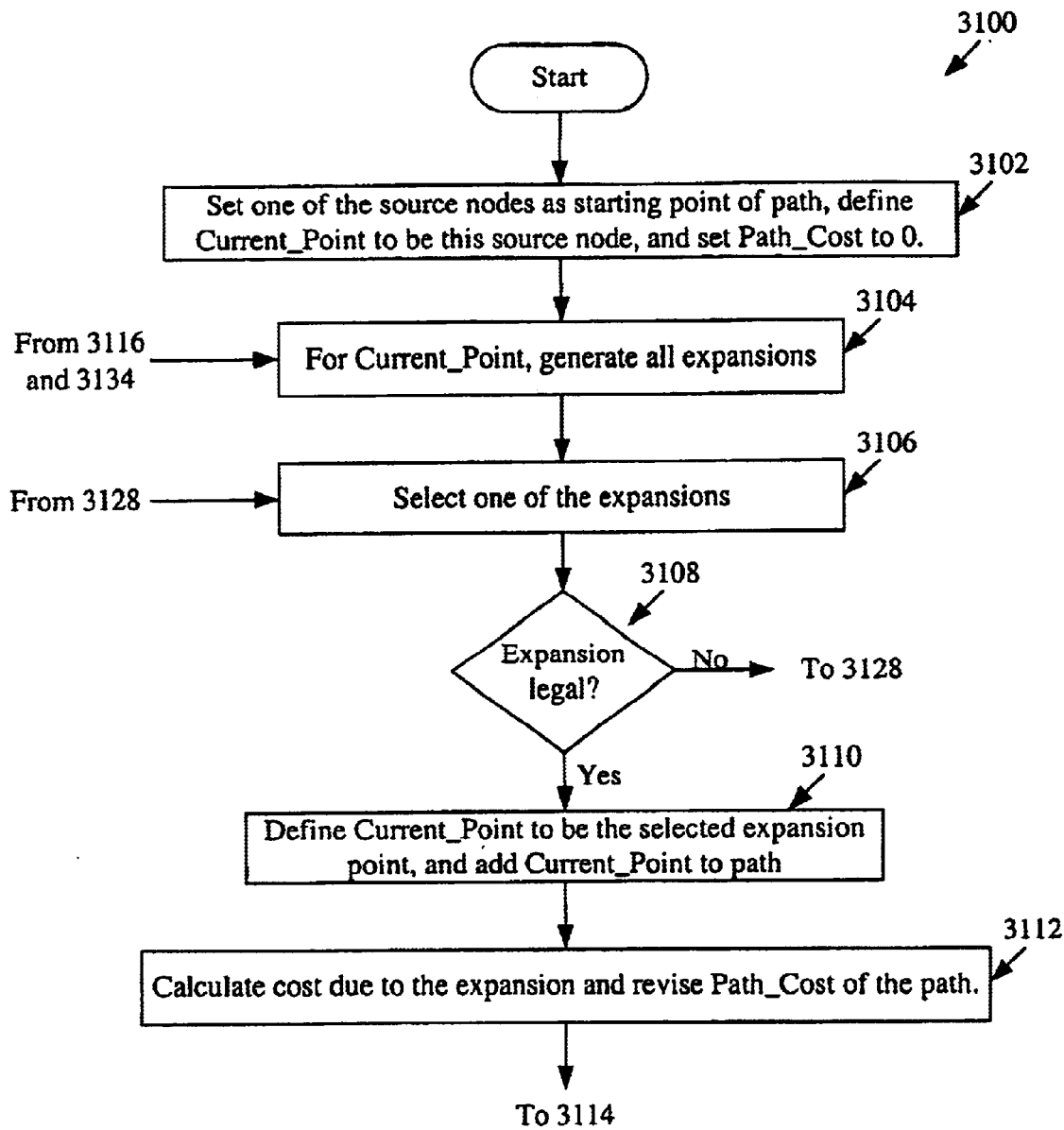
FIG. 31 illustrates a process for generating paths between one or more sources and one or more targets for a selected pin-pair.
Figure 31B:
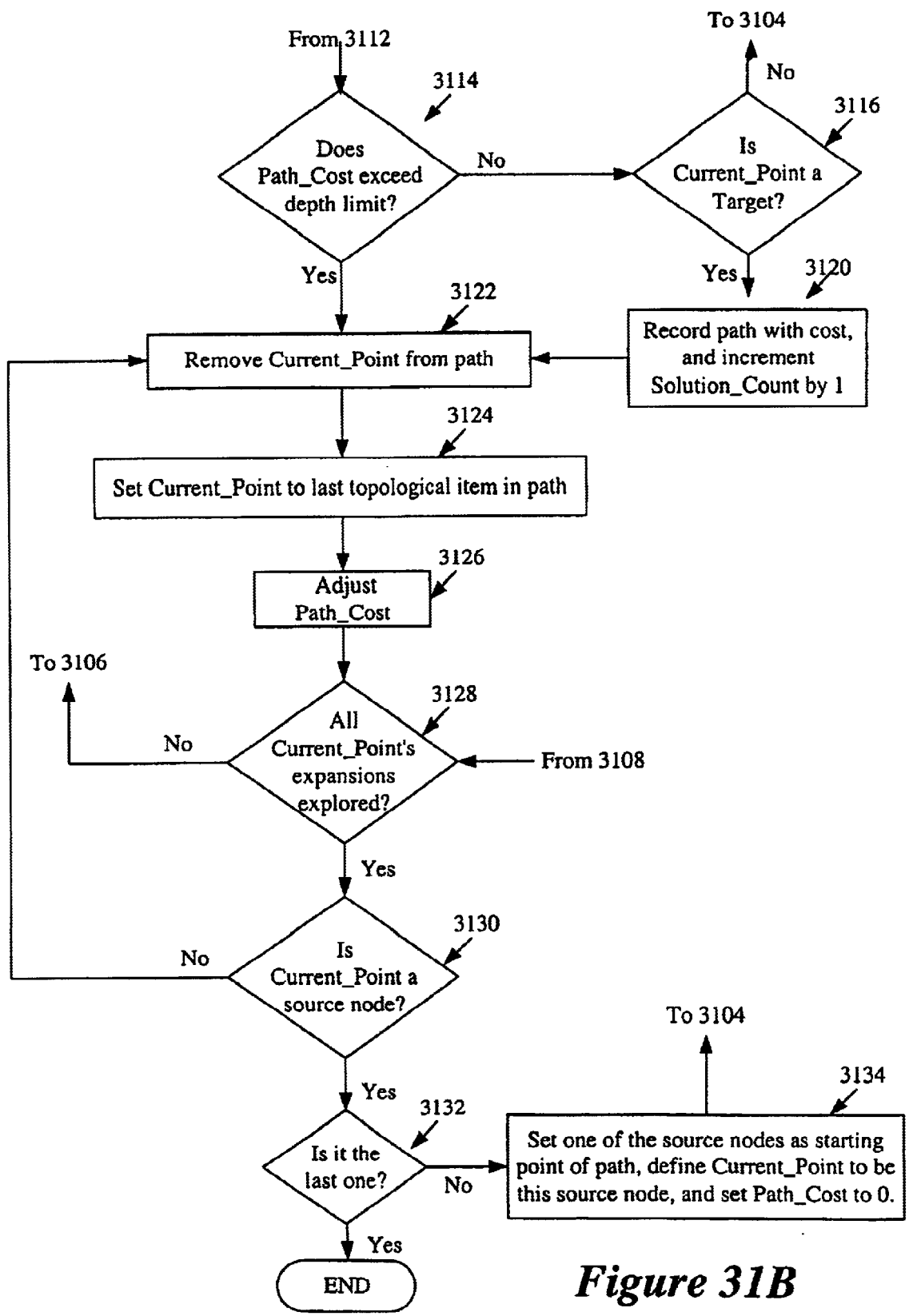

FIG. 31 illustrates a process 3100 for generating (at 2912) paths between one or more sources and one or more targets for a selected pin-pair. As shown in this figure, this process initially defines (at 3102) one of the source nodes as the starting point of a path. At 3102, the process also defines the starting point as the Current_Point, and sets the Path_Cost to 0.

The process then identifies (at 3104) all possible path expansions from the Current_Point. FIGS. 32–36 illustrate the possible expansions from edge items, nodes, and face items. FIG. 32 illustrates that an edge item can expand (1) towards the opposing edges of its face, (2) towards its face's node that is not on its edge, and (3) towards its face's face item.

FIG. 33 illustrates that a node can expand (1) towards the opposing edges of two faces that abut the node, (2) towards the other nodes of these two faces, (3) towards face items of these two faces, and (4) towards one or more nodes and face items above or below it. A node can via up or down to more than one node or face item, when more than one triangulated graph is above or below the node. Some embodiments explore each potential via expansion possibility of a node.

FIG. 34 illustrates that a face item can expand towards the three nodes and edges of its face. Some embodiments do not allow a planar expansion from a face item (i.e., an expansion to an item in the same face as the face item) when the face item was reached through a planar expansion. In other words, these embodiments only allow a via expansion from a face item, when the face item was reached through a planar expansion. Like via-path expansion from a node, a path can via up or down from a face item. Some embodiments do not allow a via expansion in a particular direction (e.g., down) from a face item, when the face item was reached in a direction opposite to the particular direction (e.g., up).

Figure 35:
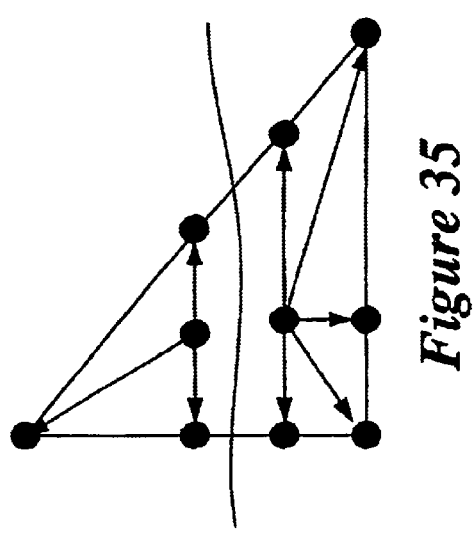
Figure 36:
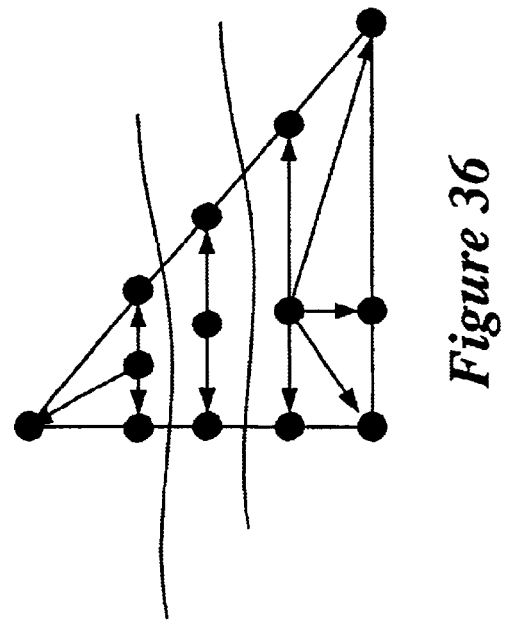

Also, like a node, a face item can via up or down to more than one node or face item above or below it, since more than one face of the above/below triangulated graph can be above or below the face item. As with a node, some embodiments explore each potential via expansion possibility of a face item. Also, as illustrated in FIGS. 35 and 36, when the face item serves as the destination of a via from another layer, the face item has more expansion possibilities if topological routes intersect its face. For instance, in FIG. 35, one net runs through the destination face item's face, and the face item has eight expansion possibilities, with five of them being on one side of the router and the other three being on the other side of the route. In FIG. 36, two nets run through the destination face item's face, and the face item has ten expansion possibilities.

When it is time to expand from a destination face item, some of the expansion possibilities might be quickly eliminated if there is no space for the via to be located in a region that gives rise to the expansion possibilities. For instance, in FIG. 36, the only viable via location might be in the region between the two crossing routes. In such a circumstance, the three and five expansion possibilities on the other sides of these route will not be explored.

After identifying the expansions from the Current_Point at 3104, the process selects (at 3106) one of the expansions identified at 3104. The process then determines (at 3108) whether this expansion is legal. The legality check will be further described in sub-section III.C.4.e below.

If the process determines (at 3108) that the expansion is not legal, the process transitions to 3128, which will be described below. On the other hand, if the expansion is legal, the process (at 3110) defines the Current_Point to be the selected expansion point, and adds this new Current_Point to the path. Next, the process calculates (at 3112) the cost due to the expansion, and adds this calculates cost to the Path_Cost. In some embodiments, the process computes the cost of each legal expansion (which when amalgamated for complete routes define the cost of the resulting routes) by using a shortest-path approach. Such an approach is disclosed in "Geodesic Path Inside Polygons," by Simon Mak and Sung Soo Kang, which can be found at www.cs.mcgill.ca/~skang5/cs507/welcom.htm. Essentially, this approach can be used to compute the shortest path within a polygon defined by the sequence of edges intersected by the route. As this approach simply computes the shortest distance, it does not disfavor or penalize any potential wiring directions for one preferred direction. It should be noted that some embodiments compute this shortest distance based on the routing directions of their wiring model. For instance, some embodiments that expand a route on an octilinear layer calculate the cost of an expansion as the shortest distance that can be traversed by only using horizontal, vertical, and ±45° interconnect lines.

After 3112, the process determines (at 3114) whether the Path_Cost exceeds the depth limit. If so, the process transitions to 3122, which will be described below. If not, the process determines (at 3116) whether the Current_Point is a target node. If it is not, the process transitions back to 3104 to generate all expansions for the Current_Point. However, if the Current_Point is a target node, the process (at 3120) records the path with its Path_Cost, and increments the Solution_Count by one. The process then transitions to 3122.

At 3122, the process removes that Current_Point from the path. It then defines (at 3124) the Current_Point to be the last topological item in the path. Next, the process subtracts (at 3126) from the Path_Cost the cost of the expansion that was removed at 3122. At 3128, the process determines whether it has examined all the expansions of the Current_Point. If not, the process returns to 3106 to select another expansion. If so, the process determines (at 3130) whether the Current_Point is a source node.

If the Current_Point is not a source node, the process transitions to 3122 to remove it from the path. However, if the Current_Point is a source node, the process determines (at 3132) whether there are any other source nodes that it has not yet examined. The process ends when it has examined all the source nodes. On the other hand, if there are one or more such nodes, the process (at 3134) defines one of such nodes as the starting point of a path, defines the starting point as the Current_Point, and sets the Path_Cost to 0. The process then transitions to 3104 to generate all expansions from this Current_Point.

e. Legality Check

Figure 37:
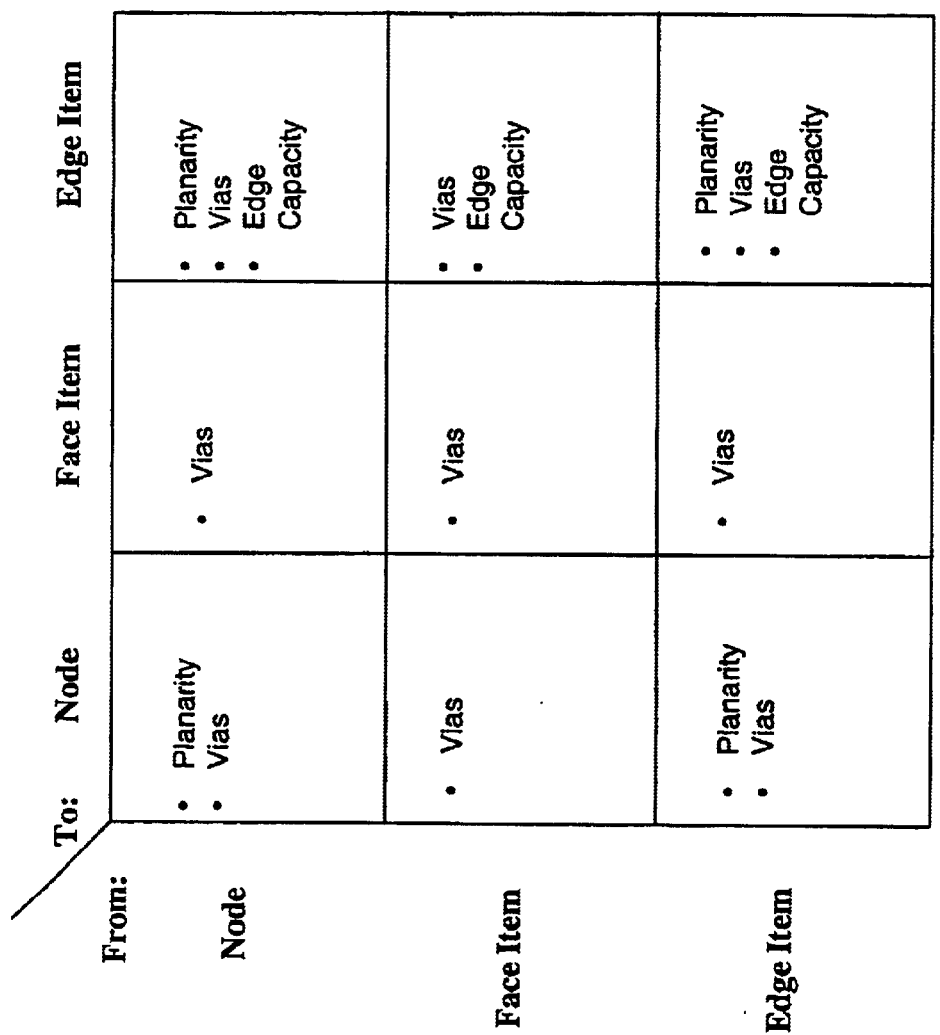
FIG. 37 illustrates three types of legality checking.

For some embodiments, FIG. 37 provides a table that illustrates the types of legality checks performed for different combination of expansions. The vertical axis lists the starting points of the expansion, and the horizontal axis lists the destination points of the expansion. As shown in FIG. 37, the are three types of legality checking. These are: planarity, via checking, and edge capacity.

(1) Edge Capacity Check

Figure 38A:
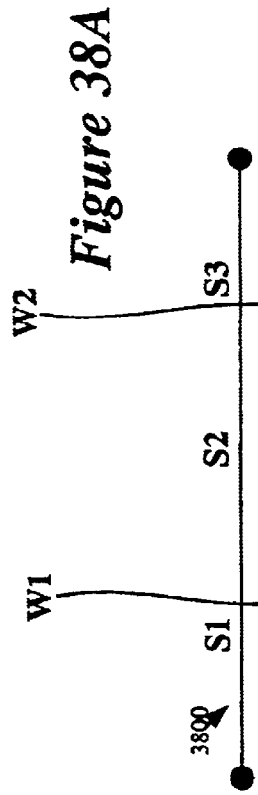
FIGS. 38A and 38B illustrate how to compute the flow of an edge after a potential expansion.
Figure 38B:
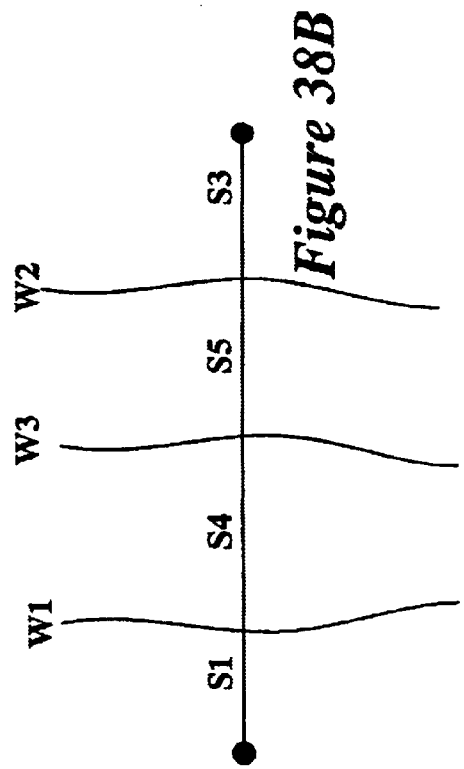

The edge capacity check is performed each time a path tries to intersect an edge. This legality check requires that the flow across the destination edge after the potential move not exceed this edge's capacity. FIGS. 38A and 38B illustrate how to compute the flow of an edge after a potential expansion. Specifically, FIG. 38A illustrates the center-lines of routes for two nets that were previously inserted across an edge 3800. The two routes have widths W1 and W2, and spacing S1 and S2 respectively towards their adjacent edge nodes. Also, the spacing between the two routes is defined as S2.

FIG. 38B illustrates how the edge 3800 would look like after a third route is inserted across it. The flow of this edge equals the sum of the following: (1) the minimum spacing S1 between net 1 and its adjacent node, (2) the width W1 of net 1, (3) the minimum spacing S4 between nets 1 and 3, (4) the width W3 of net 3, (5) the minimum spacing S5 between nets 3 and net 2, (6) the width W2 of net 2, (7) the minimum spacing S3 between net 3 and its adjacent node. This flow must be less than the capacity of edge 3800, in order for the expansion of net 3 to an edge item on edge 3800 to be legal.

(2) Via Legality Check

Figure 39B:
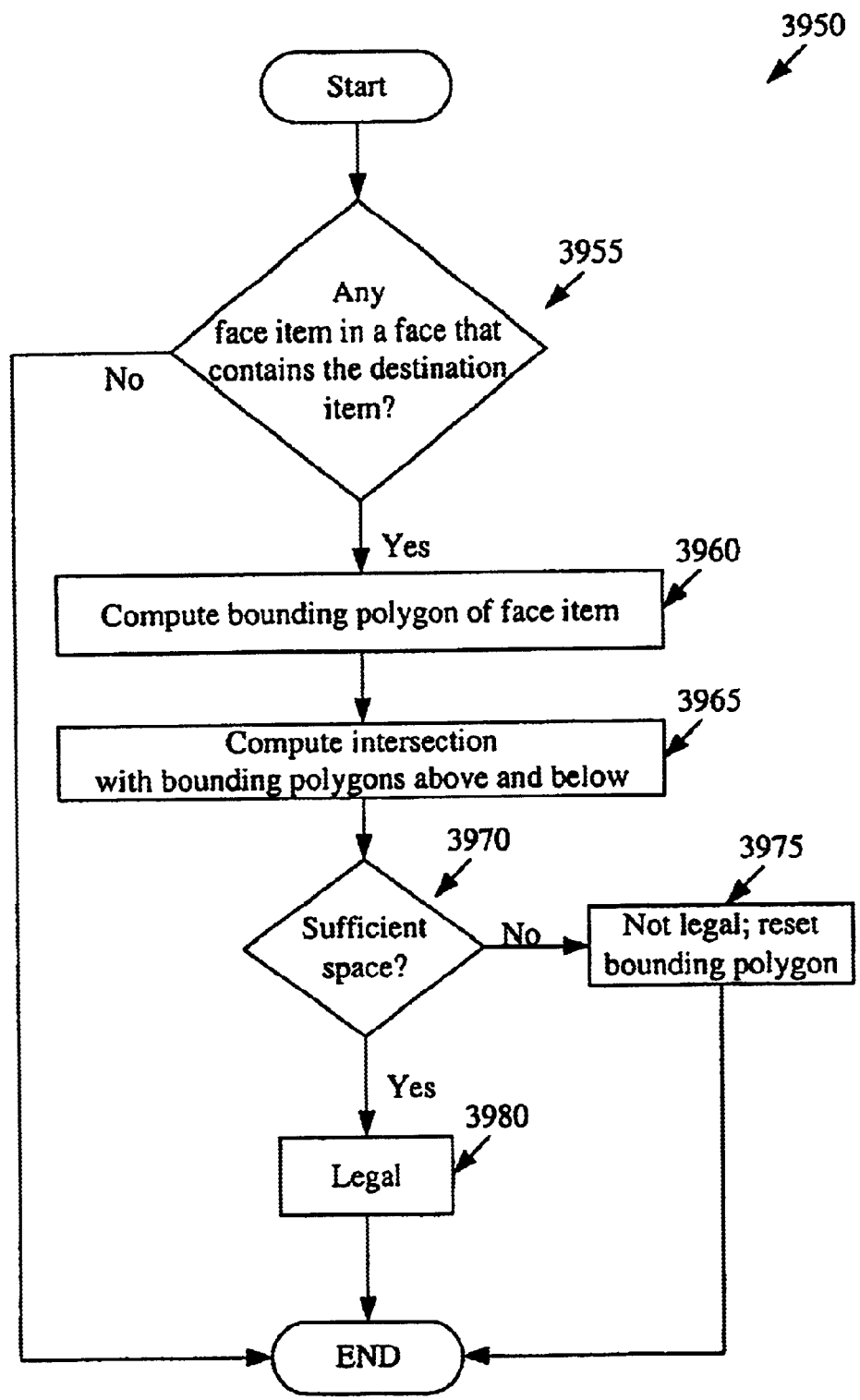

As indicated in FIG. 37, the via check is performed for each possible expansion. Different embodiments of the invention perform the via-checking operation differently. FIGS. 39A and 39B illustrate two different processes for performing this checking operation.

Optimization Technique

FIG. 39A illustrates a process 3900 that uses an optimization technique to perform the via-checking operation. The process 3900 initially determines (at 3905) whether the expansion face has a face item within it. A path expansion can be between source and destination items on the same layer (i.e., can be a planar expansion) or it can be between source and destination items on different layers (i.e., can be a via expansion). In the embodiments described below, an expansion face (1) is the face that contains both the source and destination items in a planar expansion, and (2) is the face that contains a face-item destination in a via expansion.

In the embodiments described below, there is no expansion face when a node is the destination of a via expansion. The process 3900 does not specify an expansion face for a via expansion to a node in order to improve run-time efficiency. Otherwise, the process 3900 would have to examine every face that is connected to the via-destination node. Similarly, an expansion face for a planar expansion is defined as the face that contains both the source and destination items, in order to reduce the number of faces that are examined and thereby improve run-time efficiency.

However, some embodiments could examine each face that contains a path-expansion's destination item, as this approach has several advantages. For instance, such a check would allow the router to detect an illegal via-path expansion when the router imposes a larger minimum-spacing requirement for a destination node that serves as a via than for a destination node that does not.

If the expansion is a via expansion to a node, there is no face to check at 3905, and the process 3900 thereby terminates. Similarly, if the expansion is a planar expansion to an item in an expansion face without a face item, then there is no via check necessary and the process ends.

On the other hand, if the identified expansion is to a face item or, in a planar expansion, to a node or edge item in an expansion face with a face item, the process 3900 identifies (at 3910) constraints for each face item in each face involved with the path expansion. For a via expansion, a face is involved with a path expansion if it includes an item that forms the via. For a planar expansion, the expansion face is the face involved with the path expansion.

For a face item in a face involved with a path expansion, the constraints include constraining points and minimum required distance to each constraining point. If the face item is moveable, the face item's set of constraints also specifies a legal x,y region that can contain the face item. Some embodiments allow each face to have up to two face items. When a face item is within a face that contains another face item, the process 3900 identifies a repulsion constraint that specifies the minimum required distance between the two face items.

FIGS. 70–82 present several examples that illustrate the type of constraints identified by the process 3900.

Constraints for a Single Face Item.

FIG. 70 illustrates a potential face item F1 in a face 7000 on a particular layer. This face 7000 has nodes N1–N3 and edges E1–E3, and it is intersected by four nets a, b, c, and d. The potential face item F1 is a potential expansion of net d in the face 7000. For the face item F1, the process 3900 would identify edge and node constraints for the layer on which this face item exists.

In the embodiments described below, the edge and node constraints of a face item are the minimum required distances from the face item to the edges and nodes of the face that contains the face item. Specifically, for the face item, the constraint with respect to each node represents the required width and spacing of the minimum set of topological items (if any) that separate the face item from the node. For the face item, the constraint with respect to each edge is the required width and spacing of the minimum set of topological items (if any) that topologically separate the face item from the edge. One manner of computing edge and node constraints is further described below.

FIG. 71 illustrates the edge and node constraints for the potential face item F1. In this example, as well as the other examples illustrated in FIGS. 72–81, the acronyms can be understood as follows: (1) Wx signifies width of a route of a net x, (2) SNY-x signifies minimum required spacing between node Y and an adjacent net route x, (3) Sx-z signifies minimum required spacing between adjacent routes for nets x and z, (4) SFQ-x signifies minimum required spacing between face item FQ and adjacent net route x, and (5) SFQ-NY signifies minimum required spacing between node Y and adjacent face item FQ.

As shown in FIG. 71, the face item F1's edge constraints for edges E1 and E3 are null, while its edge constraints for edge E2 is Wb+SF1-$b$. Also, this face item's (1) node constraint for node N1 is SF1–N1, (2) node constraint for node N2 is Wb+SF1-$b$+Wc+SN2-$c$+Sc-b, and (3) node constraint for node N3 is Wa+SN3-$a$ +SF1-$a$.

The process 3900 would identify the nodes N1–N3 of the face 7000 as the set of constraining points for the face item F1. This process would also identify each node's constraint as the minimum required distance to the constraining point corresponding to the node. FIG. 72 illustrates nodes N1–N3 as constraining points of the face item F1. This figure also illustrates the minimum required distance to each of the points N1–N3 as a circular arc that has at its center one of the nodes N1–N3 and has as its radius the node's corresponding node constraint.

The process 3900 would also identify a legal region that can contain the face item F1 from this face item's edge constraints. This legal region can be obtained by bringing each edge of the face 7000 towards its center in the direction of the edge's normal by the amount of the edge's constraint. In the example illustrated in FIGS. 70 and 71, the constraints for two edges E1 and E3 are 0, and the constraint for the edge E2 is Wb+SF1-$b$. Accordingly, as illustrated in FIG. 72, the face item F1's legal region 7200 can be obtained by bringing edge E2 towards the center of the face 7000 in the direction of its normal by the amount Wb+SF1-$b$, and leaving the other two edges E1 and E3 unadjusted. This legal region is a triangle defined by nodes N1', N2', and N3. As further described below, an optimizer can search through the legal region 7200 to identify the optimal position for the face item F1.

Each time the process 3900 first identifies the constraining points, distances, and/or legal region for a face item, it stores these values in the face items data structure. Also, each time the process makes a routing operation that changes the constraining distances and/or legal region of the face item, it modifies the stored values in the face item's data structure. Storing these parameters in the face item data structures speeds up the operation of the router in the instances where it can simply retrieve these values from the data structures.

Constraints for Two Face Items in the Same Face and Two Face Items Forming a Via.

FIG. 73 illustrates an example identical to the example illustrated in FIG. 70, except that the face 7300 in FIG. 73 includes two face items. One face item is face item F1, which still represents the potential expansion of net d into face 7300. The other face item is a face item F2 that connects to (1) a face item F3 in a face 7400 (illustrated in FIG. 74) in a layer above the face 7300's layer, and (2) a face item F4 in a face 7500 (illustrated in FIG. 75) in a layer below the face 7300's layer.

The process 3900 would compute node and edge constraints for face items F1 and F2. Also, based on these constraints, the process would identify (1) sets of constraining points and distances, and (2) a legal region for each face item. The process would also identify a repulsion constraint that specifies the minimum spacing between the two face items.

Figure 76:
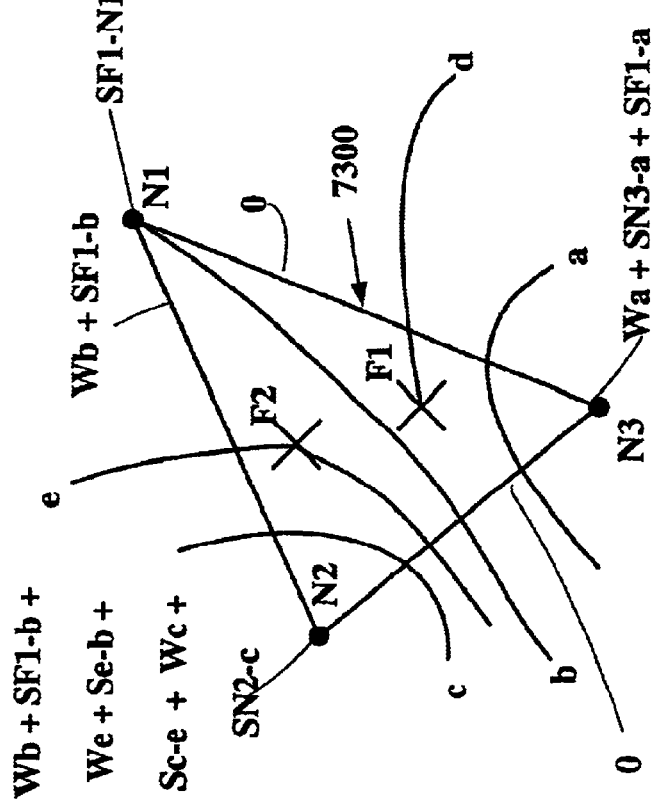

For the example illustrated in FIG. 73, the node and edge constraints for the face item F1 are identical to the constraints shown for this face item in the example illustrated in FIG. 70. In other words, the face item F2 does not affect the node and edge constraints of the face item F1. If the face item F2 connected to more than one edge of the face 7300, then it would affect the face item F1's constraint for node N2. FIG. 76 illustrates one such example. As shown in this figure, the connection of the face item F2 to edges E2 and E3 changes face item F1's constraint for node N2. After identifying the node and edge constraints for the face item F1, the process would identify the legal region that can contain this face item. As before, this legal region is the region 7200 illustrated in FIG. 72.

FIG. 73 illustrates node and edge constraints for the face item F2 with respect to the nodes and edges of the face 7300. Like the constraints for the face item F1, the route connected to the face item F1 does not affect the edge and node constraints for the face item F2. These constraints would have been affected if the face item F1 connected to more than one edge of the face 7300.

The face item F2 forms a via with the face items F3 and F4 in the layers above and below. The constraints on all three face items F2, F3 and F4 constrain the location of this via. Accordingly, the process 3900 would identify node and edge constraints for face items F3 and F4 with respect to the nodes and edges of the faces that contain them. These constraints are illustrated in FIGS. 74 and 75.

For the via formed by these three face items, the process 3900 then would identify a legal region in each face 7300, 7400, and 7500. The legal region in each of these faces is obtained by moving each edge of the face towards the face's center by the amount of the edge's constraint. As the constraints of all the edges in faces 7400 and 7500 are null, the legal region for the face item F3 is the entire face 7400 and the legal region for the face item F4 is the entire face 7500. The legal region for the face item F2, however, is different than the face containing this face item. FIG. 77 illustrates this legal region 7700, which is obtained by moving edge E1 towards the center of face 7300 by the amount of its constraint Wb+SF2-$b$.

Figure 78:
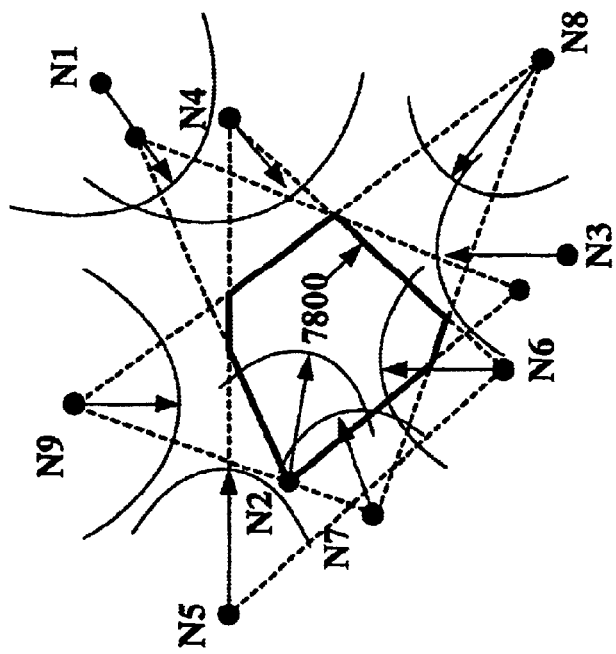

Based on the identified legal region and node constraints for each face traversed by the via that F2, F3, and F4 form, the process would specify a combined legal region and set of constraining points and distances for this via. The process would generate the combined region by intersecting the legal regions identified for face items F2, F3, and F4. FIG. 78 illustrates this combined legal region 7800. The combined set of points and distances for this via are simply the union of the set of points and set of distances identified for the face items F2, F3, and F4. FIG. 78 illustrates the combined sets of points, which are nodes N1–N9, and the combined sets of distances for these nodes.

As mentioned above, the process 3900 would also identify a repulsion constraint that specifies the minimum required spacing between the face items F1 and F2. The required distance between two such face items is the sum of the width of each route between these face items plus the required minimum spacing between the route(s) and face items. In this example, the required distance between face items F1 and F2 is equal to SF1-$b$+Wb+SF2-$b$ (i.e., is equal to the sum of the required spacing between F1 and net b, the width of net b, and the required spacing between F2 and net b).

As mentioned above, some embodiments allow a face to have at most two face items. These embodiments limit the number of face items to improve run-time efficiency. Other embodiments, however, might allow a face to have more than two face items. These embodiments would identify node, edge, and region constraints similarly to the examples described above. They would also analogously identify repulsion constraints between face items in a face except that, in a face with three or more face items, the required constraint between two face items would be the sum of the width of each route and/or face item between these two face items plus the required minimum spacing between the route(s) and face items.

Figure 80:
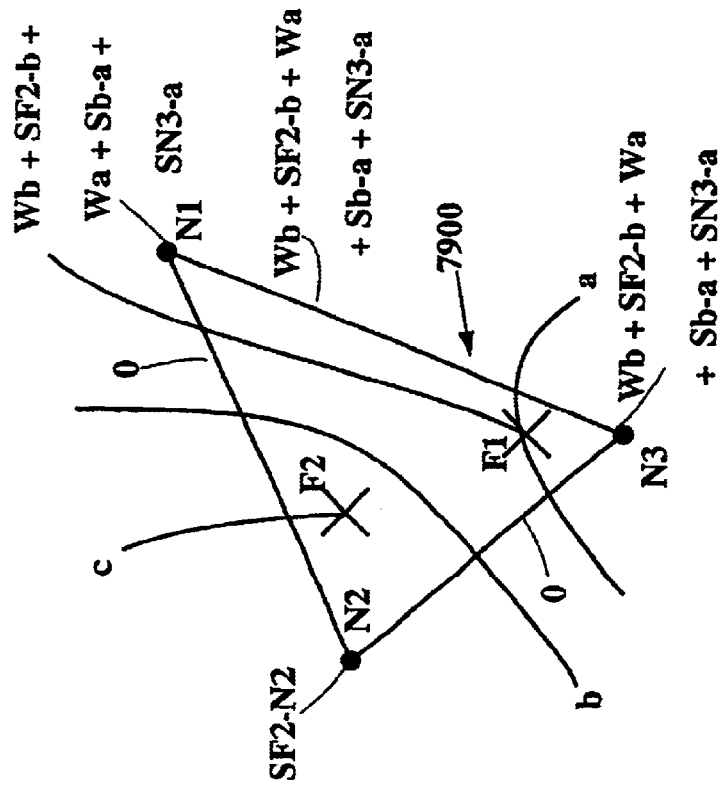
Figure 79:
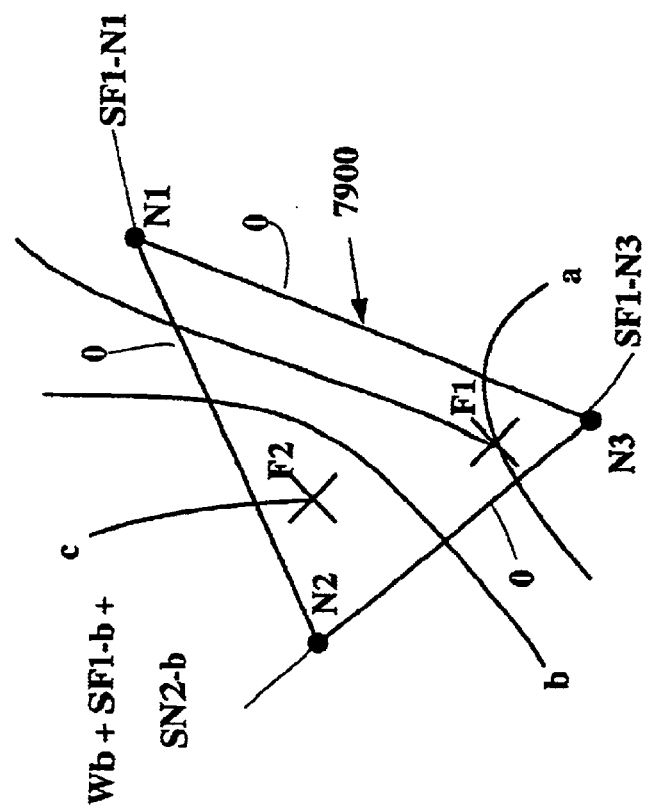

A face could also include a face item that is a Steiner point. FIG. 79 illustrates a face 7900 that is intersected by the routes of nets a, b, and c. This face includes two face items F1 and F2. Face item F1 is a Steiner point for a route of a net a, while face item F2 is a potential expansion of the route c into the face 7900. FIG. 79 illustrates the node and edge constraints for the face item F1, while FIG. 80 illustrates the node and edge constraints for the face item F2.

Constraints for Face Item that Connects to a Node in a Different Layer.

The process 3900 treats all vias that start or end with a node as fixed vias. This is the case even for the via nodes that are moveable by the routability engine, which is further described below. In other words, as far as the process 3900 is concerned, vias that start or end with nodes are fixed entities.

Accordingly, when a via starts or ends with a node, the process 3900 does not specify node and edge constraints for the node in the face that contains the node. However, if the node forms a via by connecting to a face item above or below it, the process 3900 identifies constraining points and distances for the connected face item. The constraining points for such a face item are the nodes of the face containing the face item. The constraining distance to each node of the face is its node constraint.

Figure 81:
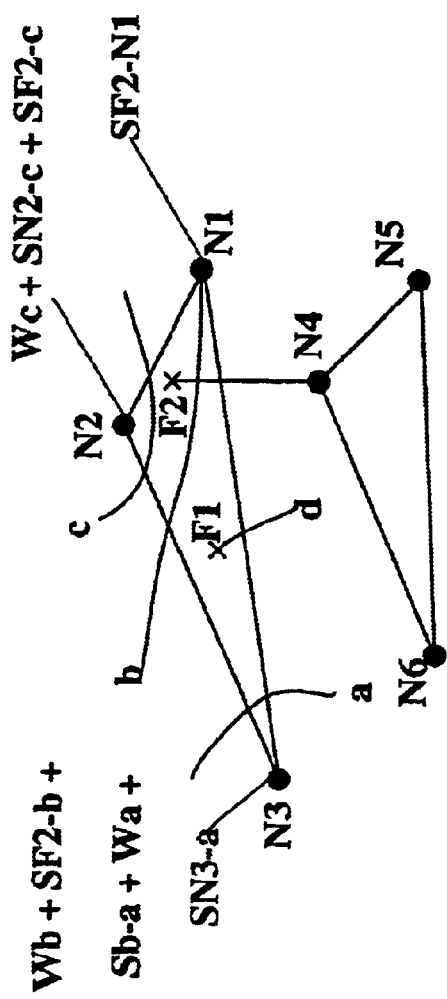

FIG. 81 illustrates an example of a via formed between a node N4 and a face item F2 that are on two different layers. The constraining points for the face item F2 are the nodes N1, N2, and N3. The constraining distance to each node N1, N2, or N3 is a node constraint for the face item F2 and the node. As illustrated in FIG. 81, the face item F2's (1) distance constraint for node N1 is SF2–N1, (2) distance constraint for node N2 is Wc+SF2-$c$+SN2-$c$, and (3) distance constraint for node N3 is Wb+SF2-$b$+SN3-$a$ +Sb-a +Wa.

Constraints for Face Items in Faces Connected by Vias to Faces Involved with an Expansion.

Figure 82:
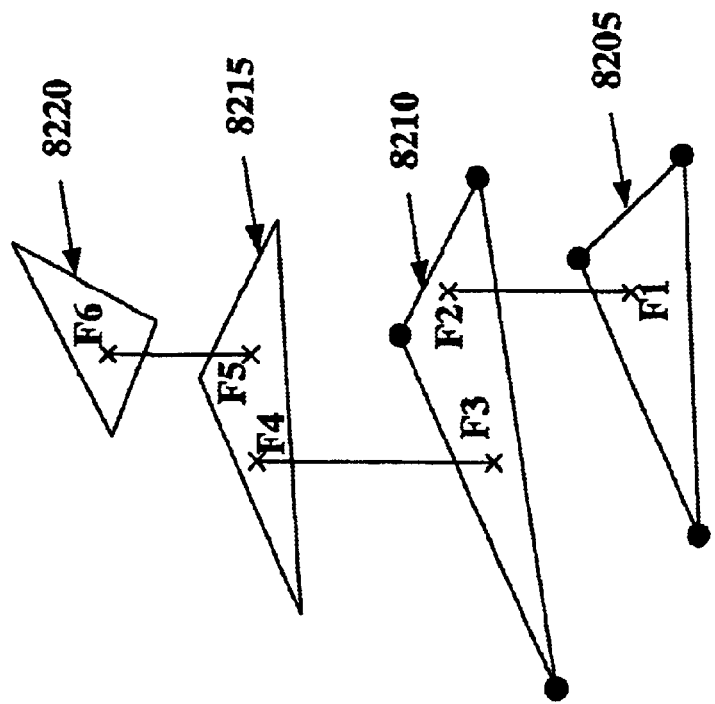

A face item might exist on a face that connects through a via to a face involved with an expansion. FIG. 82 illustrates an example of such a face item. This figure illustrates a potential expansion between face items F1 and F2. The faces involved with this expansion are faces 8205 and 8210. Accordingly, the process 8200 would identify constraining points and distances for the face-item pair F1 and F2 and the face-item pair F3 and F4 on the faces 8205 and 8210. The process would also identify repulsion constraint specifying the minimum required distance between face items F2 and F3.

The face 8215 is a face that is not involved with the expansion but connects to face 8210 (which is involved with the expansion) through the via formed by face items F3 and F4. The process 3900 would treat face item F5 in face 8215 as a fixed face item. For the face item F4, it would compute a repulsion constraint that specifies the minimum required distance between the face items F4 and F5.

Identifying Node and Edge Constraints.

In some embodiments, the process 3900 modifies (at 3910) the node and edge constraints for a face item in the following manner. The process traverses in a particular direction (e.g., counterclockwise) the edges of the face-item's face starting at the edge item on the edge connected to the face item. During its traversal of the edges, the process identifies the minimum required distance to the starting edge item for different points along its traversal.

In some embodiments, the process uses a stack to keep track of the minimum required distances as it traverses the edges. In traversing the edges, the process might encounter routes for three types of other nets. The first type does not connect to a face item within the face. The second type connects to a face item with a degree greater than one (i.e., connects to a face item that connects to more than one topological item on the face boundary). The third type connects to a face item with a degree one (ie., connects to a face item that only connects to one topological item on the face boundary)

The process adds to the stack the required width plus spacing distances of the encountered routes for the first- and second-type nets when it encounters these routes for the first time while traversing the identified face's edges. The process removes from the stack the distances of each such route when it encounters the route for the last time while traversing the identified face's edges. When the process encounters a route for a third-type net while traversing the identified face's edges, the process does not add any space and width distance to the stack.

Additionally, when the process encounters either a second- or third-type route while traversing the edges, the process identifies and stores the required repulsion distance between the face item that it is currently examining and the face item that is connected to the encountered second- or third-type route.

The process 3900 sets the constraint for a node when it reaches the node while traversing the boundary of the identified face. The constraint for a node that does not connect to any route is the current value at the top of the stack plus the minimum required distance between the last edge item encountered and the node.

Identifying the constraint for a node that connects to a route is slightly more involved. When the process encounters such a node, it determines whether it is the last time that it will encounter the route connected to the node before completing its loop traversal about the identified faces edges.

If so, this node constraint is (1) the value on the stack after the removal from the stack of the spacing and width distances of net route that connects to the node, plus (2) the minimum required distance between the last edge item encountered and the node. If not, this node constraint is (1) the value on the stack before the addition to the stack of the spacing and width distances of net route that connects to the node plus (2) the minimum required distance between the last edge item encountered and the node.

Each time the process 3900 reaches a node, it also sets the constraint for the edge that it was just traversing to reach that node. This edge constraint is the smallest value that appeared at the top of the stack since the last node.

After identifying constraints at 3910, the process 3900 determines (at 3915) whether it needs to run an optimization process to identify the location of any face item within a face that is involved with the path expansion. The process needs to run an optimization process when at least one non-via face item, or at least one set of via face items, for which it generated a constraint is moveable within a legal region that is larger than a threshold amount.

If the process determines (at 3915) that it does not need to use the optimization process, it determines (at 3920) whether it identified at 3910 a legal region that was smaller than the threshold amount. If so, the process transitions to 3940, which is further described below. If not, the process transitions to 3935. For each face item that the process identified a set of constraints at 3910, the process determines (at 3935) whether the face item satisfies its set of constraints. If the process determines (at 3935) that all constraints are not met, it specifies (at 3940) the expansion as illegal, and then ends. On the other hand, if the process determines (at 3935) that all constraints are met, it specifies (at 3945) the expansion as legal, and then ends.

If the process determines (at 3915) that for at least one face item it has defined a region in which the face item can move, the process formulates (at 3925) a function to optimize. This function can include one or more sub-functions in some embodiments. Several different types of sub-functions are described below.

Sub-function for Non-Via Face Item in a Face Affected by an Expansion.

For each non-via face item in a face involved with the expansion, the process 3900 specifies one sub-function based on the point and distance constraints that it identified (at 3910) for the face item. The sub-function takes the form of:

$$f = \sum_{p=1}^{P} \frac{r_p}{d_p}, \quad (1)$$

where p is a variable that represents a point in the set of constraining points for the face item, P is the final point in the set, $d_p$ represents the distance from a variable x,y location of the face item to the current point p, and $r_p$ represents the identified minimum constraining distance to the point p. This sub-function varies with the x,y location of the face item in the region identified for it at 3910. Region 7200 of FIG. 72 is an example of such a region for a non-via face item in a face affected by the expansion. As further described below, the optimizer searches through this region and specifies an x,y location of the face item.

Sub-Function for Via-Forming Face Item in a Face Affected by an Expansion.

For a face item that forms a via with a node (i.e., a face item that has a fixed position for the process 3900), the process 3900 identifies a sub-function that has the same form:

$$f = \sum_{p=1}^{P} \frac{r_p}{d_p}, \quad (2)$$

where p is a variable that represents a point in the set of constraining points for the face item, P is the final point in the set, $d_p$ represents the distance from the fixed x,y location of the face item to the current point p, and $r_p$ represents the identified minimum constraining distance to the point p. This sub-function is a constant because its x,y location is fixed, and so is its distance $d_p$ from each of its constraining points. Face item F2 of FIG. 81 is an example of such a fixed face item. When a via is formed by first and second face items in first and second layers and a node in a third layer, the sub-function is similar to the one described above, except that the set of constraining points and distances include points and distances that constrain both face items.

For a set of face items that form a moveable via, the sub-function again has the form:

$$f = \sum_{p=1}^{P} \frac{r_p}{d_p}. \quad (3)$$

In this equation, p is a variable that represents a point in the set of constraining points for all the face items, P is the final point in the set, and $r_p$ represents the identified minimum constraining distance to the point p. In this sub-function, $d_p$ represents the distance from the x,y location of the current point p to a variable x,y location of the via (i.e., of the set of face items) within its region, which is an intersection of the legal region of each of the via's face items. Region 7800 of FIG. 78 is an example of such a region for a via that is formed by the face items F2, F3, and F4 of faces 7300, 7400, and 7500 of FIGS. 73, 74, and 75. As further described below, the optimizer searches through this region 7800 and specifies an x,y location for the via formed by the face items F2, F3, and F4.

Sub-Function for Two Face Items in the Same Face.

When a face examined by the process 3900 includes two face items, the process specifies a sub-function for expressing the repulsion constraint between the two face items. This sub-function $f_{1,2}$ is as follows, $$f_{1,2} = \frac{r_{1\ to\ 2}}{d_{1\ to\ 2}}, \quad (4)$$

where $d_{1to2}$ represents the distance from the x,y location of face item 1 to the x,y location of face item 2, and $r_{1to2}$ represents the identified minimum required distance between the two face items.

When both face items are moveable, the x,y location for both face items can vary within regions defined for them. For the two face items F2 and F3 illustrated in FIG. 82, Equation (4) above can be used to specify a sub-function $f_{2,3}$. In this example, the face item F2 can be at any x,y location within the region that is obtained by intersecting the legal region for face items F1 and F2, while the face item F3 can be at any x,y location within the region that is obtained by intersecting the legal region for face items F3 and F4. Also, in this example, $r_{2to3}$ represents the identified minimum required distance between face items F2 and F3.

In Equation (4), a face item's x,y location is fixed when it forms a via with a node. For example, for the two face items F1 and F2 illustrated in FIG. 81, Equation (4) above can be used to specify a sub-function $f_{1,2}$. In this example, the face item F1 can be at any x,y location within its legal region, while the face item F2 has a fixed x,y location defined as the x,y location of node N4. In this example, $r_{1to2}$ represents the identified minimum required distance between face items F1 and F2.

In Equation (4), a face item's x,y location is also fixed when the face item is on a face that (1) is not involved with a path expansion but (2) connects through a via formed by another face item to a face that is involved with an expansion. For instance, face item F5 in FIG. 82 illustrates one such face item. This face item F5 is on a face 8215 that is not involved with the path expansion from F1 to F2 but connects to face RX10, which is involved with this path expansion. The process 3900 would use Equation (4) to specify a sub-function $f_{4,5}$, which expresses the repulsion constraint between face items F4 and F5. In this example, the face item F4 can be at any x,y location within the region that is the intersection of the legal region for face item F3 and F4, while the face item F5 has a fixed x,y location that is its previously-defined position. In this example, $r_{4to5}$ represents the identified minimum required distance between face items F4 and F5.

At 3925, the process 3900 formulates the cost function as a sum of all sub-functions that it specifies to express the location and repulsion constraints for the face items in the faces involved with the path expansion. For instance, the process specifies the following function for the example illustrated in FIG. 82.

$$f=f_1+f_3+f_{2,3}+f_{4,5}.$$

In this function, (1) $f_1$ is a sub-function according to Equation (3) for specifying a cost based on the location of the via formed by face items F1 and F2, (2) $f_3$ is a sub-function according to Equation (3) for specifying a cost based on the location of the via formed by face items F3 and F4, (3)$f_{2,3}$ is a sub-function according to Equation (4) for specifying a cost based on the repulsion between face items F2 and F3, and (4) $f_{4,5}$ is a sub-function according to Equation (4) for specifying a cost based on the repulsion between face items F4 and F5.

The function formulated at 3925 can be just one sub-function. For instance, the function is just the sub-function express by Equation (4) when the path expands to a non-via face item in a face with only one face item. This is the case for the example illustrated in FIG. 70. Also, the cost-function formulation approach described above works for the embodiments that allow more than two face items in a face. The cost function in these embodiments would typically have more sub-functions as there are more location and repulsion constraints to consider.

After formulating the cost function at 3925, the process 3900 (at 3930) has a minimizer search through the legal region of each moveable non-via face item or set of via-forming face items to identify an x,y location for each face item that minimizes the function. In some embodiments, the process 3900 uses the method of steepest descent for the minimization operation. This method is discussed in Numerical Recipes in C: The Art of Scientific Computing, by William Press, et al., Second Edition (1992).

After performing the minimization operation, the process 3900 determines (at 3935) whether the location identified for each face item satisfies the point, distance, and/or repulsion constraints identified for it. Specifically, the process determines whether each face item is away from each of its constraining points by at least the required minimum distance for that point. Also, if the face item is in a face with another face item, the process determines whether the face items are away from each other by at least their minimum required distance. If a face item does not satisfy its distance or repulsion constraint, then the process 3900 transitions to 3940 to specify as illegal the expansion that triggered the via check. Otherwise, the process specifies (at 3945) the expansion as legal.

(ii) Non-Optimization Technique

FIG. 39B illustrates a process 3950 that performs a simpler via-checking operation than the process 3900 of FIG. 39A. Some embodiments that use this process limit each face to have at most one face item. This process initially determines (at 3905) whether the face that contains the destination node, face item, or edge item has a face item within it. When the destination item is part of several faces, some embodiments execute the process 3950 for each face, and specify an expansion as illegal when the expansion fails the via-legality check for just one of these faces. On the other hand, like the process 3900 of FIG. 39A, other embodiments might not examine each face that contains the destination item, but rather might only examine the expansion face as defined above for 3905.

If the process 3950 determines (at 3955) that a face that contains the destination item does not contain a face item, the process ends as a via-check is unnecessary. Otherwise, the process computes (at 3960) the bounding polygon of the face item. Some embodiments compute this polygon by computing the closest point to each node on each edge of the face that the face item can be (i.e., the node, offset along the edge by the flow on that edge between the node and the face item).

Next, the process computes (at 3965) the intersection of the face item's bounding polygon with via destination (if any) in the layer above or below. The process then examines (at 3970) the size of the intersection to determine whether there is sufficient space for the face item. If the intersection is too small, then the process determines (at 3975) that the expansion is not legal, resets (if necessary) the face-item's bounding polygon to its original shape before 3960, and then ends. If the intersection is big enough for the face-item, the process indicates (at 3980) via-check legality, and then ends.

(3) Planarity Check

As indicated in FIG. 37, the planarity check is performed for four of the expansions. For the node to node expansion, the planarity check simply ensures that there is no route crossing the shared edge between two nodes. All other planarity checks are performed by traversing the linked list of edges from the source towards the destination node/edge, checking that no other net's route blocks a direct connection between the source and destination items of the path expansion.

f. Cheapest Path Calculation

Figure 40:
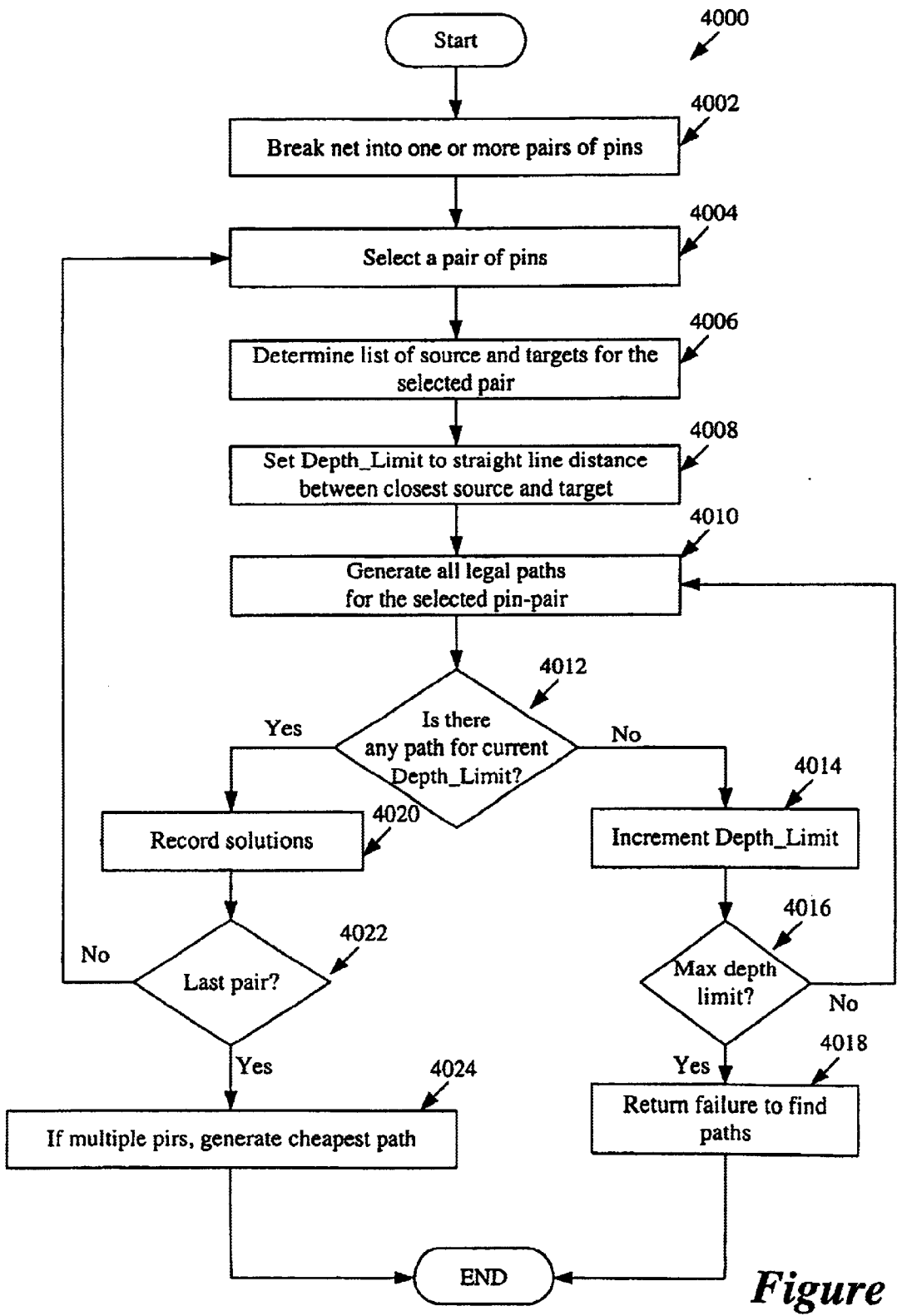
FIG. 40 illustrates a process for computing the cheapest-route cost for a net.

FIG. 40 illustrates a process for computing the cheapest-route cost for a net. As shown in FIG. 40, the process 4000 initially identifies (at 4002) one or more pairs of pins for the net. It then selects (at 4004) a pair of pins for the net. The process next identifies (at 4006) a list of source and target port-geometries for the selected pair of pins of the net.

The process then identifies (at 4008) a Depth_Limit for generating routing path between the source and target geometries. In the embodiments described below, the Depth_Limit is set to the shortest distance between the closest source and target geometries. After 4008, the process generates (at 4010) all legal paths between the source and target geometries identified at 4006. At 4010, the process 4000 can use a path-generating process similar to the one described above by reference to FIG. 31.

After 4010, the process determines (at 4012) whether it was able to generate (at 4010) any legal path between the source and target geometries. If not, the process increments (at 4014) the Depth_Limit. The process then determines whether the Depth_Limit exceeds a maximum depth limit. If so, the process indicates (at 4018) failure to route the net. Otherwise, the process transitions to 4010 to generate legal paths between the source and target geometries for the Depth_Limit incremented at 4014.

If the process determines (at 4012) that it was able to generate (at 4010) a legal path between the source and target geometries, the process records (at 4020) the generated path or paths and the cost for each path. The process then determines (at 4022) whether it has examined the last pin-pair identified at 4002. If not, the process transitions back to 4004 to select the next pin-pair.

On the other hand, if the process determines that it has examined all the pin-pairs, the process (at 4024) identifies the cheapest routes for the net, and records the costs of this route. When the net has more than two pins in the sub-region, the process 4000 generates more than one set of paths for more than one set of pin-pairs. In such a situation, the process has to identify (at 4024) the cheapest combination of paths for the different pin-pairs to generate the cheapest route. The process 4000 identifies the cheapest combination of paths in the same manner as described above for process 2900 at 2932. After 4032, the process ends.

D. Routability Checking

At 215, the process 200 determines whether the topological routes identified at 210 are geometrically routable (i.e., whether there exists a design-rule-correct geometric route for each identified topological route). If so, the detail-routing process embeds the generated topological routes at 220, which is further described below. If not, this process initially directs the topological router to generate additional topological routes that are more-likely to have design-rule-correct geometric routes. As mentioned above, if the topological router repeatedly fails to generate geometrically routable topological routes, the detail-routing process flags one or more nets as unroutable, re-defines topological routes for some or all the nets, and then transitions to 220 to embed the generated topological routes.

Figure 41:
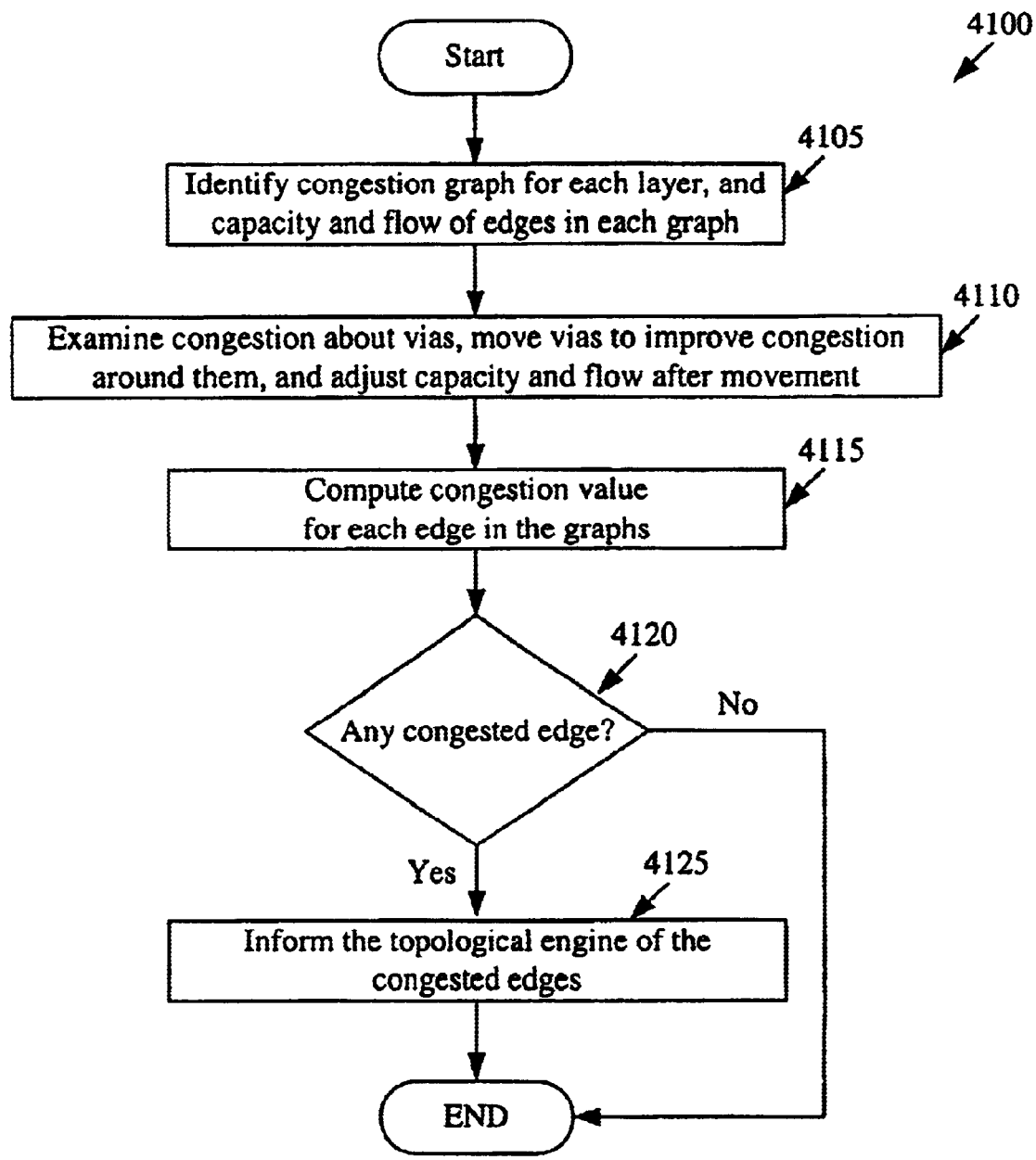
FIG. 41 conceptually illustrates a process performed by this routing engine in some embodiments of the invention.

In some embodiments, the routability checking is performed by a routability engine that initially reduces wiring congestion by moving vias, and then determines whether the identified topological routes are geometrically routable. FIG. 41 conceptually illustrates a process 4100 performed by this routing engine in some embodiments of the invention.

As shown in this figure, the routability process 4100 initially identifies (at 4105) a congestion graph for each layer of the IC sub-region being routed. Each graph includes a number of edges that are used to quantify the congestion in the IC sub-region. The routability process also determines (at 4105) the capacity and flow across each edge. Several manners of constructing congestion graphs and defining their edge capacity and flow are described below in Section III.D.1.

After identifying congestion graphs and determining the capacity and flow of edges in these graphs, the process 4100 tries (at 4110) to reduce congestion in the layout by examining the congestion about the moveable vias and moving some or all the moveable vias to improve congestion around them. One process for performing this will be described in Section III.D.2.

Next, the process 4100 computes (at 4115) a congestion value for each congestion edge in each congestion graph. The process then determines (at 4120) whether any of the congestion-graph edges are over congested. If not, the process ends. If so, the process directs (at 4125) the topological engine to revise some of the topological routes to alleviate the congestion of the identified overcongested routes, and then ends. The operations of 4115–4125 will be further described below in Section III.D.3.

I. Congestion Graphs.

a. Defining Congestion Graphs.

Different embodiments of the invention construct different congestion graphs to measure the congestion in the IC subregion being routed. For instance, some embodiments construct a visibility graph for each sub-region layer; while other embodiments generate for each layer a graph that is an approximation of the visibility graph (an "approximated visibility graph").

Some embodiments construct a visibility graph for a layer by taking the triangulated graph for the layer and adding additional visibility edges. For instance, in some embodiments, the visibility graph includes a node for each corner of its sub-region layer and each point of a port or obstacle geometry, vpin, and vias. These embodiments then define an edge between every two nodes that have an unobstructed view of (i.e., an unobstructed path to) each other. For each node, these embodiments also define an edge for each unobstructed projection of the node onto each of its layer's bounding sides.

Other embodiments construct an approximate visibility graph for each sub-region layer. Some embodiments construct such a graph for each layer by duplicating the triangulated graph of the layer and adding additional edges about the nodes of the duplicated triangulated graph.

Specifically, for each particular node in the triangulated graph, these embodiments identify the faces adjacent to the particular node. For each identified face that is a boundary face (i.e., a face that has a portion of the layer's boundary as one of its edges), a new edge is defined for the projection onto the boundary of the face's node that is not on the boundary.

On the other hand, for each identified face that is not a boundary face, these embodiments identify the other face ("opposing face") that shares the edge that is opposite to the particular selected node. If the identified and opposing faces form a convex quadrangle, these embodiments then determine whether the identified edge between these two faces can be flipped. If so, a new flipped edge is defined (i.e., an edge is defined between the particular selected node and the opposing face's node that is not on the shared edge). This new-flipped edge results in two new faces that connect to the selected particular node. This process is repeated for all the identified and resulting faces to define additional edges that connect the particular node to other nodes "visible" to it.

b. Compute Capacity and Flow for Each Congestion Graph Edge.

A layer's visibility or approximate visibility graph takes the layer's triangulated graph and adds additional edges. In both cases, the capacity and flow of each edge that is part of a triangulated graph were previously computed during the topological routing process as described above.

On the other hand, the routability engine has to compute the capacity of each congestion-graph edge that is unique to this graph (i.e., each edge that is not in the corresponding triangulated graph). The capacity of an edge that is unique to a visibility or approximate visibility graph can be computed by performing the operations described above by reference to FIG. 25.

The routability engine also has to compute the flow of each unique-congestion graph edge (i.e., each edge that is not in the corresponding triangulated graph but is only in the congestion graph). For both the visibility and approximate visibility graph, the flow of each unique congestion-graph edge can be computed based on the flow of the edges that surround and/or intersect the unique congestion-graph edge. When only two edges surround the unique congestion-graph edge (such as when the unique congestion-graph edge represents the projection of a boundary-face node onto a boundary), the flow of the unique congestion-graph edge can be derived from the flow of the two surrounding edges.

On the other hand, the unique congestion-graph edge can be shared by two faces that form a quadrangle. The unique-congestion graph edge is one of the diagonal edges of such a quadrangle. The quadrangle can have another diagonal edge that intersects the unique congestion-graph edge.

When the unique congestion-graph edge is shared by two faces, the process for performing this computation for a visibility graph is recursive. This is because one or more of the edges that surround or intersect a unique congestion-graph edge might themselves be unique congestion-graph edges. On the other hand, the flow of each unique non-boundary, congestion-graph edge in the approximate visibility graph can be computed non-recursively, since the flow of each unique congestion graph edge can be defined based on the previously-computed flows of its surrounding and intersecting edges.

2. Reduce Congestion.

As mentioned above, the process 4100 tries (at 4110) to reduce congestion in the layout after identifying congestion graphs and identifying the capacity and flow of edges in these graphs. Specifically, at this stage, the routability engine examines the congestion about the moveable vias to determine whether it can move some moveable vias to improve congestion. In some embodiments, vias that are not formed by port-geometry nodes are moveable, while those that are partially or completely formed by port-geometry nodes are not moveable. In other embodiments, even vias that are formed by port-geometry nodes are moveable. For instance, some embodiments define a number of discrete via-node locations in some or all port-geometry nodes. Accordingly, in these embodiments, the routability engine can move a via that connects to such a port geometry to different via-node locations of the port geometry, so long as the move is viable.

Figure 42:
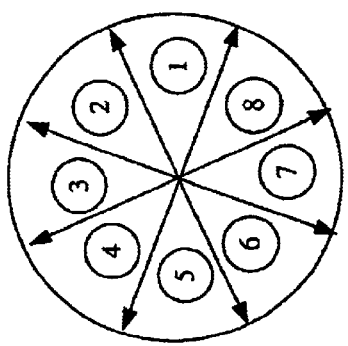
FIG. 42 illustrates eight such sectors that are defined around the eight routing directions of the octilinear wiring model illustrated in FIG. 1.

To examine congestion about vias, the routability engine defines a congestion sector for each the legal routing direction. FIG. 42 illustrates eight such sectors that are defined around the eight routing directions of the octilinear wiring model illustrated in FIG. 1. As mentioned above, some embodiments define an edge's capacity based on the projection of the edge's capacity vector onto the closest legal routing direction. Accordingly, each sector in FIG. 42 identifies one type of projection of the edge-capacity vector.

Figure 43:
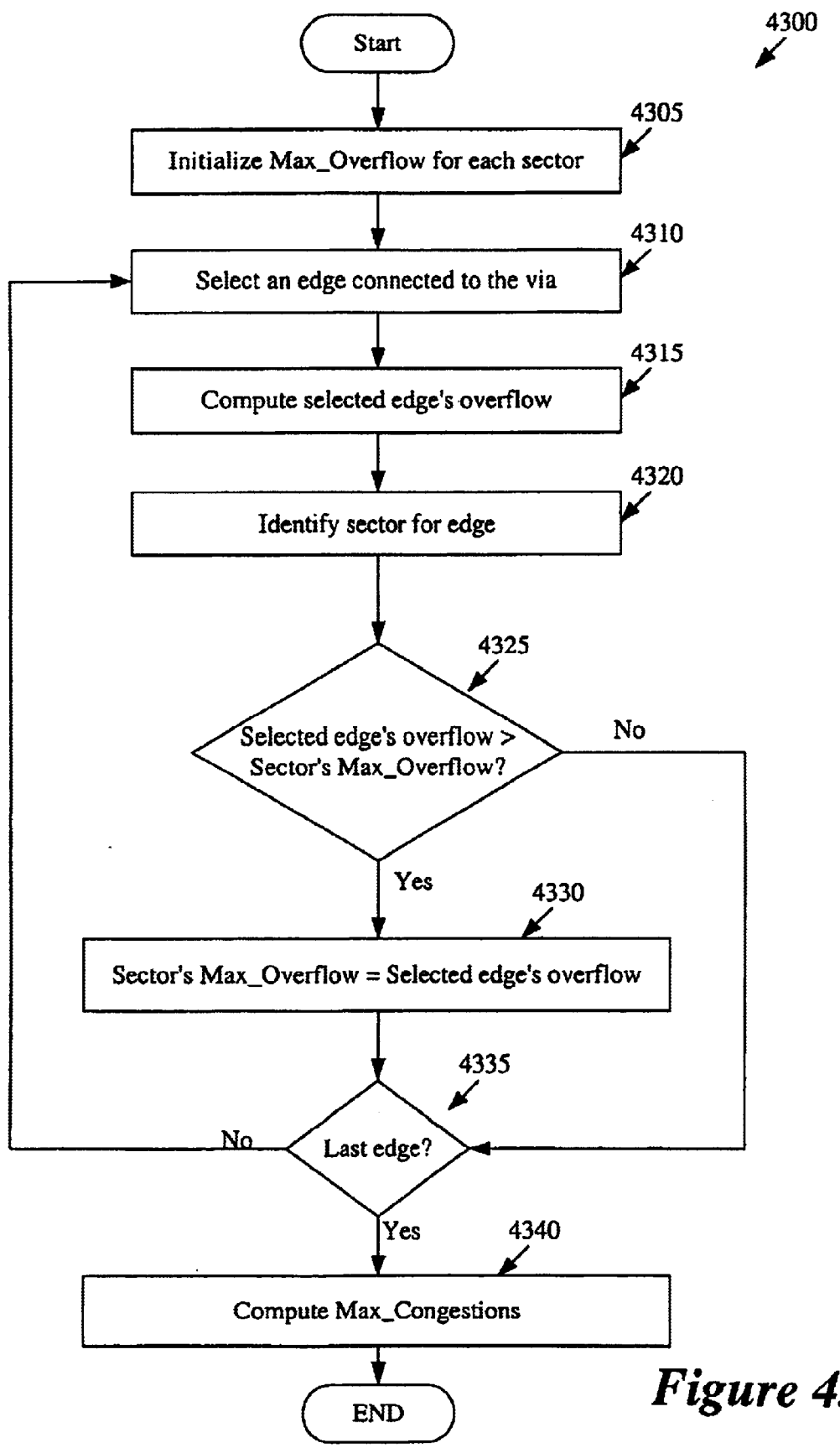
FIG. 43 illustrates a process for measuring the sector congestion about a via.

In other words, (1) sector one identifies the projection onto the 0° routing direction of the capacity vectors with directions between ±22.5, (2) sector 2 identifies the projection onto the 45° routing direction of the capacity vectors with directions between 22.5° and 67.5°, (3) sector 3 identifies the projection onto the 90° routing direction of the capacity vectors with directions—between 67.5° and 112.5, (4) sector 4 identifies the projection onto the 135° routing direction of the capacity vectors with directions between 112.5° and 157.5°, (5) sector 5 identifies the projection onto the 180° routing direction of the capacity vectors with directions between 157.5° and 202.5°, (6) sector 6 identifies the projection onto the 225° routing direction of the capacity vectors with directions between 202.5° and 247.5, (7) sector 7 identifies the projection onto the 270° routing direction of the capacity vectors with directions between 247.5° and 292.5, and (8) sector 8 identifies the projection onto the 315° routing direction of the capacity vectors with directions between 292.5° and 337.5, FIG. 43 illustrates a process 4300 for measuring the sector congestion about a via. Some embodiments perform this process for all layers of the sub-region at once. As shown in FIG. 43, the process 4300 initializes (at 4305) a Max_Overflow variable for each congestion sector about the moveable via. For instance, when the process 4300 uses the congestion sectors identified in FIG. 42, its initializes eight Max_Overflow variables at 4305. In some embodiments, the process 4300 initializes each Max_Overflow to a large negative number.

The process then selects (at 4310) one of the edges that connects to the via's node on the congestion graph of one of the sub-region layers. It next computes (at 4315) an overflow value for the edge selected at 4310. Some embodiments calculate the selected edge's overflow value as the edge's flow minus its capacity.

At 4320, the process then identifies the sector for the edge's capacity vector. The identification of an edge's capacity vector was described above by reference to FIG. 26. Also, the sector of the capacity vector can be identified based on the direction of the capacity vector, as mentioned above by reference to FIG. 42.

Next, the process determines (at 4325) whether the selected edge's overflow is greater than the Max_Overflow of its capacity vector's sector. If not, the process transitions to 4335, which will be described below. Otherwise, the process defines the identified sector's Max_Overflow equal to the selected edge's overflow.

The process then determines (at 4335) whether it has examined all the edges (on all the layers) that connect to the via. If not, the process returns to 4310 to select another edge to examine for the via. When the process 4300 determines that has examined all the edges that connect to the via, it then computes (at 4340) eight Max_Congestions, and then ends.

Figure 44:
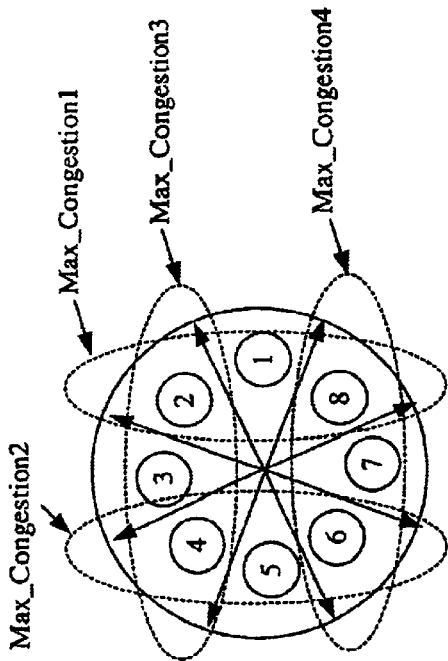
Figure 45:
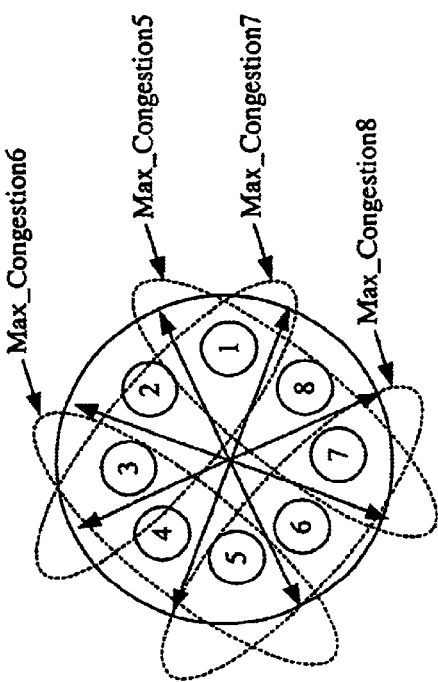
FIG. 45 illustrates four sets of adjacent 45° sectors.

Each Max_Congestion is the largest Max_Overflow among three adjacent sectors. FIG. 44 illustrates four sets of adjacent Manhattan sectors, while FIG. 45 illustrates four sets of adjacent 45° sectors. Accordingly, each Max_Congestion value is defined along one of the octilinear directions.

More specifically, FIG. 44 illustrates (1) a Max_Congestion1 that quantifies the congestion in the positive x-direction in the Manhattan axis, (2) a Max_Congestion2 that quantifies the congestion in the negative x-direction in the Manhattan axis; (3) a Max_Congestion3 that quantifies the congestion in the positive y-direction in the Manhattan axis; and (4) a Max_Congestion 4 that quantifies the congestion in the negative y-direction in the Manhattan axis.

FIG. 45 illustrates (1) a Max_Congestion5 that quantifies the congestion in the positive x-direction in the 45° axis; (2) a Max_Congestion6 that quantifies the congestion in the negative x-direction in the 45° axis; (3) a Max Congestion7 that quantifies the congestion in the positive y-direction in the 45° axis; (4) a Max_Congestion8 that quantifies the congestion in the negative y-direction in the 45° axis.

To identify the particular Max_Congestion value for a particular set of sectors, two of the three Max_Overflow values have to be projected onto the particular octilinear direction corresponding to the particular Max_Congestion value. For instance, the Max_Congestion1 value for sectors 1, 2, and 8, which are defined about the xdirection in the Manhattan axis, is defined as the largest value among (1) the Max_Overflow value of sector 1, (2) the projection of the Max_Overflow of sector 2 onto the x-direction in the Manhattan axis, and (3) the projection of the Max_Overflow of sector 8 onto the x-direction in the Manhattan axis. Similarly, the Max_Congestion5 value for sectors 1, 7, and 8, which are defined about the x-direction in the 45° axis, is defined as the largest value among (1) the Max_Overflow value of sector 8, (2) the projection of the Max_Overflow of sector 1 onto the x-direction in the 45° axis, and (3) the projection of the Max_Overflow of sector 7 onto the x-direction in the 45° axis.

Once the process 4300 computes the Max__Congestions, the routability engine can determine whether it can move the via. Some embodiments perform process 4300 for all or some of the moveable vias, before attempting to move some of them. However, the embodiments described below perform process 4300 for one moveable via, and then determine whether to move the via, before performing process 4300 for another moveable via.

Based on the computed Max__Congestions, the routability engine determines whether it can move the via. Specifically, the routability engine makes this determination by examining corresponding pairs of Max__Congestion values. Each pair relates to two opposite directions on the Manhattan or 45° axis. For the Manhattan axis, one corresponding pair includes the Max__Congestion1and Max__Congestion2 for the positive and negative x-axis directions, while the other pair includes the Max__Congestion3 and Max__Congestion4 for the positive and negative y-axis directions. For the 45° axis, one corresponding pair includes the Max—Congestion5 and Max__Congestion6 for the positive and negative x-axis directions, while the other pair includes the Max__Congestion7 and Max__Congestion8 for the positive and negative y-axis directions.

Some embodiments use the following criteria to determine whether a move is possible in a particular axis direction of the Manhattan or 45° axis. If the corresponding pair of Max__Congestions for a particular axis direction (e.g., for the positive and negative Manhattan x-directions) are both positive, the via is not moved in either direction specified by the pair (e.g., it is not moved in the positive or negative Manhattan x-directions).

On the other hand, when one Max__Congestion of a corresponding Max__Congestion pair (e.g., the total for the positive Manhattan x-direction) is negative, while the other (e.g., the total for the negative Manhattan x-direction) is positive, the via can be moved in the direction with the negative Max__Congestion (e.g., in the positive Manhattan x-direction) until one of the Max__Congestions for the pair is 0. When the corresponding pair of Max__Congestions for a particular axis direction (e.g., for the positive and negative Manhattan x-directions) are both negative, the via can be moved in the direction with the more negative Max__Congestion until both Max__Congestions are equal.

As mentioned above, some embodiments define the edge capacity and flow in terms of the edge length and net width, which, in turn, makes distance the unit for quantifying congestion. Accordingly, in these embodiments, the amount of a via move is directly specified by the congestion values. For instance, when the Max__Congestion of the +x-axis Manhattan direction is 25 while that of the −x-axis Manhattan direction is −75, the via can be moved in the −x-axis direction by 50 units. In some embodiments, each unit is to equal to the IC-manufacturing-grid unit.

Based on the criteria recited above, the routability engine examines the potential for moving the via on each axis of the Manhattan and 45° coordinate systems. If the routability engine determines that the via movement is only possible within one of the coordinate systems, then the routability engine moves the via according to the potential x- and/or y-axis moves this coordinate system.

On the other hand, if the routability engine determines that the via movement is possible within both coordinate systems, it identifies the best coordinate system for the movement. For each particular pair of corresponding directions in the Manhattan and 45° coordinate systems, some embodiments compute a balance factor that measures the difference in Max__Congestions of the particular pair after the potential move in the axis direction of the pairs. For each coordinate system, these embodiments then generate an overall balance factor that combines the two balance factors for the two axis directions of the coordinate system. Some embodiments generate the overall balance factor of a coordinate system by summing up the balance factors for the x- and y-axes directions. The routability engine then picks the via movement in the coordinate system with the better overall balance factor.

After moving a via, the routability engine has to recompute the capacity and flow of edges that connect to the via on any layer of the sub-region. The operations for computing the capacity and flow of an edge are identical to those discussed above for the topological router.

The process for reducing congestion by moving vias can be performed several times. Some embodiments perform several such iterations, because each iteration might move one or more vias, which, in turn, would affect the congestion of nearby edges, which, in turn, might allow or necessitate additional via movements.

3. Computing Congestion and Interacting with Topological Router

After moving vias to reduce congestion, the routability process 4100 computes (at 4115) a congestion value of each edge in the congestion graphs. In some embodiments, the congestion value equals the edge's capacity minus the edge's flow. The routability process then examines (at 4120) the computed congestion values to identify any edge that is congested. In some embodiments that compute the congestion value as the edge's capacity minus the edge's flow, the congested edges are the ones with the negative congestion values.

If the process identifies no congested edges, it ends. However, if it identifies congested edges, the process directs (at 4125) the topological engine to revise some of the topological routes to alleviate the congestion of the identified over-congested routes, and then ends.

In different embodiments, the routability and topological engine interact in different ways to identify other topological routes. In some embodiments, the routability engine needs to identify the edges that are congested to the topological engine. In some of these embodiments, the congested edges are often the edges that are unique congestion-graph edges (i.e., are edges that are not in the topological router's triangulated graphs). Hence, in some embodiments, the routability engine needs to relay to the topological router the congestion problem without referring to unique congestion-graph edges that are not used by the topological router.

Figure 46:
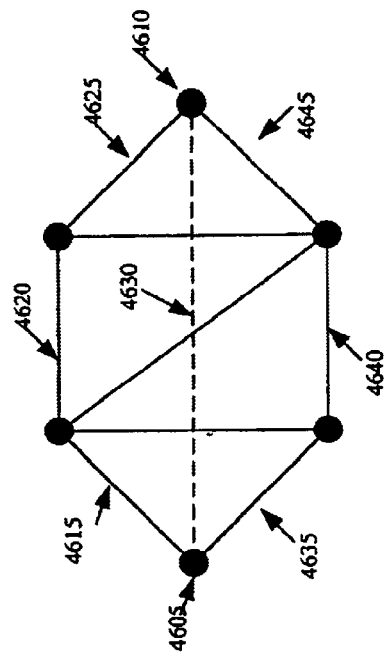
FIG. 46 illustrates a unique-congestion graph edge that is between two nodes.

In some embodiments, the routability engine conveys the congestion problem of a unique congestion-graph edge by identifying the triangulated-graph edges that connect the same endpoints as the unique congestion-graph edge. For instance, FIG. 46 illustrates a unique-congestion graph edge 4630 that is between two nodes 4605 and 4610. When the edge 4630 is over congested, the routability engine needs to inform the topological router of this congestion but it cannot refer to edge 4630, which is not part of the triangulated graph used by the topological router. Hence, in place of 4630, the routability engine identifies triangulation-graph edges 4615, 4620, and 4625 that connect the same endpoints as the unique congestion-graph edge. The routability engine can identify triangulation-graph edges 4635, 4640, and 4645 as well. In some embodiments, the routability engine also specifies the maximum flow across the identified triangulation-graph edges, where this maximum flow corresponds to the capacity of the congestion graph edge 4630.

The topological router can then use the edge-identity information in several ways. For instance, it can reduce the flow of the identified edges and then identify topological routes for the nets that previously crossed the identified edges. Alternatively, for each particular triangulation-graph edge, the topological router keeps in some embodiments a record of the number of other edges that need to be analyzed with the particular edge during the edge-capacity-checking operations of the route generation process. Accordingly, when the routability engine identifies a set of edges that need to be collectively analyzed in order to capture the congestion of a particular congestion-graph edge, the topological router stores the identified set (once for all edges in the set or once for each edge in the set); each time a path tries to cross one of the edges in the set, the path generation process not only checks the edge's individual capacity, but also compares the remaining capacity of all the edges with the specified capacity of the congestion-graph edge.

If the topological router repeatedly fails to generate geometrically routable topological routes for a particular set of edges, the routability engine flags one or more nets as unroutable, directs the topological router to define routes the remaining nets crossing the set of edges, and then transitions to 220 to embed the generated topological routes.

E. Geometric Engine

After the routability checking, the process 200 generates geometric routes and stores these routes in a detail-routing storage structure (such as a database). A geometric routing engine generates and embeds geometric routes. In order to generate the geometric routes, the geometric engine in some embodiments generates a new routing representation for each topological route in the sub-region. The new routing representation is one that is design-rule correct (i.e., a representation that complies with the design rule spacing and positioning).

In some embodiments, the geometric engine generates the design-rule-correct routes by referring to path-defining edges. These edges are specified about vpins, vias, ports, and obstacles in directions that constrain the embedding of geometric routes about obstacles and unrelated vpins, vias, and ports.

In some embodiments, the geometric engine performs four operations to generate the design-rule-correct routes for topological routes on a layer. These operations are explained for the octilinear wiring model of FIG. 1. This wiring model has four constraining angles, ±22.5° and ±67.5°, that constrain the embedding of geometric routes.

Figure 47:
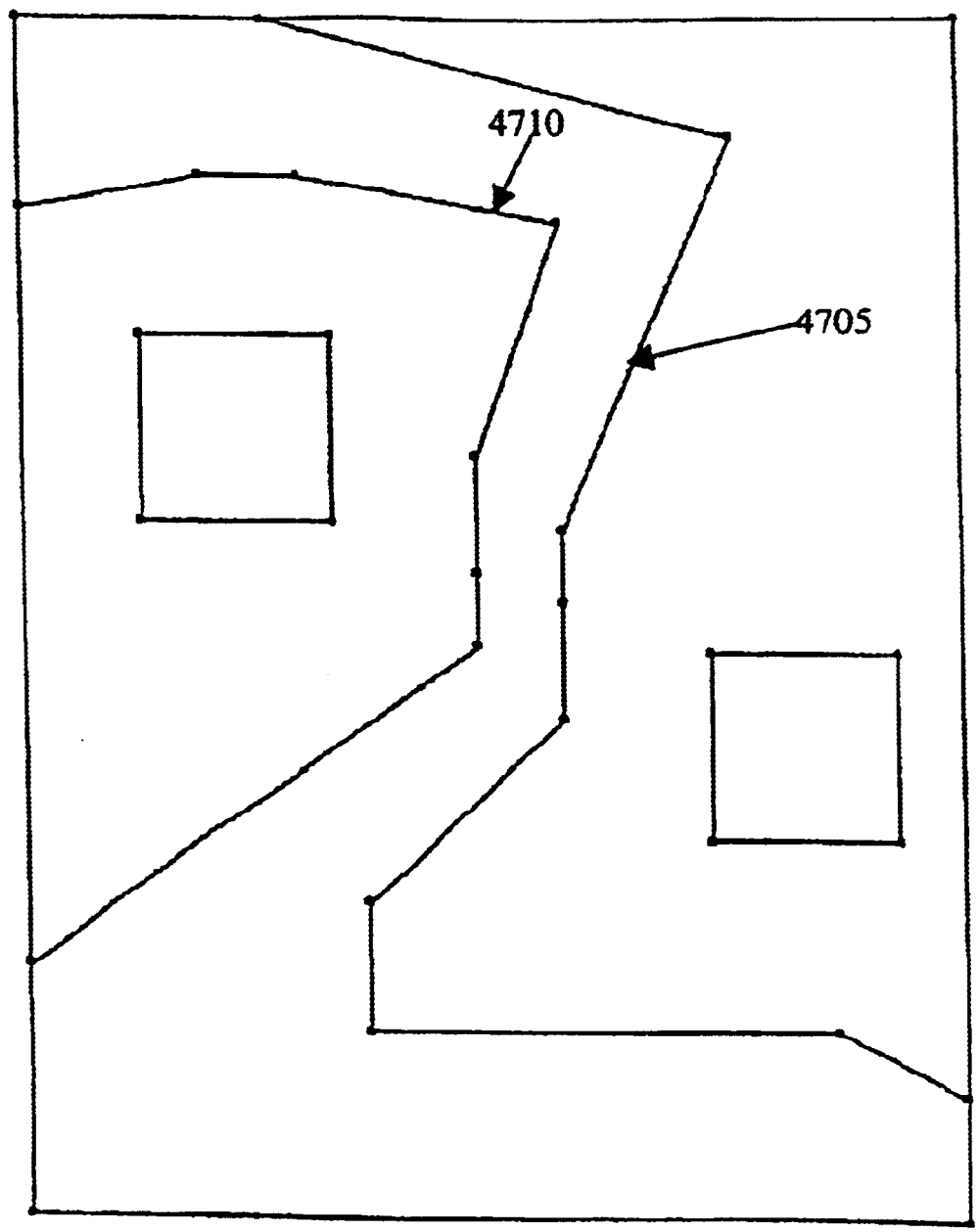
FIG. 47 illustrate a simple example of a layout portion that has two obstacles about which two topological routes for two nets are defined by the topological router.
Figure 48A:
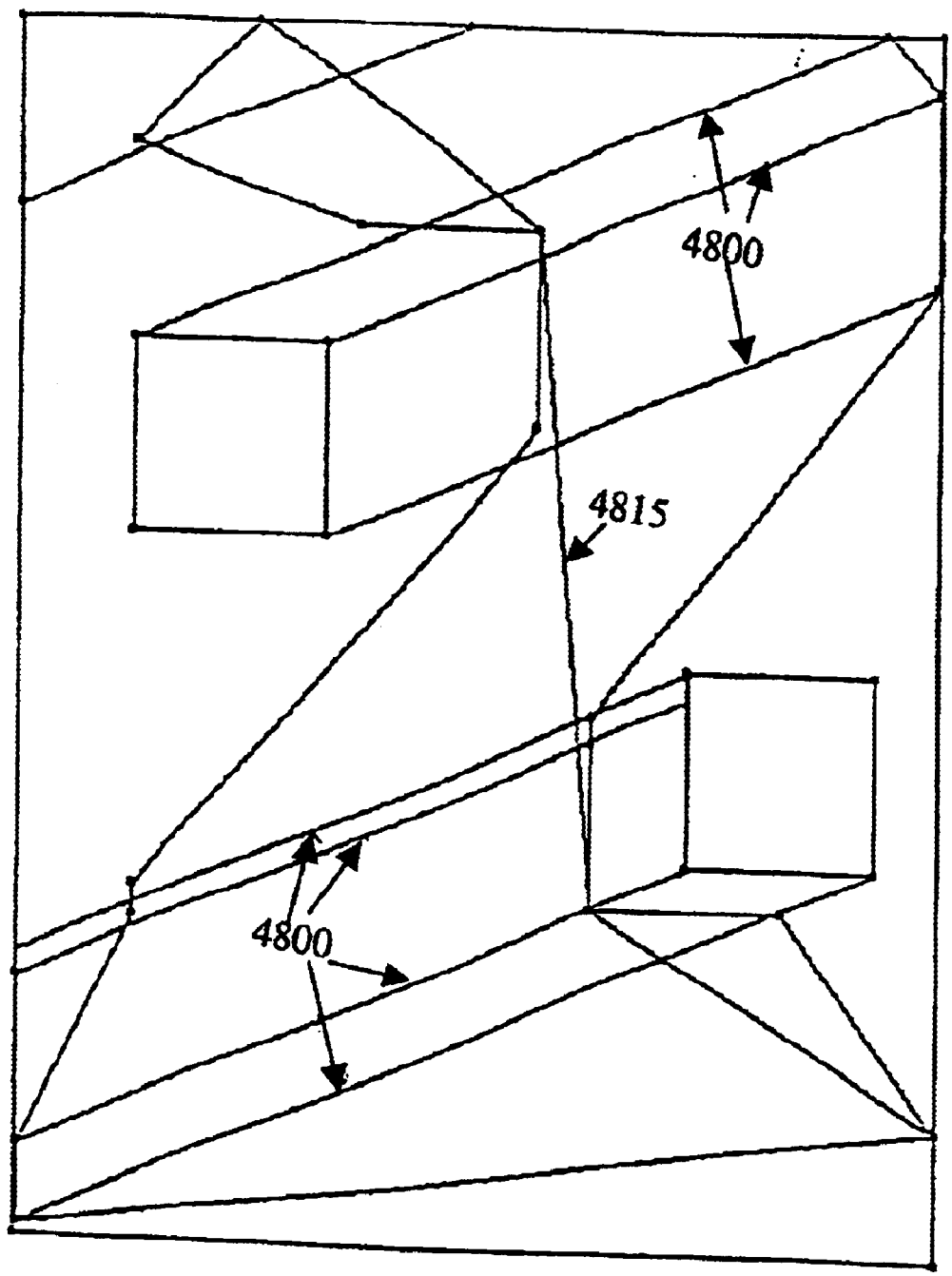
FIGS. 48A–48D illustrate four sets of path defining edges for this example.
Figure 48B:
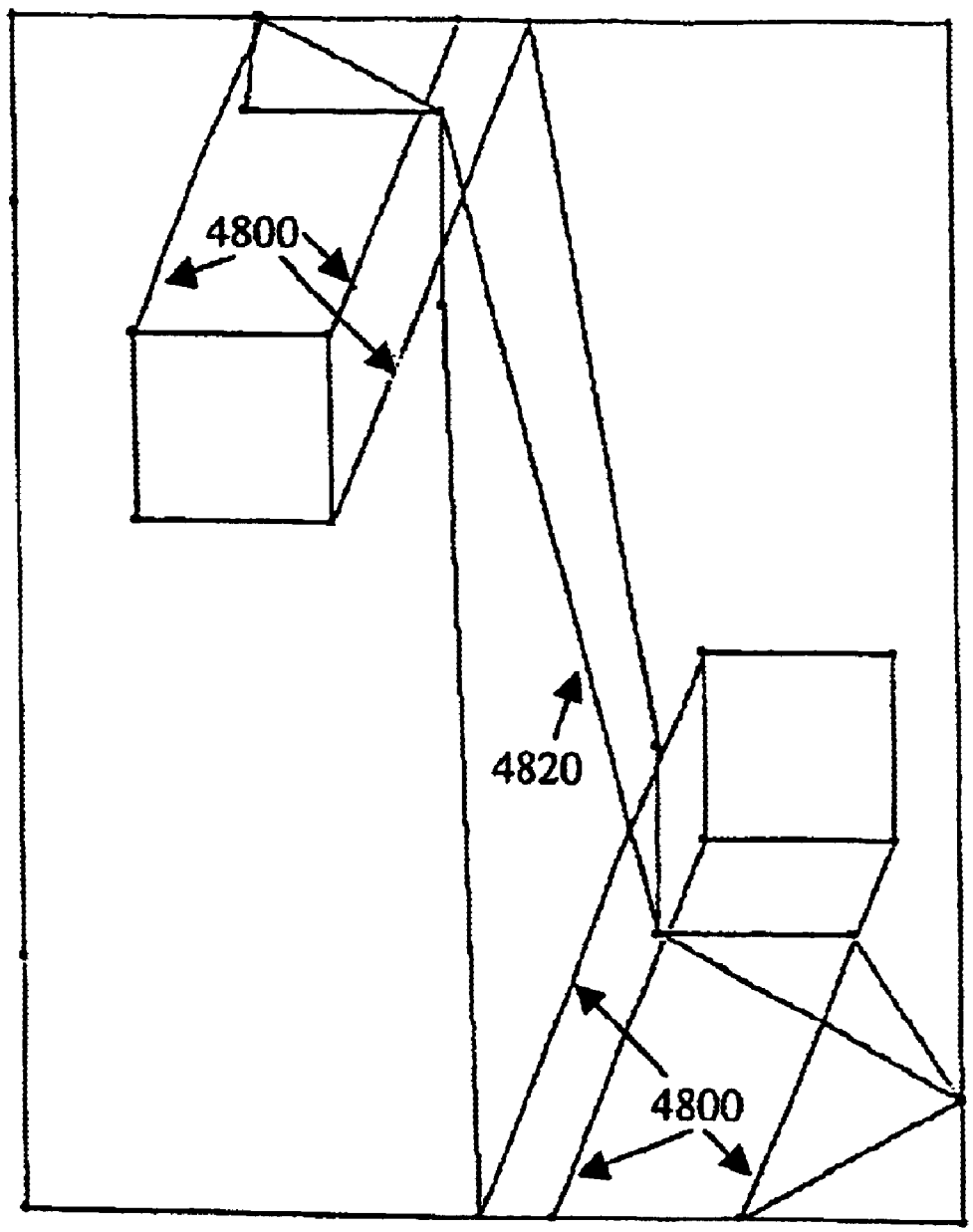
Figure 48C:
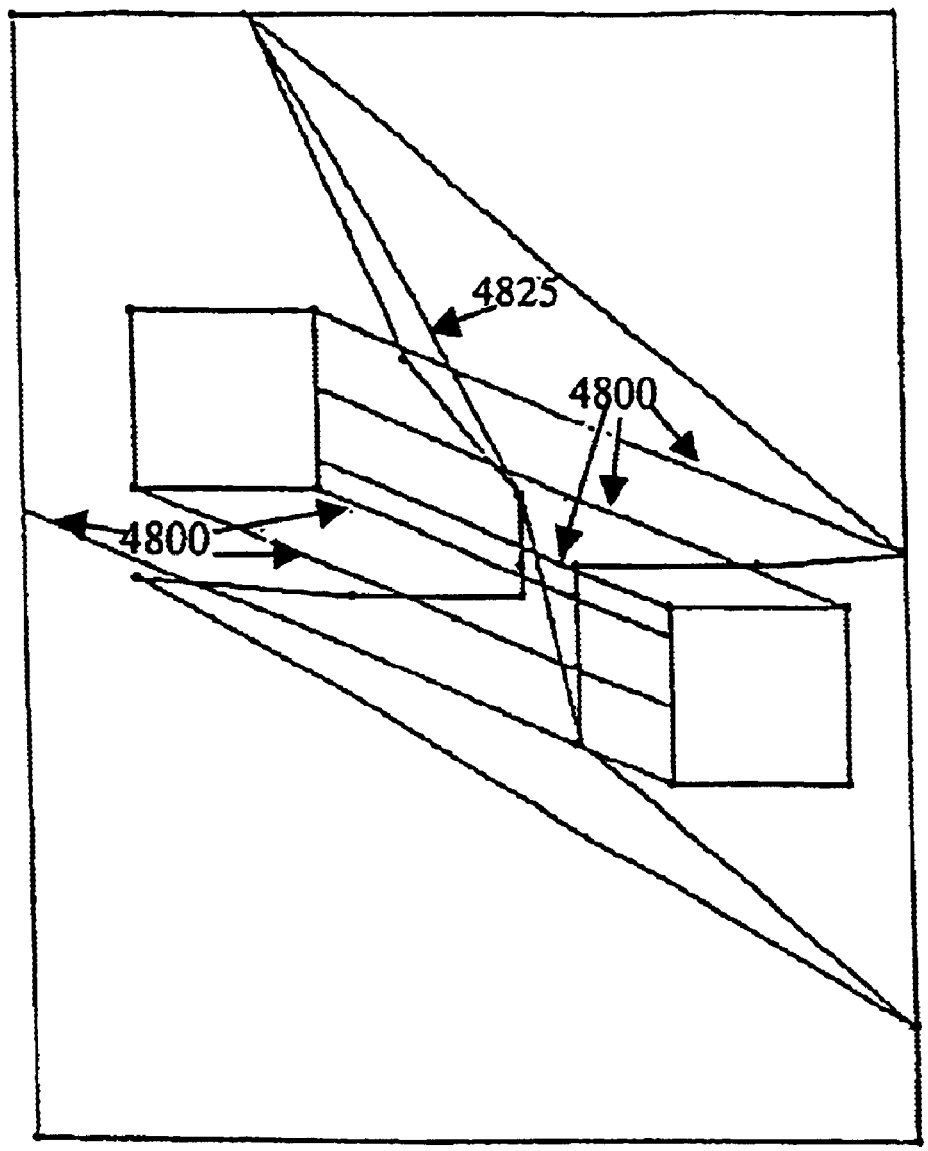
Figure 48D:
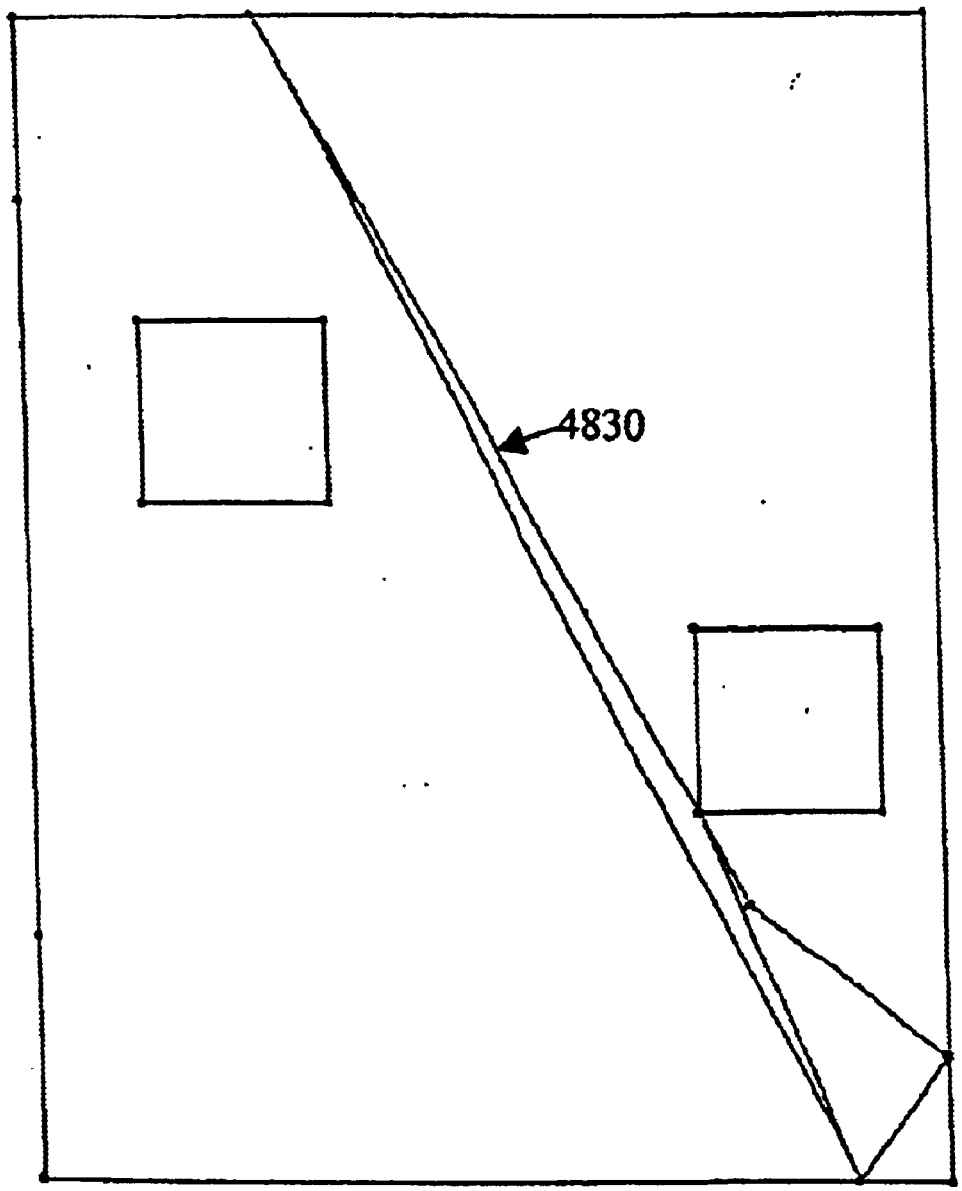

First, for each of the four constrained directions, the geometric engine generates one set of path-defining edges about the geometric points in the layer. In other words, four sets of path-defining edges are defined along ±22.5° and ±67.5° directions. FIG. 47 illustrate a simple example of a portion of a layout that has two obstacles about which two topological routes for two nets 4705 and 4710 are defined by the topological router. FIGS. 48A–48D illustrate four sets of path defining edges 4800 for this example.

Second, the geometric engine generates four "partial" route representations for each topological route. Each partial route is defined with respect to one set of path-defining edges. In addition, the geometric engine produces each partial design-rule-correct route for a net's topological route on a layer by (1) identifying the path-defining edges intersected by the topological route, (2) based on the design rules, identifying the segments of the intersected path-defining edges that are available for constructing the partial route, and (3) generating the shortest path between the endpoints of the topological route (on that layer) that traverses the identified segments.

Some embodiments identify the constrained boundaries of path-defining segments that a net's route can intersect based on the location of the center-line of the net. Some embodiments also require that all the nodes in the path-defining-edge graph lie on the manufacturing grid.

FIGS. 48A–48D specify with dots the segments of the path defining edges that have been constrained for net 4705. These constraints are due to spacing requirements between net 4705 and net 4710 and the net 4705 and the endpoints of the path defining edges. In these figures, the constraining endpoints sometime appear to the side of the path-defining edge because, in order to snap the interconnect lines to the manufacturing grid, some embodiments identify the spacing and width requirements on each constraining direction based on these requirement on the closest Manhattan wiring direction, and then round up the identified values to ensure proper design each time.

Figure 55:
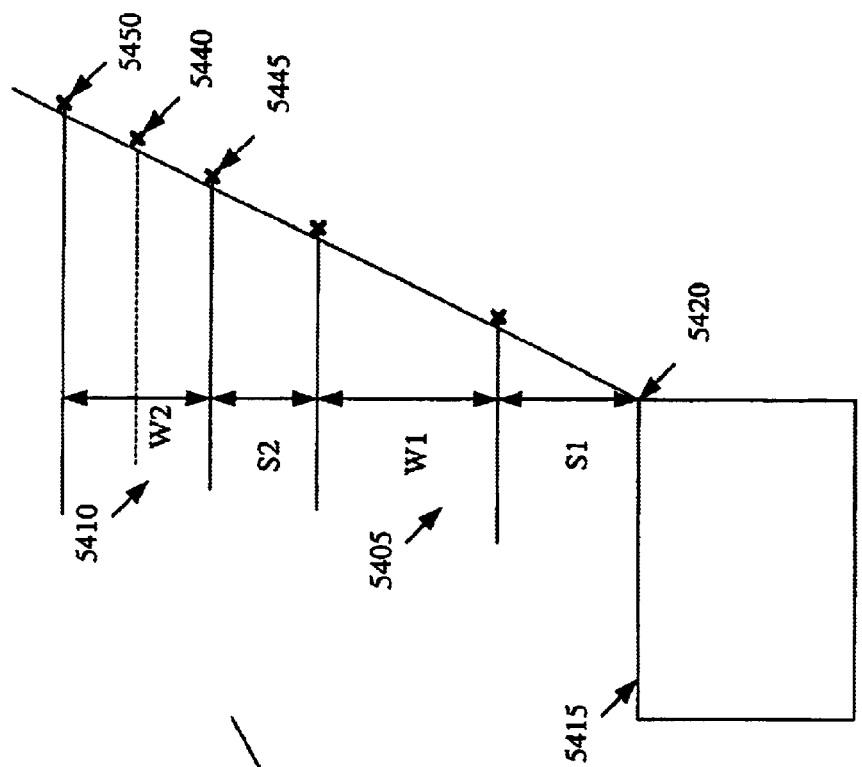
FIGS. 54 and 55 provide two examples for identifying the spacing and width requirements on constraining directions.
Figure 54:
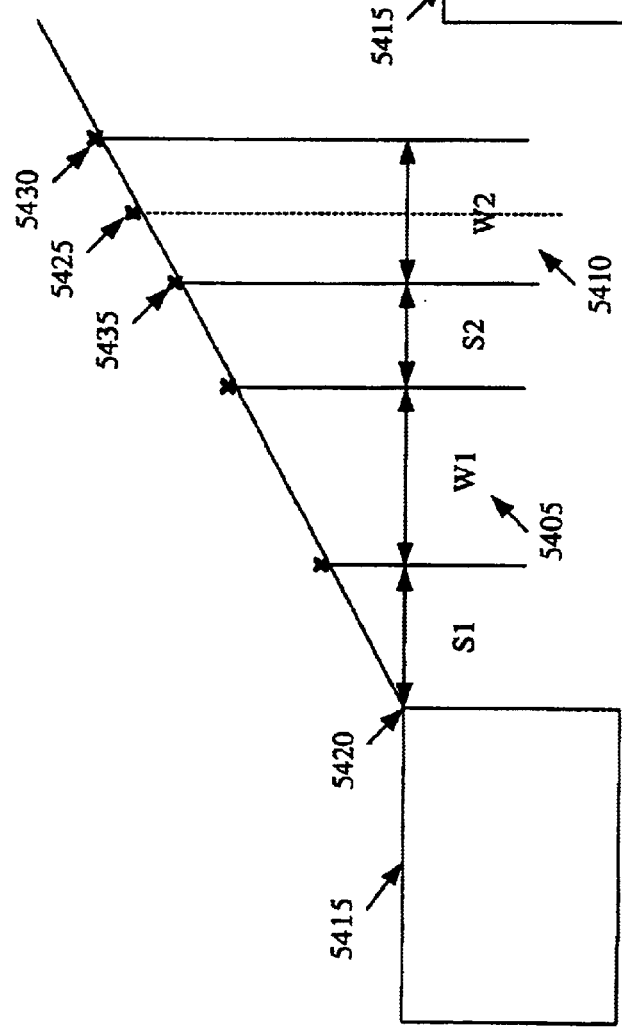

FIGS. 54 and 55 provide two more-detailed examples for identifying the spacing and width requirements on the constraining directions. FIG. 54 illustrates two nets 5405 and 5410 that have routes that intersect a 22.5° path-defining edge that originates from a vertex 5420 of an obstacle 5415.

In the example illustrated in FIG. 54, the x-coordinate of the left-most constrained endpoint 5425 for the center-line of the net 5410 is (1) the minimum spacing (S1) between the first net and the vertex 5420, plus (2) the width (W1) of the net 5405, plus (3) the minimum spacing (S2) between the nets 5405 and 5410, plus (4) half of the width (W2) of the net 5410. The y-coordinate (Y) for this endpoint 5425 is computed as follows:

$$Y=Y1+Y2+Y3+Y4,$$

where,

Y1=ceil (S1*tan 22.5°),

Y2=ceil (W1*tan 22.5°),

Y3=ceil (S2*tan 22.5°), and

Y4=[ceil (W2*tan 22.5°)]/2, and "ceil" signifies rounding up to the next manufacturing grid. This manner of defining the y-coordinate of the left-most constrained endpoint 5425 ensures that the vertices of the net 5410's partial route boundary (i.e., the vertices of the polygon representing this net's partial route shape) are positioned on the manufacturing grid. Vertices 5430 and 5435 in FIG. 54 are examples of two such vertices.

FIG. 55 illustrates nets 5405 and 5410 that have routes that intersect a 67.5–0 path-defining edge that originates from a vertex 5420 of an obstacle 5415. In the example illustrated in FIG. 55, the y-coordinate of the left-most constrained endpoint 5440 for the center-line of the net 5410 is (1) the minimum spacing (S1) between the first net and the vertex 5420, plus (2) the width (W1) of the net 5405, plus (3) the minimum spacing (S2) between the nets 5405 and 5410, plus (4) half of the width (W2) of the net 5410. The x-coordinate (X) for this endpoint 5440 is computed as follows:

$$X=X1+X2+X3+X4,$$

where,

X1=ceil (S1*tan 22.5°),

X2=ceil (W1*tan 22.5°),

X3=ceil (S2*tan 22.5°), and

X4=[ceil (W2 * tan 22.5°)]/2.

This manner of defining the x-coordinate of the left-most constrained endpoint 5440 ensures that the vertices of the net 5410's partial route boundary (i.e., the vertices of the polygon representing this net's partial route shape) are positioned on the manufacturing grid. Vertices 5445 and 5450 in FIG. 55 are examples of two such vertices.

After identifying the path-defining edges intersected by the topological route, and identifying the constrained segments of the intersected path-defining edges that are available for constructing the partial route, the geometric engine generates the shortest path between the endpoints of the topological route that traverses the identified segments.

FIGS. 48A–48D illustrate the shortest path 4815, 4820, 4825, and 4830 for nets 4705 along each set of constrained edges. As was the case with the topological router, the geometric router can identify the shortest path that traverses across several constrained edges by using common techniques such as the one described in "Geodesic Path Inside Polygons," by Simon Mak and Sung Soo Kang, which can be found at www.cs.mc-gill.ca/-skang5/cs507/welcom.htm. As this approach simply computes the shortest distance, it does not favor any one preferred direction over the other wiring directions.

However, unlike the case for the topological router which defined the shortest distance within a polygon, the geometric engine identifies the shortest distance among a set of parallel path-defining edges. Whenever this engine is defining constraints on the path defining edges, it detects when a route bends 180° around an obstacle or unrelated geometry (i.e., bends around the obstacle or geometry and intersects a path-defining edge that is co-linear with a previous path-defining edge), and breaks the path into two structures around the bend in order to avoid inflection points. It then computes the shortest path for each structure, and later joins the resulting paths for these structures to define a partial path.

Figure 56:
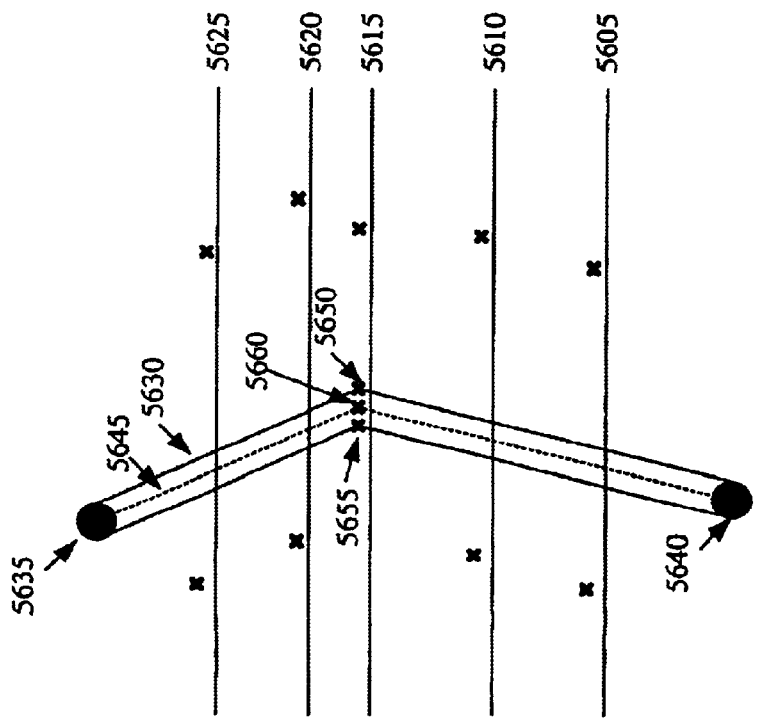
FIG. 56 illustrates an example of identifying a shortest partial path after constraining segments of the intersected path-defining edges.

FIG. 56 illustrates another example of identifying a shortest partial path after constraining segments of the intersected path-defining edges. This figure illustrates five 22.5° path-defining edges 5605–5625 (that have been rotated for simplify the presentation), and a net 5630 that has a starting point 5635 and an ending point 5640. In this figure, left and right constrained endpoints are defined for each path-defining edge for the center-line 5645 of the net 5630. The left and right constrained endpoints in FIG. 56 can be used to define a routing area for the net. These constrained endpoints are slightly off the path-defining edges in order to ensures that the vertices of the polygon representing the shape of the net 5630's route are positioned on the manufacturing grid. Two such vertices that are aligned with the manufacturing grid are vertices 5650 and 5655. These two vertices are vertices of the net's representative polygon that bends at the center-line endpoint 5660 to achieve the shortest path between endpoints 5635 and 5640.

Third, the geometric engine examines the points of the four partial paths defined during the previous operation and removes points that should not be considered for the merged path. Fourth, the geometric engine merges the four partial routing solutions into a single design-rule-correct route.

Figure 49B:
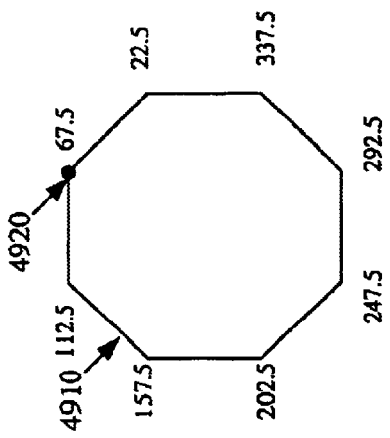
FIGS. 49A and 49B illustrate two octagons that represent the octilinear wiring model of FIG. 1.
Figure 49C:
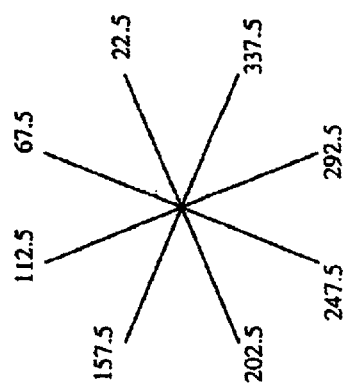
FIG. 49C identifies the eight possible directions that can be constrained by the four constraining angles, ±22.5° and ±67.5°, for the octilinear wiring model.
Figure 49A:
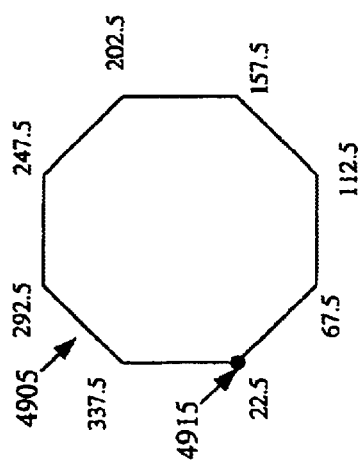

In some embodiments, the geometric engine performs the third and fourth operations by using polygons that represent the wiring model being used. For instance, FIGS. 49A and 49B illustrate two octagons that represent the octilinear wiring model of FIG. 1. The octagon 4905 of FIG. 49A is referred to below as the negative polygon, while the octagon 4910 of FIG. 49B is referred to below as the positive polygon.

Each of these octagons has a specific vertex for connecting to a partial-path point that is defined along a specific constraining direction. FIG. 49C identifies the eight possible directions that can be constrained by the four constraining angles, ±22.5° and ±67.5°, for the octilinear wiring model. FIGS. 49A and 49B identify constrained directions that correspond to their octagon vertices. For instance, the negative octagon's vertex 4915, which is labeled 22.5°, corresponds to the 22.5° constraining direction. Similarly, the positive octagon's vertex 4920, which is labeled 67.5°, corresponds to the 67.5° constraining direction.

To identify an unnecessary partial-path point, the geometric engine places the negative octagon's vertex that corresponds to the point's constraining direction on the point. The geometric engine determines to take out the point, if either segment that connects to this point on the partial path falls within the negative octagon. In the examples of FIG. 48, all the partial-path points of the −22.5° and −67.5° angles can be eliminated by using this approach.

Similar approaches are used to merge the partial paths. Specifically, to identify the first point of the merged paths, the positive octagon is placed on the first points of each partial path that remains after the point-removal operation. The positive octagon is placed on each point at its vertex that corresponds to the constraining direction used to identify the point. The point that is selected is the first point of the solution whose first path (i.e., the path from the starting point to the first point) does not intersect the positive octagon or lies on the octagons border.

To select each successive point except the last, one positive octagon is placed on the last selected point and another is placed on the next point in the selected point's partial path. If the segment connecting these two points does not fall within either positive octagon, then the next point in the partial path is selected as the next point in the merged path. On the other hand, if the segment connecting these two points falls within either octagon, then next point in the selected point's partial path is not selected. Rather, the next point in the merged path is identified to be the next remaining point of the solution set whose constraining direction is clockwise or counterclockwise adjacent to the constraining direction of the last selected point. The solution of the adjacent clockwise direction is selected when the constraining node of the last selected point was on the right of the oriented path segment to the last selected point. On the other hand, the solution of the adjacent counter-clockwise direction is selected when the last point's constraining node was on the left of the oriented path segment to the last selected point.

Figure 50:
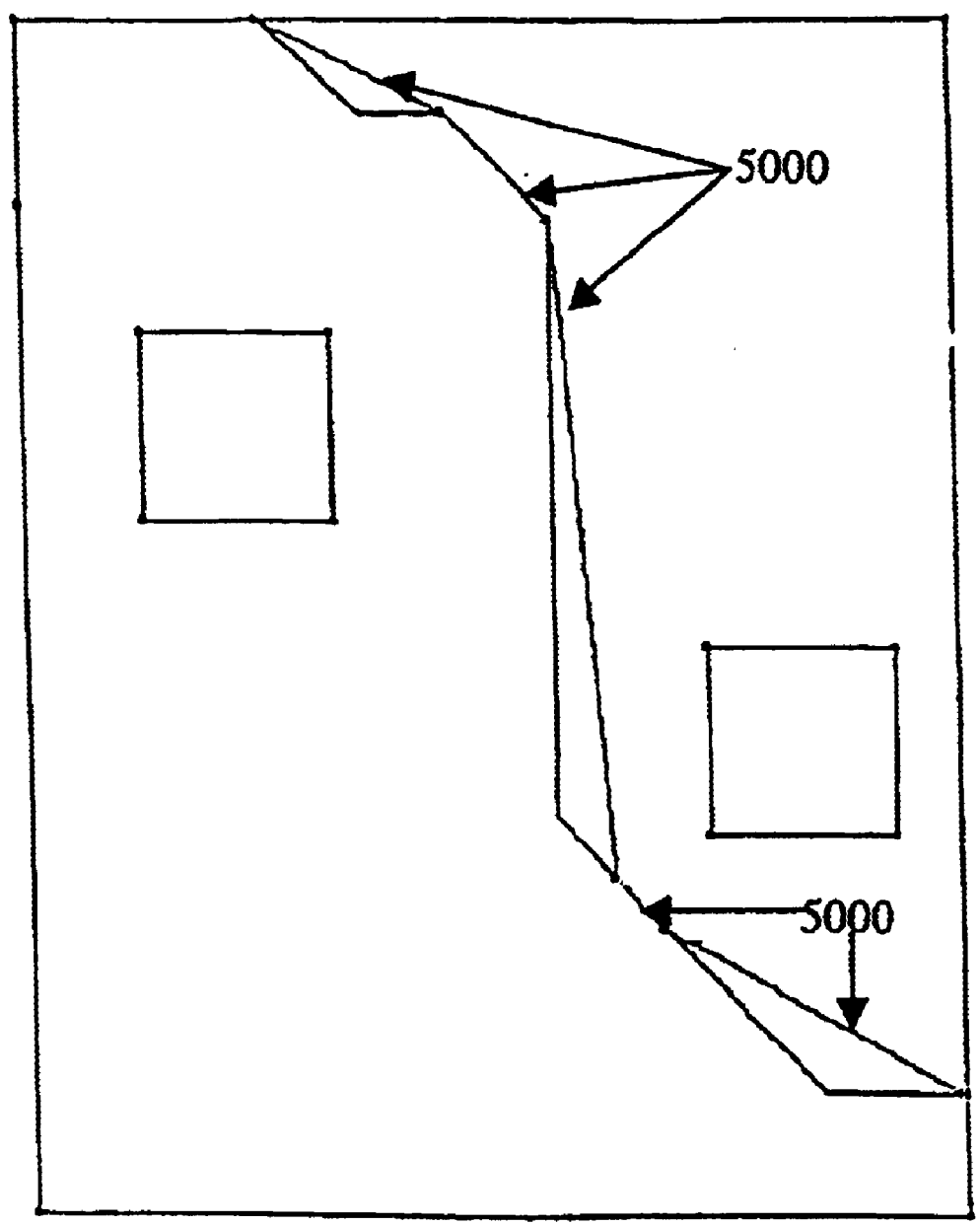
FIG. 50 illustrates a merged path for the examples illustrated in FIGS. 48A–48D.
Figure 57:
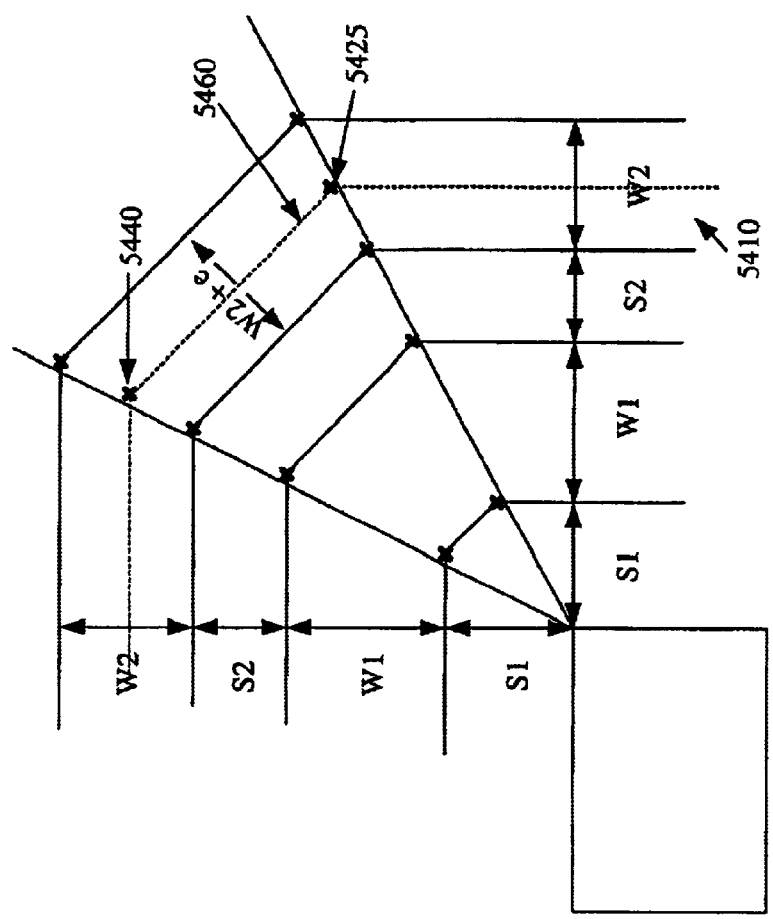
FIG. 57 provides an example of a portion of a merged route.

When all the partial solutions are empty except one, the last point or points are selected from the remaining non-empty partial solution. FIG. 50 illustrates the merged path 5000 for the examples illustrated in FIGS. 48A–48D. FIG. 5-7 provides another example of merged routes. Specifically, this figure illustrates a portion of the merged route for net 5410. This merged-route portion 5460 of this net's center-line is created by connecting the constraining endpoints 5425 and 5440 that are defined for the 22.5° and 67.5° path-defining edges. As illustrated in FIG. 57, the width of the net 5410 is larger than W2 (it is W2+e) due to the definition of the center-line constraints on the 22.5° and 67.5° directions.

After generating a merged design-rule-correct route, the geometric engine can then generate and embed a geometric route based on the merged route. The geometric engine directly embeds all segments of the merged path that are in one of the octilinear directions illustrated in FIG. 1. The geometric engine embeds a non-octilinear segment (i.e., line segment connecting two points in the merged path) by projecting it onto one of the octilinear directions (e.g., projecting it onto the 0° direction). In some embodiments, the geometric engine is free to project the non-octilinear segments onto any octilinear direction, but once it picks a direction it uses this direction for all non-octilinear segments.

Figure 51:
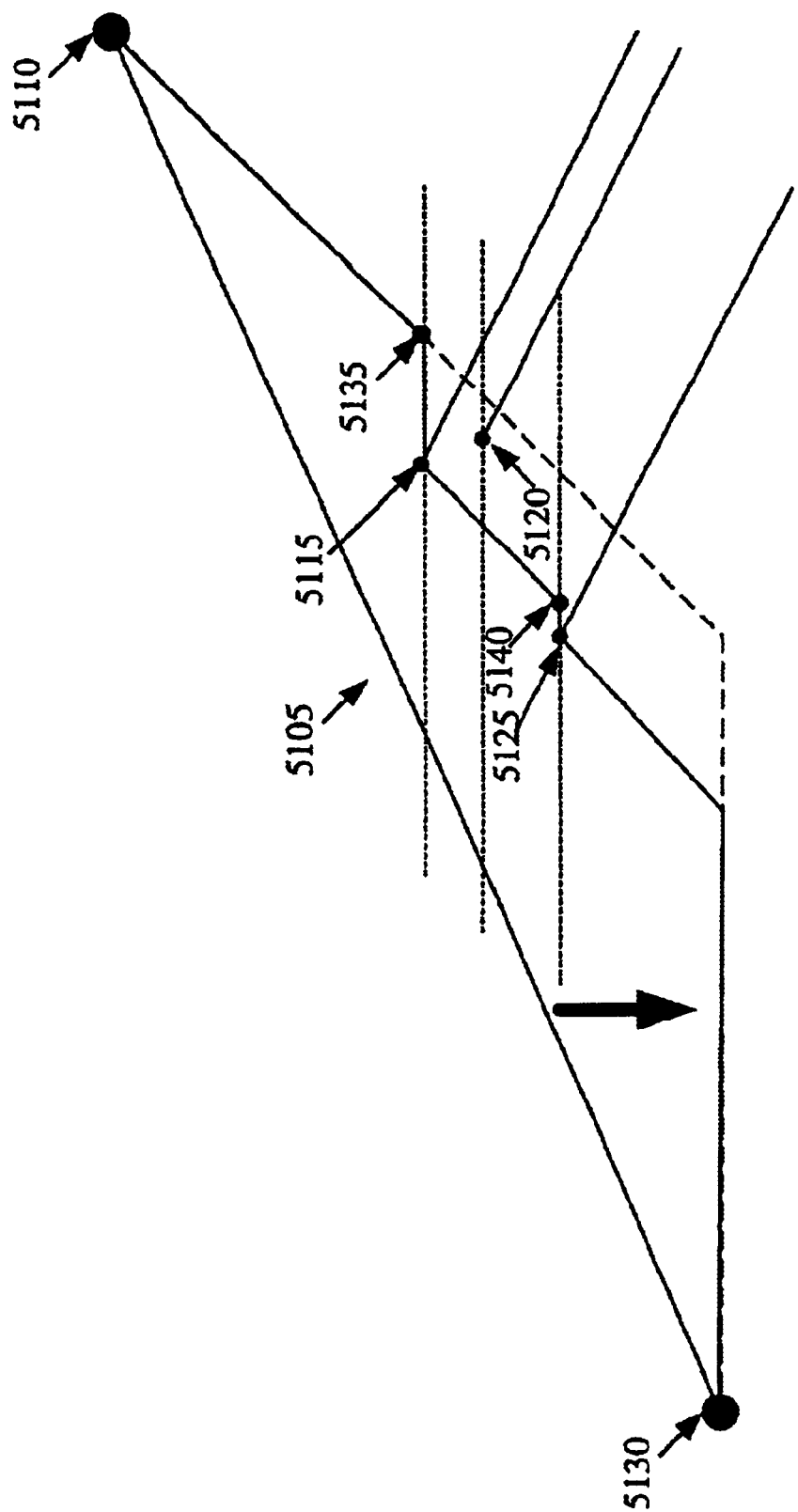
FIG. 51 illustrates the geometric projection of a segment onto a horizontal direction.

FIG. 51 illustrates the projection of a segment 5105 onto the horizontal direction. When a segment is projected towards one of the octilinear directions, the geometric engine needs to ensure that the projection respect the design-rule constraints on the path's traversal. The endpoints of a non-octilinear segment are from the same partial solution.

In the example illustrated in FIG. 51, the partial solution for segment 5105's endpoints are generated in the −22.5° direction. The geometric engine retrieves the path constraints that were previously computed for the −22.5° direction between the endpoints of the segment, in order to determine how these retrieved constraints bound the geometric embedding of segment 5105.

The geometric engine then sorts the constraints in a direction perpendicular to either octilinear direction resulting from the projection. At this stage, the geometric engine has defined a sorted structure of points that it needs to analyze. One manner for generating geometric routes will now be described by reference to the example of FIG. 51.

In this example illustrated in FIG. 51, the constraints are sorted in the Y-axis direction (in the direction perpendicular to the x-axis direction). Also, this sorting leads the geometric engine to store a list of sorted points, starting with node 5110, constraining endpoints 5115–5125, and then node 5130.

The geometric engine stores the node 5110 as the first point of the geometric route. It then selects point 5115, and determines that the node 5110 is behind a 45-° diagonal line running through 5115. Hence, it identifies point 5135 as an optimal bending point from 5110 to 5115, and thereby stores node 5135 and then node 5115 as the second and third points of the geometric route.

The next point on the sorted order is point 5120. The engine then determines whether a 45° diagonal line passing through this point is ahead or behind the 45° diagonal line passing through the last item on the embedded geometric route. In this case, the line through point 5120 is behind the line through previous point 5115, and hence constraint point 5120 does not affect the geometric route.

The engine then selects the next sorted point, which is point 5125. The 45° diagonal line passing through this point 5125 is ahead of the 45° diagonal line passing through the last item on the embedded geometric route (i.e., point 5115). Accordingly, the engine identifies point 5140 as an optimal bending point from 5115 to 5125, and thereby stores.point 5140 and then points 5125 as the fourth and fifth points of the geometric route. As the node 5130 is the last item in the sorted order and it is the end node for the segment, the geometric engine adds it as the last point of the geometric route segment for segment 5105.

Figure 52:
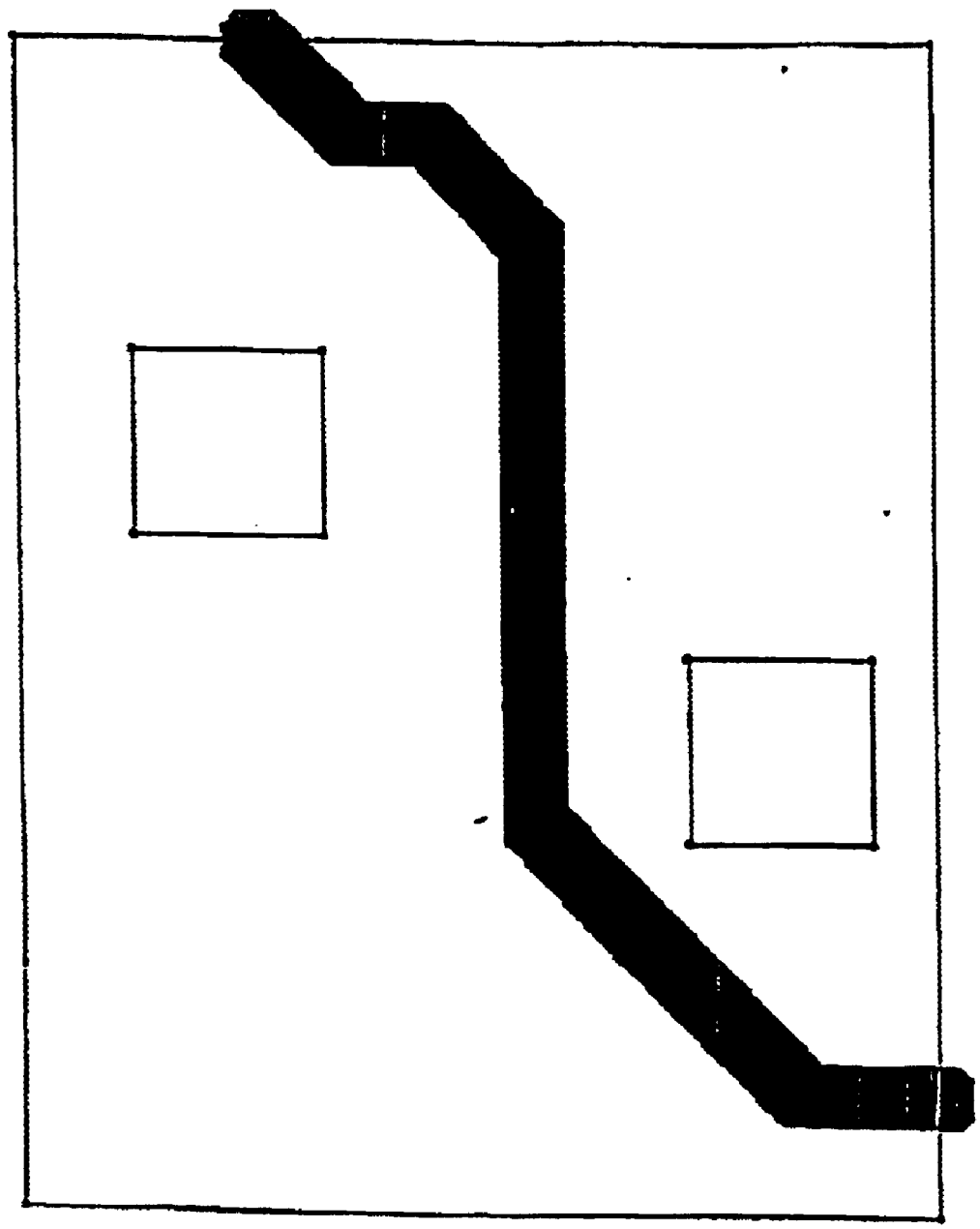
FIG. 52 illustrates a net-width view of the route illustrated in FIG. 50.

FIG. 50 illustrates the center-point line for the geometric route of the merged route of net 4705. FIG. 52 illustrates a net-width view of this route for this net. As evident from FIG. 52, this route is a gridless, NPD route. This route was generated without forcing the router to select an arbitrary preferred direction for an interconnect layer, or to use an arbitrary, non-manufacturing grid. As mentioned above, some embodiments simply require the router to snap the vertices of interconnect lines to the manufacturing grid.

Figure 53A:
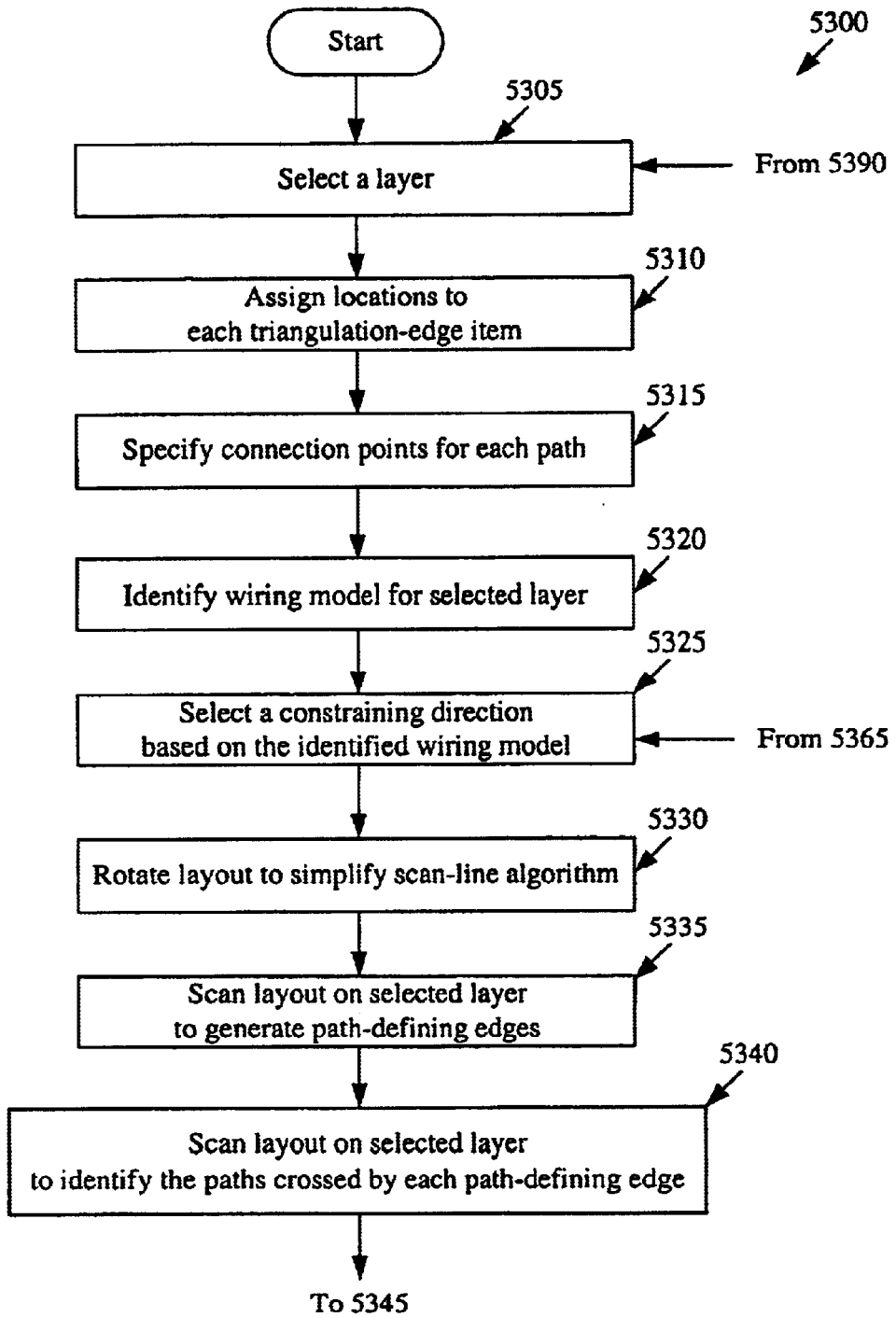
FIG. 53 presents a geometric-routing process performed by the geometric engine of some embodiments of the invention.
Figure 53B:
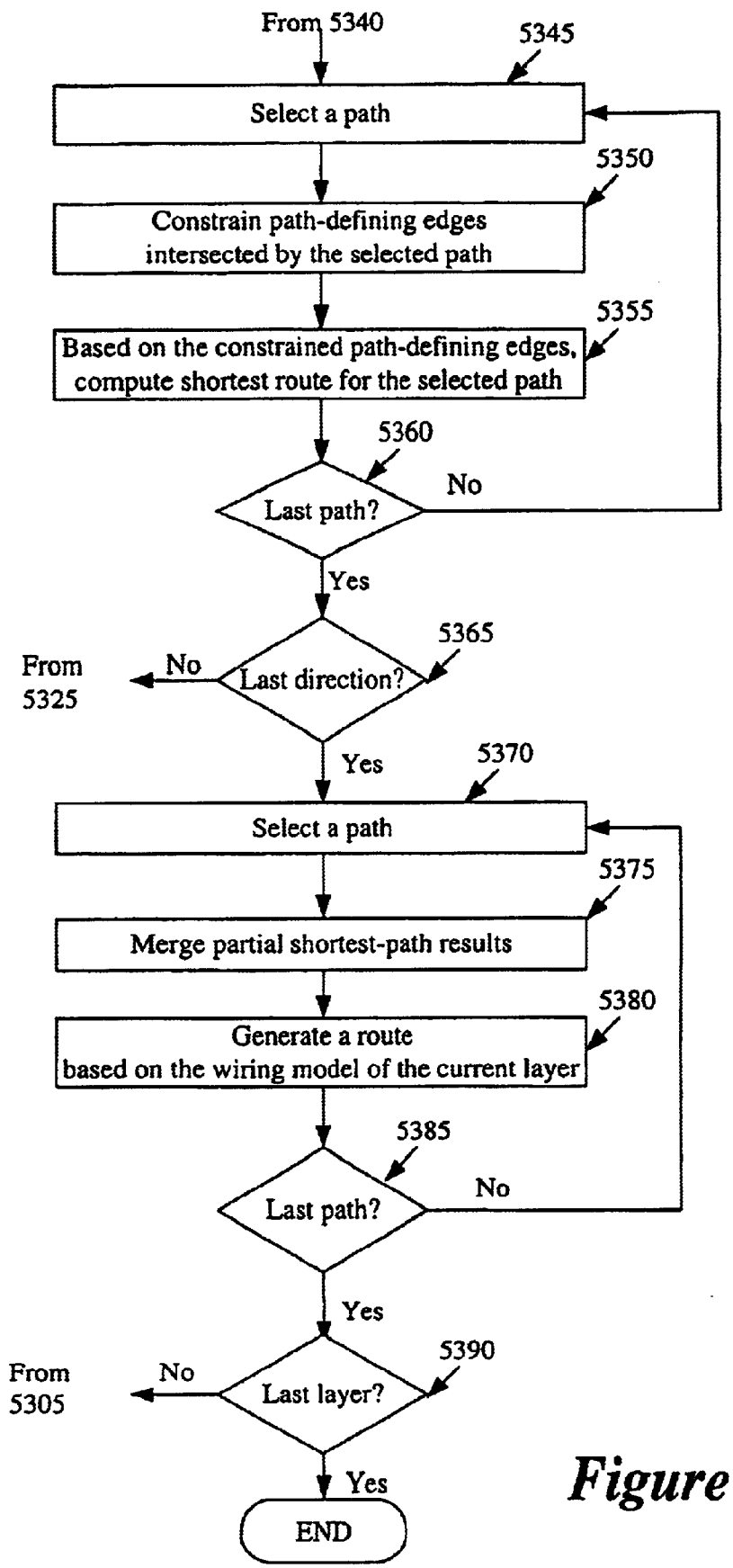

FIG. 53 presents a geometric-routing process performed by the geometric engine of some embodiments of the invention. As shown in this figure, the process 5300 initially selects (at 5305) a layer of the sub-region being routed. Next, the process assigns (at 5310) locations to each edge item of the triangulated graph on the selected layer. Some embodiments assign locations to each item on the selected layer by distributing uniformly the edge items on their edges.

After assigning locations to each edge item on the selected layer, the process 5300 specifies (at 5315) connection points for each topological route. Some embodiments define the connection points for some routes (e.g., routes that endpoints were originally inside of non-convex geometries) on the selected layer on the boundaries of the port geometries.

At 5320, the geometric-routing process identifies a wiring model for the selected layer. This information is provided by the designer in some embodiments, or it might be automatically determined based on some criteria, such as an attribute (e.g., shape) of the routed region. The embodiments described below utilize the octilinear wiring model described above by reference to FIG. 1 for all the layers. Other embodiments use different wiring models. Also, some embodiments use different wiring models for different layers.

After selecting a wiring model, the process 5300 selects one of four constraining angles (±22.5° and ±67.5°) for the selected octilinear wiring model. The process 5300 then rotates (at 5330) the selected layout in the opposite direction to the selected constraining angle to simplify performing a horizontal scan-line algorithm at 5335. The process 5300 performs this algorithm at 5335 to generate path-defining edges.

Like a triangulated-graph edge, a path-defining edge has a data structure that includes a linked list of items on the edge, where each item on the list points to the next and previous items in the list. This list starts and ends with the endpoints of the edge. As mentioned below, edge items are added between the edge's endpoints to represent routes as routes are inserted in the edge.

After specifying the path-defining edges in the constraining angle selected at 5325, the process 5300 performs (at 5340) another scan line algorithm on the rotated layout layer, in order to identify the routes that cross each path-defining edge. Each time the process identifies a route that crosses an edge, it inserts an edge item in the edge's linked list to represent the intersecting route. In some embodiments, the geometric engine (at 5340) starts analyzing the routing problem in terms of two pin paths instead of routes, which can connect multiple pins. In these embodiments, each path's data structure defines a linked list of items on the path.

A path's linked list starts and ends with the endpoints of the path, and in between can include edge items on one or more path-defining edges. Hence, after 5340, the process has defined two sets of linked lists that define paths and the relative position of paths with respect to the constraining angle in the selected layer. In some embodiments, the process also (at 5340) cleans up each paths definition with respect to the path-defining edges. Specifically, if two contiguous edge items on a path-defining edge are for the same path and are adjacent points on the same path, then these edge items are removed.

After creating the new route descriptions at 5340, the process then selects (at 5345) a path. The process then uses (at 5350) the design rule to identify the segments of the path-defining edge intersected by the selected path that are available for constructing the partial route of the selected path. Whenever the process defines constraints on the path defining edges, and it detects when a route bends 180° around an obstacle or unrelated geometry, it breaks the path into two structures around the bend in order to avoid inflection points.

After identifying the path-defining-edge segments that are available for constructing the partial path of the selected path, the process 5300 computes (at 5355) the shortest path between the endpoints of the selected path that traverses the identified segments. This shortest path serves as one of the partial solutions. If the process broke the path into smaller structure, it computes (at GW55) the shortest path for each structure, and then joins the resulting solutions for these structures to define a partial path.

The process then determines (at 5360) whether it has examined all the paths. If not, it returns to 5345 to select another path. If so, it determines (at 5365) whether it has generated partial solutions for all constraining angles. If it has not examined all the constraining angles, it returns to 5325 to select another constraining angle and generate partial solutions for this direction.

When the process 5300 has examined all the constraining angles, it then has to merge the partial solutions. Hence, the process selects a path (at 5370) and merges (at 5375) the partial routing solutions for this path. One manner of merging paths was described above. Next, the process generates (at 5380) a geometric route and embeds this route. This geometric route is based on the wiring model of the current layer. One manner of embedding merged paths was described above.

The process then determines (at 5385) whether it has embedded all the paths in the current layer. If not, it returns to 5370 to select another path for embedding. Otherwise, the process determines (at 5390) whether it has examined all the layers of the sub-region. If not, the process transitions back to 5305 to select another layer for geometric routing. If so, the process ends.

IV. VIAS

Multi-layer routes use vias to traverse from one interconnect layer to another. Each via between two layers has three components, which are (1) the via contact on one layer, (2) the via contact on the other layer, and (3) at the overlap of the via contacts, a cut that represent the cavity for placing interconnect materials to connect the via contacts. At times, multiple via cuts and contact pairs forms one conceptual via. For instance, as shown in FIG. 58, multiple via cuts and contact pairs 5805 can be used to define the via between a route's narrow path 5810 on one layer and the route's wider path 5815 on another layer.

FIGS. 59–63 illustrate various shapes of vias that are used in some embodiments of the invention. These shapes can also be used as the shapes of non-via face items. FIG. 59 illustrates the shapes of two corresponding via contacts (i.e., two via contacts on different layers that are interconnect to form a via). As shown in this figure, some embodiments use a square shape for one of the contacts 5905 in the via-contact pair, while using a diamond shape (e.g., a rotated square) for the other contact 5910 in the pair. In FIG. 59, the diamond shape is a square rotated by 45°.

FIG. 60 illustrates an alternative shape for a via contact. As shown in this figure, a via contact 6005 can be in the shape of an octagon. Such an octagonal via contact can be used in conjunction with another octagonal via contact, or with a differently-shaped via contact (e.g., square contact, diamond contact, etc.).

All of the described via shapes can be used with any wiring model, but work particularly well when they are used with a wiring model that allows Manhattan and ±45° interconnect lines. When a hexagonal wiring model is used (e.g., a wiring model that allows horizontal and ±60° lines, or a wiring model that allows vertical and ±30° lines), some embodiments use hexagonally-shaped via contacts. FIG. 61 illustrates one such hexagonal contact 6105.

FIG. 62 illustrates another via shape that is used in some embodiments. This figure presents a circular via 6210. Such a circular via contact can be used in conjunction with another circular via contact, or with a differently-shaped via contact (e.g., square contact, diamond contact, octagonal contact, hexagonal contact, etc.).

In some embodiments, the interconnect-line endpoints have non-rectilinear shapes. Each route is defined by one or more interconnect lines, and each interconnect line can be straight or it can have one or more bends. Accordingly, a route can have multiple interconnect-line endpoints, such as Steiner points, interconnect-line terminations on vias, and interconnect-line terminations on the net's routable elements (e.g., on the net port geometries).

In some embodiments, interconnect lines can terminate in half-octagons or half hexagons. FIG. 63 illustrates an interconnect-line 6305 that terminates in a half-octagon 6310, while FIG. 64 illustrates an interconnect-line 6405 that terminates in a half-hexagon 6410. FIG. 65 illustrates an interconnect-line 6505 that terminates in a half-circle 6510.

In some embodiments, the above-described router represents each route as a collection of points that define the traversal path of the route (e.g., represents each route as a collection of points that define the traversal of the center-line path), and leave the defining of the interconnect-line shapes to another stage of the EDA process (e.g., the wire shapes can be generated when writing the routing data into a GDS file, when displaying the routes, or before extraction). One of ordinary skill will realize, however, that in other embodiments the router uses the interconnect-line shapes.

Interconnect lines that terminate in half-octagons, half-hexagons, or half-circles can be used with any wiring model. However, interconnect lines that terminate in half octagons (such as interconnect line 6305) work particularly well when they are used with an octagonal wiring model (e.g., a wiring model that allows Manhattan and ±45° interconnect lines), while interconnect lines that terminate in half hexagons (such as interconnect line 6405) work particularly well when they are used with a hexagonal wiring model (e.g., a wiring model that allows horizontal and ±60° lines, or a wiring model that allows vertical and ±30° lines).

For instance, half-octagon interconnect lines (i.e., interconnect lines that terminate in half-octagons) provide a good general structure that matches well the different via shapes that might be used with the octagonal wiring model. FIG. 66 illustrates this matching. Specifically, this figure illustrates the overlap between a half-octagon interconnect line and (1) a square via, (2) a diamond via, and (3) an octagonal via.

Similarly, half-hexagon interconnect lines (i.e., interconnect lines that terminate in half-hexagons) provide a good general structure that matches well the different via shapes that might be used with the hexagonal wiring model. FIG. 67 illustrates this matching. Specifically, this figure illustrates the overlap between a half-hexagon interconnect line and (1) a square via, and (2) a hexagonal via.

In addition, half-octagon interconnect lines form octagonal Steiner nodes when they are used with an octagonal wiring model, while half-hexagon interconnect lines form hexagonal Steiner nodes when they are used with a hexagonal wiring model. FIG. 68 illustrates an example of an octagonal Steiner node 6805 formed by a horizontal half-octagon line 6810, a vertical half-octagon line 6815, and a 45° half-octagon line 6820. FIG. 69 illustrates an example of a hexagonal Steiner node 6905 formed by a horizontal half-hexagon line 6910, a −60° half-hexagon line 6915, and a −60° half-hexagon line 6920. Similarly, half-circle interconnect lines (i.e., lines ending in half-circles) form circular Steiner nodes.

Half-circle interconnect lines accurately model endpoints of conductive lines on IC's, which typically are not rectilinear but rather are somewhat semi-circular. Also, half-octagon and half-hexagon interconnect lines more closely model actual conductive lines on the IC's that traditional rectilinear interconnect-line ends. Similarly, circular, octagonal and hexagonal via contacts model the circular vias in the IC's more closely than square via contacts used by most EDA tools today.

V. The Computer System

FIG. 83 presents a computer system with which one embodiment of the present invention is implemented. Computer system 8300 includes a bus 8305, a processor 8310, a system memory 8315, a read-only memory 8320, a permanent storage device 8325, input devices 8330, and output devices 8335.

The bus 8305 collectively represents all system, peripheral, and chipset buses that communicatively connect the numerous internal devices of the computer system 8300. For instance, the bus 8305 communicatively connects the processor 8310 with the read-only memory 8320, the system memory 8315, and the permanent storage device 8325.

From these various memory units, the processor 8310 retrieves instructions to execute and data to process in order to execute the processes of the invention. The read-only-memory (ROM) 8320 stores static data and instructions that are needed by the processor 8310 and other modules of the computer system. The permanent storage device 8325, on the other hand, is read-and-write memory device. This device is a non-volatile memory unit that stores instruction and data even when the computer system 8300 is off. Some embodiments of the invention use a mass-storage device (such as a magnetic or optical disk and its corresponding disk drive) as the permanent storage device 8325. Other embodiments use a removable storage device (such as a floppy disk or zip® disk, and its corresponding disk drive) as the permanent storage device.

Like the permanent storage device 8325, the system memory 8315 is a read-and-write memory device. However, unlike storage device 8325, the system memory is a volatile read-and-write memory, such as a random access memory. The system memory stores some of the instructions and data that the processor needs at runtime. In some embodiments, the invention's processes are stored in the system memory 8315, the permanent storage device 8325, and/or the read-only memory 8320.

The bus 8305 also connects to the input and output devices 8330 and 8335. The input devices enable the user to communicate information and select commands to the computer system. The input devices 8330 include alphanumeric keyboards and cursor-controllers.

The output devices 8335 display images generated by the computer system. For instance, these devices display IC design layouts. The output devices include printers and display devices, such as cathode ray tubes (CRT) or liquid crystal displays (LCD).

Finally, as shown in FIG. 83, bus 8305 also couples computer 8300 to a network 8365 through a network adapter (not shown). In this manner, the computer can be a part of a network of computers (such as a local area network ("LAN"), a wide area network ("WAN"), or an Intranet) or a network of networks (such as the Internet).

Any or all of the components of computer system 8300 may be used in conjunction with the invention. However, one of ordinary skill in the art would appreciate that any other system configuration may also be used in conjunction with the present invention.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

We claim:

1. An integrated circuit ("IC") layout comprising:
   a first set of vias that have a diamond shape, wherein each via in the first set of vias traverses at least two layers of the IC layout and has a contact on each of the layers, wherein each contact is in the shape of a diamond; and
   a first set of interconnect lines, wherein each interconnect line in the first set has an end that has a shape of a partial polygon and that terminates on at least one diamond-shaped contact, wherein the polygon has more than four sides.

2. The layout of claim 1 further comprising a second set of vias wherein each via in the second sdet of vias traverses two layers of the IC layout and has at least one contact in the shape of a rectangle.

3. The IC layout of claim 2 further comprising a second set of interconnect lines, wherein each interconnect line in the second set has an end that has a shape of a partial polygon and that terminates on at least one rectangular-shaped contact, wherein the polygon has more than four sides.

4. An integrated-circuit ("IC") layout comprising:
   a first set of vias, wherein each via in the first set traverses at least two layers and has one contact on each of the layers, wherein one of the contacts is in the shape of a rectangle and one of the contacts is in the shape of a diamond;
   a first set of interconnect lines terminating on at least a plurality of the first set of vias, wherein the interconnect lines in the first set of interconnect lines have ends that terminate on said contacts, wherein a plurality of the interconnect lines ends are in the shape of a half polygon, wherein the polygon has more than four sides.

5. The IC layout of claim 4, wherein the rectangle is a square.

6. The IC layout of claim 4, wherein the rectangle has a different length and width.

7. The IC layout of claim 4, wherein the diamond has four equal sides.

8. The IC layout of claim 4, wherein the diamond has two pairs of sides, wherein the length of one pair of sides is different than the length of the other pair of sides.

9. The IC layout of claim 4, wherein the interconnect line ends are in the shape of a half-octagon.

10. The IC layout of claim 4, wherein the interconnect line ends are in the shape of a half-hexagon.

11. The IC layout of claim 4, wherein the interconnect lines with half polygonal ends terminate on the diamond shaped contacts.

* * * * *

UNITED STATES PATENT AND TRADEMARK OFFICE
CERTIFICATE OF CORRECTION

| | |
|---|---|
| PATENT NO. | : 6,859,916 B1 |
| DATED | : February 22, 2005 |
| INVENTOR(S) | : Teig et al. |

It is certified that error appears in the above-identified patent and that said Letters Patent is hereby corrected as shown below:

Column 50,
Line 24, after "of vias wherein each via in the second sdet of vias transverses two layers" should read -- of vias wherein each via in the second set of vias transverses two layers --

Signed and Sealed this

Seventh Day of June, 2005

JON W. DUDAS
*Director of the United States Patent and Trademark Office*